United States Patent
Yagi et al.

(10) Patent No.: US 6,985,363 B2
(45) Date of Patent: Jan. 10, 2006

(54) CARD TYPE RECORDING MEDIUM AND PRODUCTION METHOD THEREFOR

(75) Inventors: Yoshihiko Yagi, Ashiya (JP); Kazuhiro Uji, Fukushima (JP); Michiro Yoshino, Katano (JP); Kenichi Yamamoto, Tondabayashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 306 days.

(21) Appl. No.: 10/398,032

(22) PCT Filed: Sep. 28, 2001

(86) PCT No.: PCT/JP01/08508

§ 371 (c)(1),
(2), (4) Date: Apr. 1, 2003

(87) PCT Pub. No.: WO02/28662

PCT Pub. Date: Apr. 11, 2002

(65) Prior Publication Data

US 2004/0104469 A1 Jun. 3, 2004

(30) Foreign Application Priority Data

Oct. 2, 2000 (JP) ..................................... 2000-302443

(51) Int. Cl.
*H05K 7/06* (2006.01)
*H01L 21/44* (2006.01)

(52) U.S. Cl. ....................................... 361/760; 438/126
(58) Field of Classification Search ................ 438/127, 438/119, 106; 365/99, 98, 63, 51, 97; 361/760, 361/744, 737; 257/686, 778, 703, 700, 678
See application file for complete search history.

(56) References Cited

U.S. PATENT DOCUMENTS

| | | | |
|---|---|---|---|
| 5,394,300 A | 2/1995 | Yoshimura | |
| 6,519,173 B2 * | 2/2003 | Funaba et al. | ................. 365/63 |
| 6,542,373 B1 * | 4/2003 | Oba | ........................... 361/760 |

FOREIGN PATENT DOCUMENTS

| | | |
|---|---|---|
| JP | 57-92895 | 6/1982 |
| JP | 63-296991 | 12/1988 |
| JP | 4-332696 | 11/1992 |
| JP | 5-44574 | 6/1993 |
| JP | 6-79990 | 3/1994 |
| JP | 8-202844 | 8/1996 |
| JP | 11-282995 | 10/1999 |
| JP | 2000-31614 | 1/2000 |
| JP | 2000-003922 | 1/2000 |

OTHER PUBLICATIONS

Microfilm of the specification and drawings annexed to the request of Japanese Utility Model Application No. 96595–1991 (Laid–open No. 44574/1993), (Sumitomo Bakelite Company, Limited), Jun. 15, 1993.

* cited by examiner

*Primary Examiner*—Craig A. Thompson
*Assistant Examiner*—Monica D. Harrison
(74) *Attorney, Agent, or Firm*—Wenderoth, Lind & Ponack, L.L.P.

(57) ABSTRACT

To provide a card-type recording medium which is capable of increasing memory capacity and excellent in rigidity and shock resistance, and to provide a method for manufacturing the same. A card-type recording medium comprising a memory module 221, 222, 270 which is so constituted that a plurality of memory chips 15 are mounted on a memory board 21, 22, 70, 63, 65 is mounted on one surface of a base board 10, and an IC chip 13, 14, 60 for controlling operation of the plurality of memory chips is mounted on the other surface of the base board, with all housed in a package 30, 31.

32 Claims, 77 Drawing Sheets

CARD TYPE RECORDING MEDIUM AND PRODUCTION METHOD THEREFOR

TECHNICAL FIELD

The present invention relates to a card-type recording medium having a memory chip mounted at least on one surface of the base board and an IC chip for controlling an operation of the memory chip mounted on the other surface thereof.

BACKGROUND ART

Conventionally, as one example of this kind of card-type recording mediums, there has been known a small-size memory card having a semiconductor memory chip such as flash memory. Such small-size memory card is excellent in portability, so that the card is likely to be in heavy usage in portable devices and is expected to record still pictures, dynamic images, and music exchanged between the portable devices. Consequently, the small-size memory card has been required to have a larger memory capacity.

However, the small-size memory card generally has a standardized package size and thickness, which makes it difficult to achieve a substantial increase of the memory capacity only by mounting a memory chip on a board for mounting an IC chip that controls the memory chip inside the small-size memory card. In achieving a substantial increase of the memory capacity, the small-size memory card has also been required to achieve a certain level of rigidity and shock resistance as it is inserted and extracted to/from the portable devices.

Accordingly, it is an object of the present invention, in solving the above-stated issue, to provide a card-type recording medium which is capable of increasing memory capacity and excellent in rigidity and shock resistance, and to provide a method for manufacturing the same.

SUMMARY OF THE INVENTION

In order to accomplish the above object, the present invention has the following constitutions.

According to a first aspect of the present invention, there is provided a card-type recording medium comprising: a memory module which is so constituted that a plurality of memory chips are mounted on a memory board which is mounted on one surface of a base board; and an IC chip for controlling an operation of the plurality of memory chips is mounted on another surface of the base board, with all being housed in a package.

According to a second aspect of the present invention, there is provided the card-type recording medium as defined in the first aspect, wherein the memory modules are so constituted that the memory chips are mounted on both front and back surfaces of the memory boards.

According to a third aspect of the present invention, there is provided the card-type recording medium as defined in the first or second aspect, wherein the memory modules are composed of a plurality of memory modules, and the memory chip is mounted on the memory board of each memory module.

According to a fourth aspect of the present invention, there is provided the card-type recording medium as defined in any one of the first through third aspects, wherein the memory chip is mounted on the one surface of the base board.

According to a fifth aspect of the present invention, there is provided the card-type recording medium as defined in any one of the first through fourth aspects, wherein an electrode of the memory board and an electrode of the base board are electrically connected with a conductor that electrically connects those electrodes in a direction orthogonal to a memory board mounting face of the base board.

According to a sixth aspect of the present invention, there is provided the card-type recording medium as defined in the third aspect, wherein electrodes of the respective memory boards are electrically connected with one another via a conductor that electrically connects the electrodes of the mutually adjacent memory boards in a direction orthogonal to a memory chip mounting face of the memory board.

According to a seventh aspect of the present invention, there is provided the card-type recording medium as defined in the fifth or sixth aspect, wherein the conductor is a conductive wire.

According to an eighth aspect of the present invention, there is provided the card-type recording medium as defined in any one of the first through fourth aspects, wherein the memory modules are composed of a first memory module and a second memory module, the first memory module being mounted on the base board, and the second memory module being mounted on the first memory module, while the memory chip is mounted on the memory board of each memory module; and an electrode of the base board, an electrode of the memory board of the first memory module, and an electrode of the memory board of the second memory module are electrically connected with one conductive wire.

According to a ninth aspect of the present invention, there is provided the card-type recording medium as defined in the fifth or sixth aspect, wherein the conductor is a conductive ball.

According to a 10th aspect of the present invention, there is provided the card-type recording medium as defined in the fifth or sixth aspect, wherein the conductor is a conductive pin disposed inside an insulative resin sheet.

According to an 11th aspect of the present invention, there is provided the card-type recording medium as defined in the fifth or sixth aspect, wherein the conductor is a rectangular parallelepiped electronic component in which electrodes on top and bottom faces of each end are electrically connected to each other.

According to a 12th aspect of the present invention, there is provided the card-type recording medium as defined in any one of the first through 11th aspects, wherein the memory board has the plurality of memory chips disposed symmetrically with respect to a center of a lengthwise direction of the memory board.

According to a 13th aspect of the present invention, there is provided the card-type recording medium as defined in any one of the first through 12th aspects, wherein at least one memory chip is mounted on each of both surfaces of the memory board, and the memory chips mounted on both surfaces of the memory board are mounted to be located at the same position.

According to a 14th aspect of the present invention, there is provided the card-type recording medium as defined in any one of the first through 13th aspects, wherein a memory chip is mounted on the other surface of the base board.

According to a 15th aspect of the present invention, there is provided the card-type recording medium as defined in any one of the first through 13th aspects, wherein an RF LSI chip and a baseband LSI chip are mounted on the memory board or the base board.

According to a 16th aspect of the present invention, there is provided the card-type recording medium as defined in Claim any one of the first through 15th aspects, wherein the memory board is a film board.

According to a 17th aspect of the present invention, there is provided the card-type recording medium as defined in any one of the first through 15th aspects, wherein the memory board and the base board constitute one film board.

According to an 18th aspect of the present invention, there is provided a method for manufacturing the card-type recording medium as defined in any one of the first through 15th aspects, comprising:

laying the memory board on top of the first surface of the base board; and electrically connecting an electrode of the base board and an electrode of the memory board with a conductor that electrically connects the electrodes in a direction orthogonal to a memory board mounting face of the base board.

According to a 19th aspect of the present invention, there is provided a method for manufacturing the card-type recording medium as defined in the third or sixth aspect, comprising:

laying the first memory board on top of the first surface of the base board;

laying the second memory board on the first memory board;

electrically connecting an electrode of the base board and electrodes of the plurality of memory boards with a conductor that electrically connects the electrodes in a direction orthogonal to a memory board mounting face of the base board.

According to a 20th aspect of the present invention, there is provided the method for manufacturing the card-type recording medium as defined in the 18th or 19th aspect, wherein the conductor is a conductive wire.

According to a 21st aspect of the present invention, there is provided the method for manufacturing the card-type recording medium as defined in the 19th aspect, wherein an electrode of the base board and electrodes of the plurality of memory boards are electrically connected with one conductive wire.

According to a 22nd aspect of the present invention, there is provided the method for manufacturing the card-type recording medium as defined in the 18th or 19th aspect, wherein the conductor is a conductive ball.

According to a 23rd aspect of the present invention, there is provided the card-type recording medium as defined in the fifth aspect, wherein the memory modules are provided with a first memory module and a second memory module, the conductor is a conductive ball that passes through a through hole so as to function as an electrode of the memory board of the first memory module, and an upper portion of the conductive ball is electrically connected to an electrode of the memory board of the second memory module, while a lower portion of the conductive ball is electrically connected to an electrode of the base board of the base board module.

According to a 24th aspect of the present invention, there is provided the card-type recording medium as defined in any one of the first through 17th aspects, wherein the memory board is rectangular and the memory chip is rectangular, a long side of the rectangular memory chip is disposed approximately parallel to at least one short side of the rectangular memory board, and along the short side there is disposed an electrode of the memory board to be connected to an electrode of the base board.

According to a 25th aspect of the present invention, there is provided the card-type recording medium as defined in the 24th aspect, wherein the plurality of memory chips are provided on one surface of the memory board, and on the first surface of the memory board and among the plurality of memory chips, the electrode to be connected to the electrode of the base board is disposed approximately parallel to the short side of the memory board.

According to a 26th aspect of the present invention, there is provided the card-type recording medium as defined in any one of the first through 17th, 24th, and 25th aspects, wherein the memory module is composed of a plurality of memory modules to be laminated, and a lengthwise direction of the memory chip disposed on the memory board of one memory module out of the plurality of memory modules crosses a lengthwise direction of the memory chip disposed on the memory board of another memory module out of the plurality of memory modules.

According to a 27th aspect of the present invention, there is provided the card-type recording medium as defined in any one of the first through 17th, 24th, 25th, and 26th aspects, wherein the memory module is composed of a plurality of memory modules to be laminated, and a thickness of the memory chip disposed on the memory board of an upper-side memory module out of the plurality of memory modules is larger than a thickness of the memory chip disposed on the memory board of a lower-side memory module out of the plurality of memory modules.

According to a 28th aspect of the present invention, there is provided the card-type recording medium as defined in any one of the first through 17th, and 24th through 27th aspects, wherein a memory module composed of the plurality of memory chips mounted on the memory board is mounted on another surface of the base board.

According to a 29th aspect of the present invention, there is provided the card-type recording medium as defined in any one of the first through 17th, and 24th through 28th aspects, further comprising a reinforcing portion made of insulative reinforcing resin disposed between the memory board and the base board.

According to a 30th aspect of the present invention, there is provided the card-type recording medium as defined in any one of the first through 17th, and 24th through 29th aspects, further comprising a reinforcing portion made of insulative reinforcing resin disposed between the memory boards of the plurality of memory modules.

According to a 31st aspect of the present invention, there is provided the card-type recording medium as defined in any one of the first through 17th, and 24th through 30th aspects, further comprising a reinforcing portion made of insulative reinforcing resin disposed between an inner face of the package and the memory board.

According to a 32nd aspect of the present invention, there is provided the card-type recording medium as defined in any one of the first through 17th, and 24th through 31st aspects, further comprising a reinforcing portion made of insulative reinforcing resin disposed between an inner face of the package and the base board.

According to a 33rd aspect of the present invention, there is provided the card-type recording medium as defined in any one of the 29th through 31st aspects, wherein a thickness of the insulative reinforcing resin is equal to or larger than a thickness of the memory chip.

According to a 34th aspect of the present invention, there is provided the card-type recording medium as defined in the 13th aspect, wherein at least one memory chip is mounted on each of both surfaces of the memory board, and the memory chips mounted on both surfaces of the memory board are located at generally the same position and are shaped generally identical to each other.

According to a 35th aspect of the present invention, there is provided the card-type recording medium as defined in any one of the first through 17th, and 24th through 34th aspects, further comprising a junction portion for keeping a constant space between the memory board and the base board.

According to a 36th aspect of the present invention, there is provided the card-type recording medium as defined in any one of the first through 17th, and 24th through 35th aspects, further comprising a protruding electrode for connecting an electrode of the base board and an electrode of the memory board, provided in either one of both electrodes.

BRIEF DESCRIPTION OF THE DRAWINGS

These and other aspects and features of the present invention will become clear from the following description taken in conjunction with the preferred embodiments thereof with reference to the accompanying drawings, in which:

FIG. 1 is a schematic perspective view showing a small-size memory card with a case removed according to one embodiment of the present invention, in which some conductors are deleted for easier understanding of electrodes and the like;

DETAILED DESCRIPTION OF THE INVENTION

Figure 1:
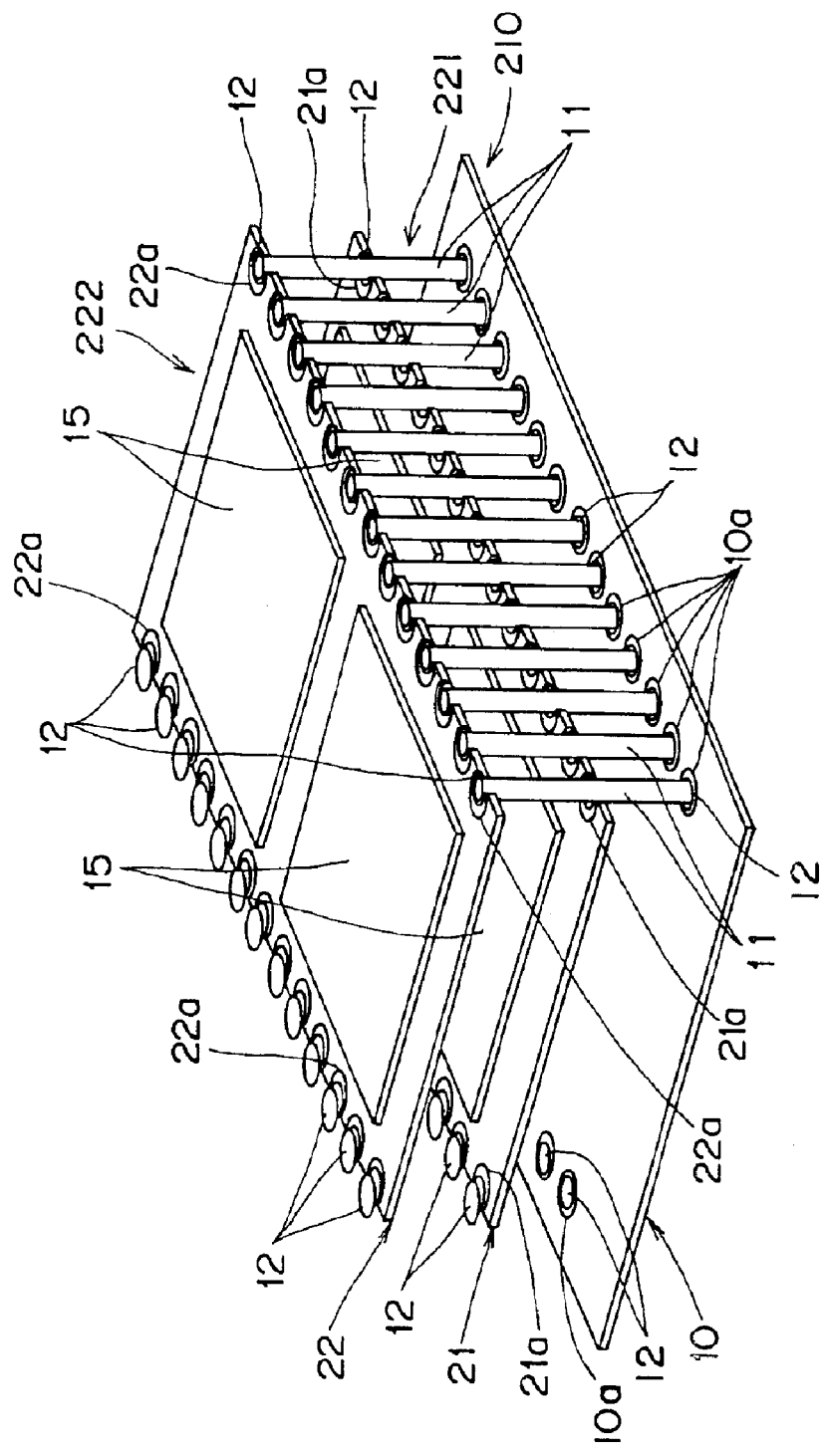

Hereinbelow, embodiments of the present invention will be described in detail with reference to drawings. In the drawings, junction portions between an IC chip or a memory chip and each board are shown in cross section for easy understanding. However, it is desirable in actuality to seal all the junction portions with sealing resin.

Figure 23:
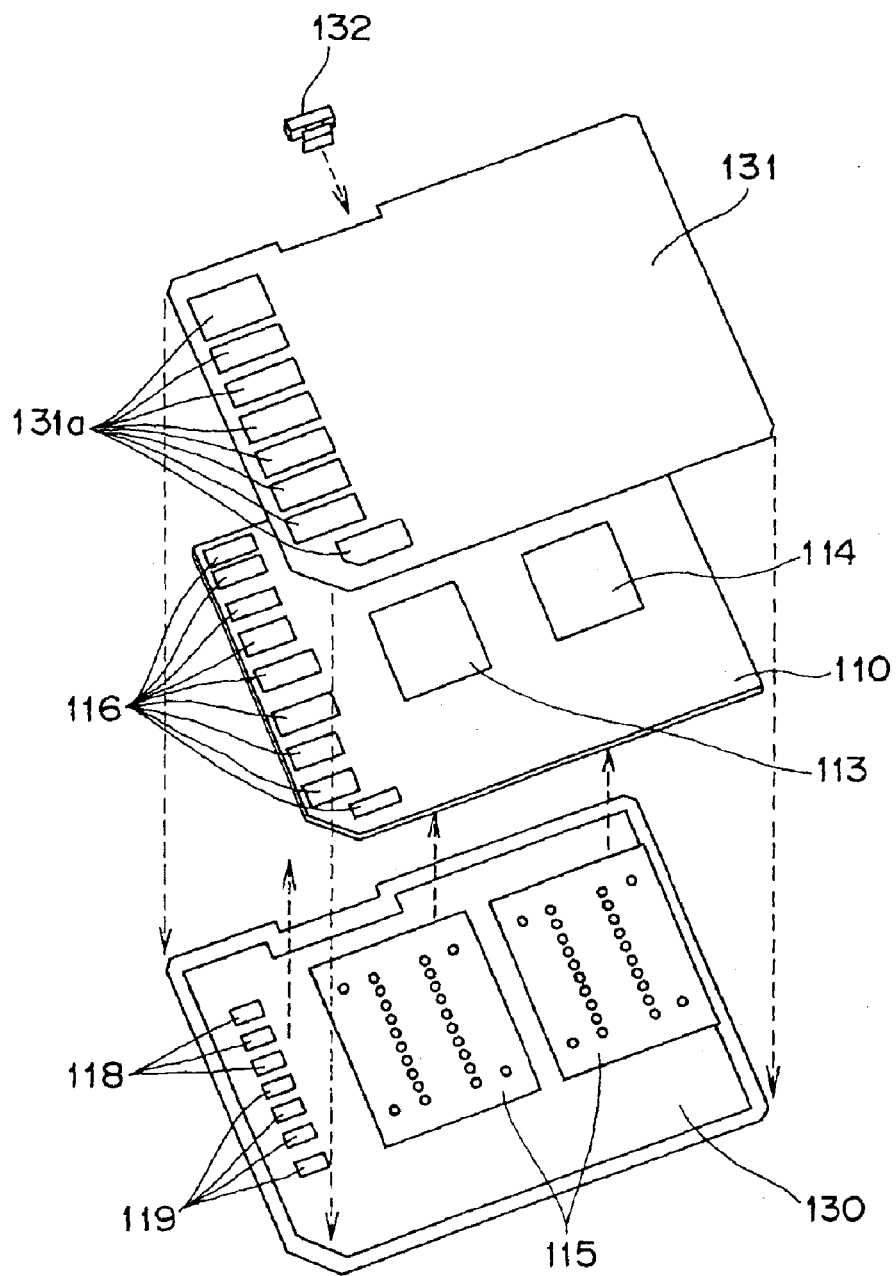
FIG. 23 is an exploded perspective view showing a small-size memory card that is a basic small-size memory card for each embodiment of the present invention.
Figure 24:
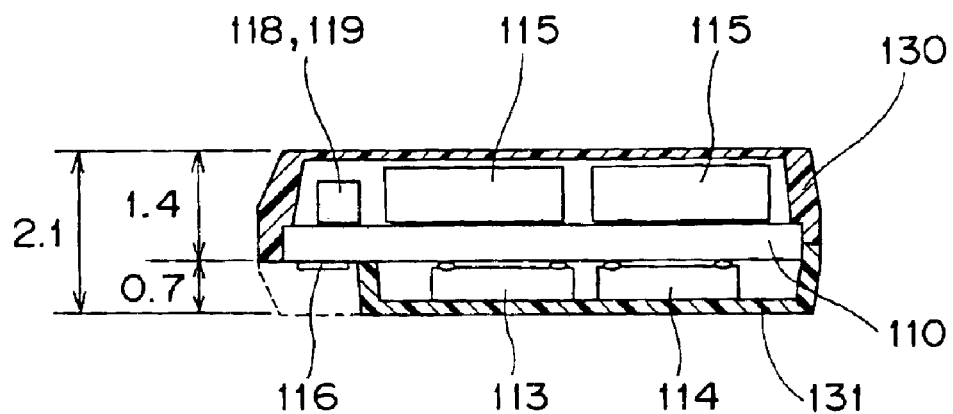
FIG. 24 is a partial cross sectional side view showing the small-size memory card of FIG. 23.
Figure 25:
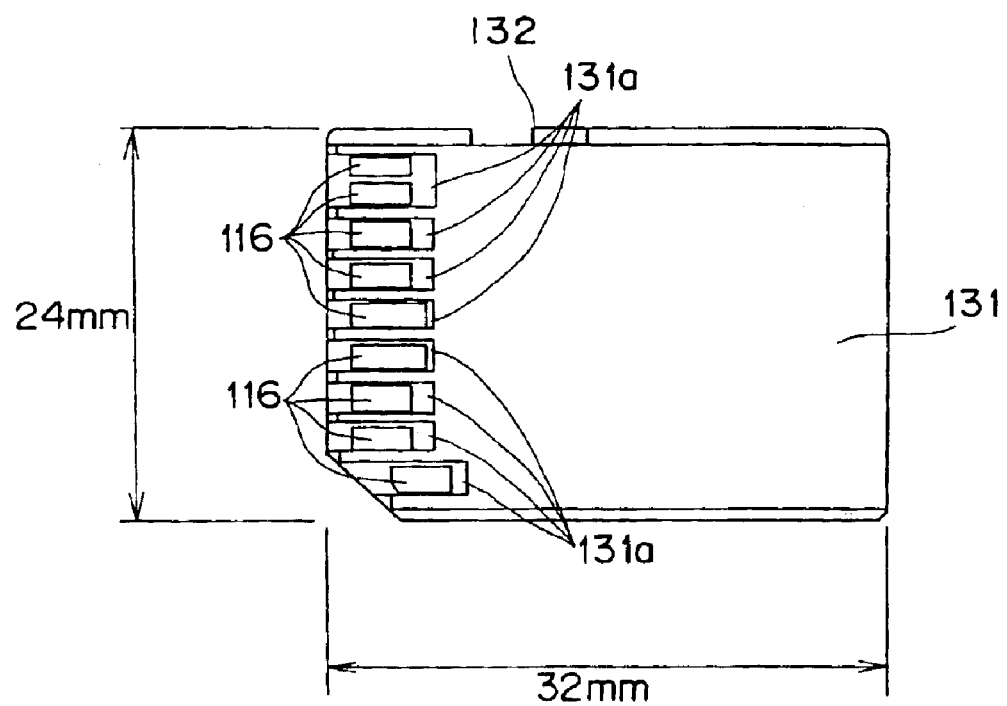
FIG. 25 is a bottom view showing the small-size memory card of FIG. 23.

First, there are shown in FIG. 23 to FIG. 25 specific and basic constitutions of a small-size memory card as an example of the card-type recording medium according to various embodiments of the present invention.

In the drawings, reference numeral 110 denotes a board 113 an ASIC (Application Specific Integrated Circuit) controller LSI chip (ASIC IC chip) mounted on the back face of the board 110 (the top face in FIG. 23, and the bottom face in FIG. 24), 114 a microprocessor IC chip mounted on the back face of the board 110, 115 a flash memory chip that is CSP (Chip Size Package) mounted on the front face of the board 110 (the bottom face in FIG. 23 and the top face in FIG. 24), 116 electrodes of the board 110, 118 a chip capacitor mounted on the front face of the board 110, 119 a chip resistor mounted on the front face of the board 110, 130 an upper case for covering the front face of the board 110, 131 a lower case fixed to the upper case 130 for covering the back face of the board 110, 131a electrode openings of the lowercase 131, and 132 a write protect switch.

Such a small-size memory card as a product in the state that the lower case 131 is fixed to the upper case 130 as shown in FIG. 25 is required to have a standard such as 24 mm wide×32 mm high×2.1 mm thick. It is noted that in FIG. 24, the upper case 130 is 1.4 mm thick and the lower case 131 is 0.7 mm thick. The flash memory IC chip is structured to be, for example, a rectangular thin plate having 7.8 mm short side×16 mm long side with the thickness of 80 μm.

A detailed description will be hereinbelow given of various embodiments of the present invention for increasing memory capacity in the small-size memory card in conformity with such a standard. It is noted that this standard is stated as one example for imparting easier understanding, and therefore the present invention is not limited thereby.

(First Embodiment)

Figure 2:
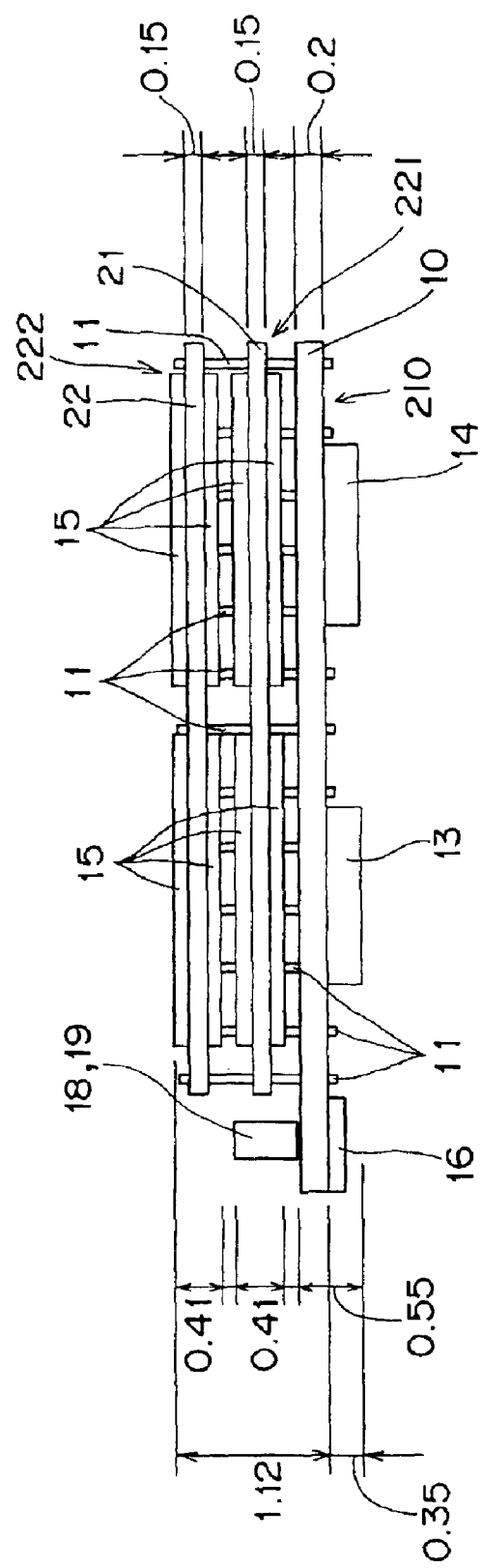
FIG. 2 is a side view showing the small-size memory card of FIG. 1.
Figure 3:
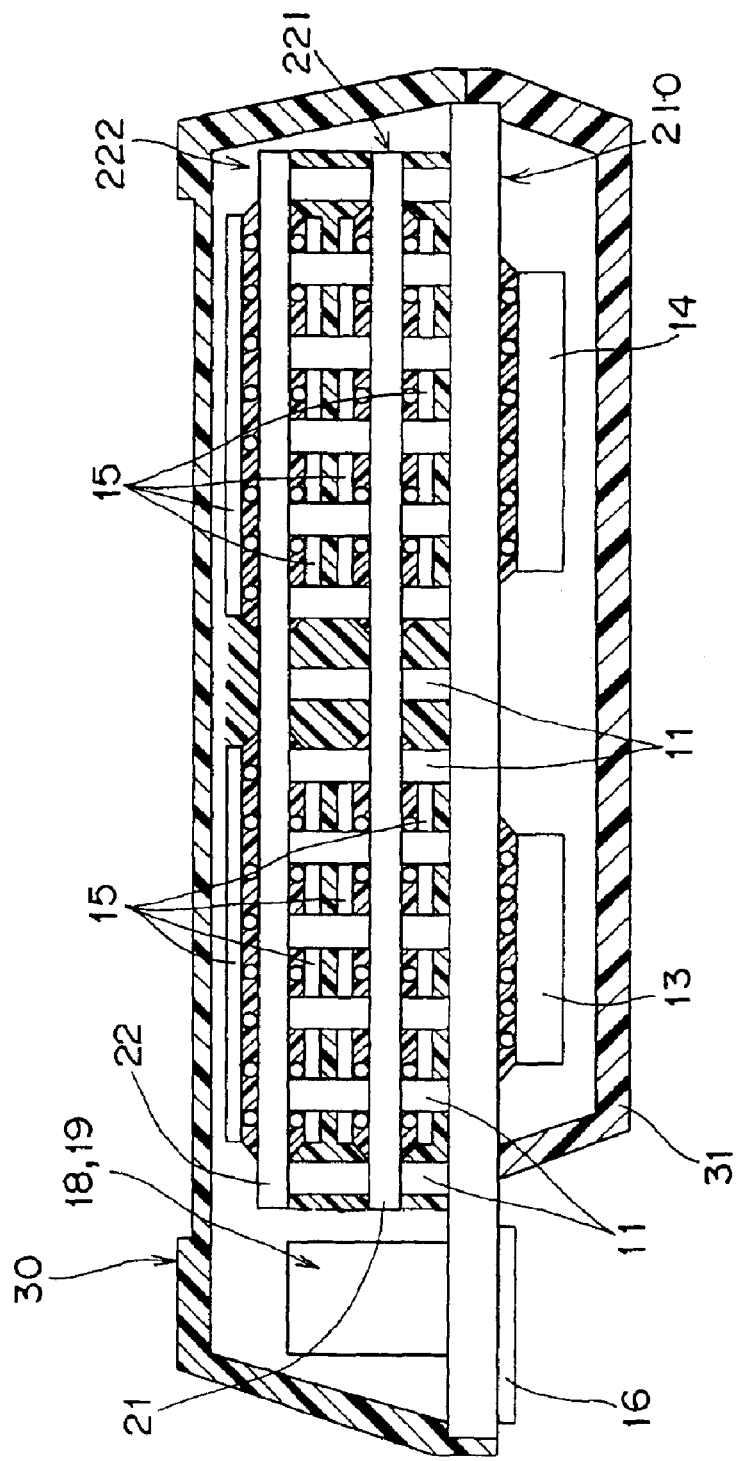
FIG. 3 is a partial cross sectional side view showing the small-size memory card of FIG. 1 in a completed state, in which connection portions between memory chips and a board as well as a case are shown by cross section for easier understanding.

The small-size memory card as one example of the card-type recording medium according to a first embodiment of the present invention is composed of, as shown in FIG. 1 to FIG. 3, a base board module 210, a first memory module 221 mounted on the base board module 210, and a second memory module 222 mounted on the first memory module 221 to constitute a board 110 on which the controller LSI chip 113, the microprocessor IC chip 114, and the flash memory chip 115 of FIG. 24 are mounted, which is housed in a package including an upper case 30 and a lower case 31 with a specified space provided between the board 110 and each of the cases 30, 31.

The base board module 210 is structured such that a microprocessor IC chip 14 and an ASIC IC chip 13 are mounted with a specified space on the bottom face of a rectangular plate-shaped base board 10. Each electrode of the microprocessor IC chip 14 and each electrode of each board, as well as each electrode of the ASIC IC chip 13 and each electrode of each board are directly joined or flip chip-mounted with bumps and the like, and then the junction portions are sealed by insulative sealing resin. In one end portion on the top face of the base board 10, there are mounted chip capacitors 18 and chip resistors 19 along the short side that is orthogonal to the long side along the longitudinal direction of the base board 10. In the vicinity of the long side along the longitudinal direction of the base board 10, there are formed a number of through holes 10a which are to be electrically connected to a circuit pattern of the base board 10 and to function as electrodes to connect to other memory boards 21, 22. In each through hole 10a, solder paste 12 is disposed. The through holes 10a on both ends of the longitudinal direction may be used as positioning holes 10z in manufacturing the small-size memory card. It is noted that reference numeral 16 denotes a card electrode of the small-size memory card, reference numeral 18 denotes a chip capacitor, and reference numeral 19 denotes a chip resistor.

The first memory module 221 is structured such that on both the front and back faces (both top and bottom faces) of a rectangular first memory board 21 smaller than the base board 10, there are mounted a total of four memory chips 15 such as nonvolatile memory chips as typified by flash EEPROM. Each electrode of each memory chip 15 and each electrode of the first memory board 21 are directly joined or flip chip-mounted with bumps and the like, and then the junction portions are sealed with insulative sealing resin. In the vicinity of the long side along the longitudinal direction of the first memory board 21, there are formed a number of through holes 21a which are to be electrically connected to a circuit pattern of the first memory board 21 and to function as electrodes to connect to the base board 10 and the second memory board 22. In each through hole 21a, solder paste 12 is disposed. The through holes 21a on both ends of the longitudinal direction may be used as positioning holes 21z in manufacturing the small-size memory card.

The second memory module 222 has the same constitution as the first memory module 221, in which on both the front and back faces (both top and bottom faces) of a rectangular second memory board 22 smaller than the base board 10, there are mounted a total of four memory chips 15 such as flash memories. Each electrode of each memory chip 16 and each electrode of the second memory board 22 are directly joined or flip chip-mounted with bumps and the like, and then the junction portions are sealed with insulative sealing resin. In the vicinity of the long side along the longitudinal direction of the second memory board 22, there are formed a number of through holes 22a which are to be electrically connected to a circuit pattern of the second memory board 22 and to function as electrodes to connect to the base board 10 and the first memory board 21. In each through hole 22a, solder paste 12 is disposed. The through holes 22a on both ends of the longitudinal direction may be used as positioning holes 22z in manufacturing the small-size memory card.

Conductive wires 11 exemplifying conductors for electrically connecting the boards in a direction orthogonal to the memory board mounting face of the base board 10 go through the respective through holes 10a of the base board 10, the respective through holes 21a of the first memory board 21, and the respective through holes 22a of the second memory board 22, and come in contact with the solder paste 12 in the respective through holes, as a result of which the solder paste 12 inside the respective through holes 10a of the base board 10, the solder paste 12 inside the respective through holes 21a of the first memory board 21, and the solder paste 12 inside the respective through holes 22a of the second memory board 22 are electrically connected by the conductive wires 11. As a specific example, each through hole is to be a through hole connected to a circuit of each board and having a diameter of 0.50 $\mu$m and a gold-plated inner circumferential face. The conductive wire 11 is to be a copper wire with a diameter of 0.20 $\mu$m. As for each through hole, only each through hole 10a of the base board 10 may be the through hole connected to a circuit of the base board 10 and having a diameter of 0.50 $\mu$m and a gold-plated inner circumferential face, while each through hole 21a of the first memory board 21 and each through hole 22a of the second memory board 22 may be formed into the shape of an approximate semicircle (refer to FIG. 1) obtained by halving the through hole connected to the circuit of each memory board and having a diameter of 0.50 $\mu$m and a gold-plated inner circumferential face.

Thus, the base board 10, the memory board 21, and the second memory board 22 may be connected by the conductive wires 11, which makes it possible to dispose two-layer memory boards 21, 22, which allow mounting of the memory chip 15 on both faces thereof, in a small space on the base board 10 at narrow intervals. Further, connecting the electrodes of each board by the conductive wires 11 makes it possible to improve connection strength between the electrodes. In such constitution, the memory mountable area is enlarged to both the front and back faces of the first memory board 21 and both the front and back faces of the second memory board 22, which is four times larger than the area in the case where a memory or memories are mounted on either one surface of the base board 10, resulting in achieving up to a fourfold increase of memory capacity. Therefore, with the capacity of one memory chip 15 being 32MB for example, the case of mounting only two memory chips 15 provides capacity of 2×32MB =64 MB, whereas the present invention is capable of providing capacity of up to 8 ×32MB=256MB. With the capacity of one memory chip 15 being 64MB, the capacity of up to 8×64MB =512MB may be achieved. Further, with the capacity of one memory chip 15 being 128MB, the capacity of up to 8×128MB= about 1GB may be achieved.

Also, since two memory chips 15 having the same size and thickness may be mounted in the same position on both the front and back faces of each of the memory boards 21, 22, it becomes possible to prevent each board from bending toward one side due to, for example, hardening and contraction of the sealing resin when thermal or mechanical stress acts upon each of the memory boards 21, 22. Also, a plurality of the memory chips 15 may be disposed on each of the memory boards 21, 22 symmetrically about the center of the longitudinal direction of the memory boards 21, 22, which may prevent the entire memory boards 21, 22 from having biased stress distribution.

Also, the memory modules 221, 222 with the memory chips 15 mounted thereon may be separately structured as components different from the base board 10. Consequently, if a memory chip 15 is determined to be defective in the step of burn-in, only the memory module incorporating the memory chip 15 may be abandoned, and so it is not necessary to abandon the base board 10 with IC chips 13, 14 mounted thereon.

Also, since each memory chip 15 is directly mounted without outer leads, that is, is flip chip-mounted on each board (that is, since the respective electrodes of each memory chip 15 are directly joined to the respective electrodes of each board with bumps and the like,) space and labor for dragging out outer leads to the outside of each memory chip 15 and joining them to each board may be saved, thereby enabling decreased space and shortened process.

It is noted that in one example as shown in FIG. 2, the base board 10 is 0.2 mm thick, the first memory board 21 is 0.15 mm thick, the second memory board 22 is 0.15 mm thick, a space between the memory chip 15 mounted on the bottom face of the second memory board 22 and the memory chip 15 mounted on the top face of the first memory board 21 is 0.41 mm, and a space between the memory chip 15 mounted on the bottom face of the first memory board 21 and the top face of the base board 10 is 0.41 mm, each for conforming to the standard of the small-size memory card of FIG. 23 to FIG. 25. Also, a distance between the top face of the memory chip 15 mounted on the top face of the second memory board 22 and the bottom face of the base board 10 is 1.12 mm, and a distance between the bottom face of the base board 10 and the top face of the microprocessor IC chip 14 or the ASIC IC chip 13 mounted on the bottom face of the base board 10 is 0.35 mm. Therefore, a distance between the top face of the memory chip 15 mounted on the top face of the second memory board 22 and the top face of the microprocessor IC chip 14 or the ASIC IC chip 13 mounted on the bottom face of the base board 10 is 1.47 mm.

It is noted that each board including the base board 10, the first memory board 21, and the second memory board 22 may be either a single-layer board or a multi-layer board.

Following description discusses a method for manufacturing the small-size memory card.

Figure 4A:
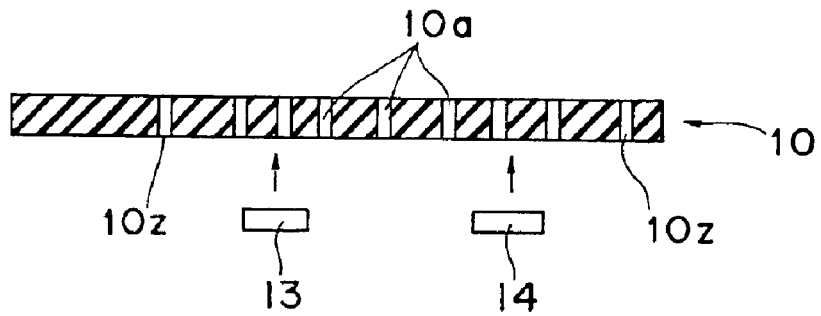
FIGS. 4A, 4B, and 4C are, respectively, partial cross sectional explanatory views showing processes of manufacturing a base board module, a first memory module, and a second memory module, in a method for manufacturing the small-size memory card of FIG. 1.

As shown in FIG. 4A, on the bottom face of the base board 10, two IC chips consisting of the microprocessor IC chip 14 serving as a microcomputer IC chip and the ASIC IC chip 13 serving as a controller IC chip are bear chip-mounted to form one base board module 210. Although it is not illustrated in detail, card electrodes 16 of the small-size memory card are formed on the bottom face of the base board 10, and a chip capacitor 18 and a chip resistor 19 are mounted on the top face of the base board 10.

Figure 4B:
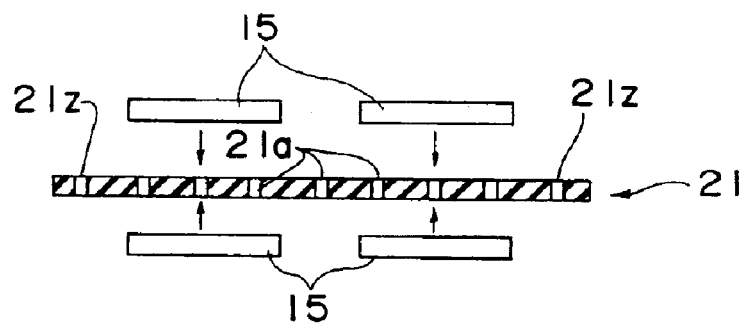
Figure 4C:
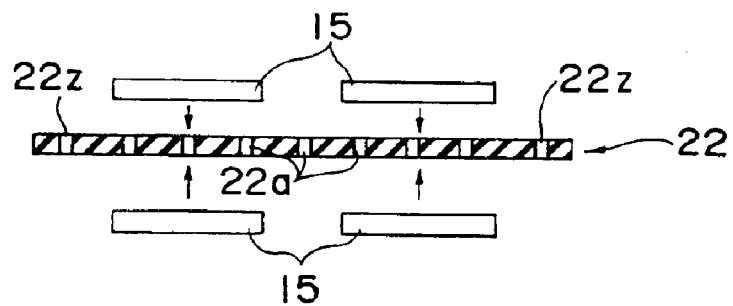

Also as shown in FIG. 4B and FIG. 4C, on both the top and bottom faces of two memory boards 21, 22, two memory chips 15 such as flash memories are each flip chip-mounted to form two first and second memory modules 221, 222.

Each of the steps shown in FIGS. 4A, 4B, and 4C may be performed simultaneously or in an arbitrary order. Also, in the case of manufacturing a number of small-size memory cards, each of the steps shown in FIGS. 4A, 4B, and 4C may be performed a number of times for manufacturing in advance a number of the first and second memory modules 221, 222 and the base board modules 210.

Figure 5A:
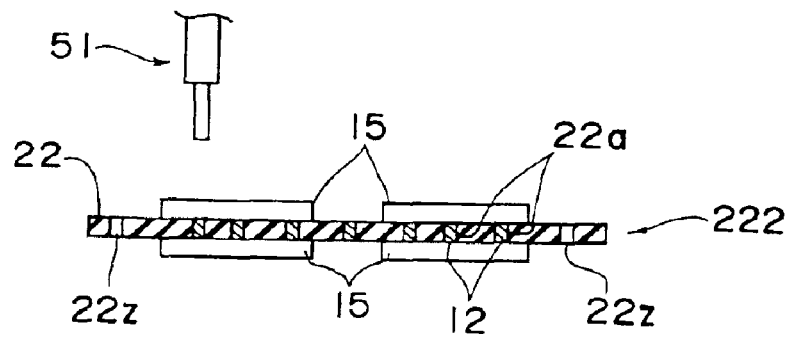
FIGS. 5A, 5B, 5C, and 5D are, respectively, partial cross sectional explanatory views showing processes of applying solder paste to the base board module, the first memory module, and the second memory module, as well as a partial cross sectional explanatory view showing a process of temporarily fixing the first memory module and the second memory module, in the method for manufacturing the small-size memory card of FIG. 1.
Figure 5B:
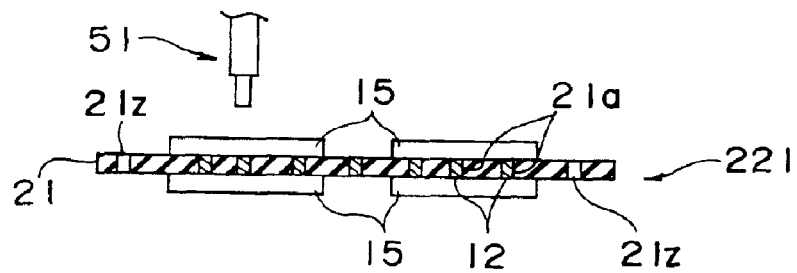
Figure 5C:
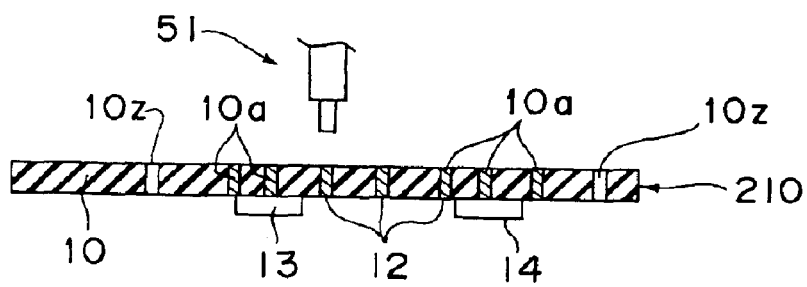

Next, as shown in FIG. 5A, the solder paste 12 is fed to each of the through holes 10a of the base board 10 with a dispenser 51. Similarly, as shown in FIG. 5B and FIG. 5C, the solder paste 12 is also fed to each of the through holes 21a, 22a of the first and second memory boards 21, 22 with the dispenser 51. It is noted that in each of the boards 10, 21, 22, the through holes in the same position at both ends of the longitudinal direction are used as positioning holes 10z, 21z, 22z, so that the solder paste 12 is not inserted therein as they are not used as electrodes for board connection. Instead of the positioning holes 10z, 21z, 22z, a positioning mark may be provided on each board, or a part of the circuit pattern of each board may be used as a positioning mark for positioning of the boards.

Figure 5D:
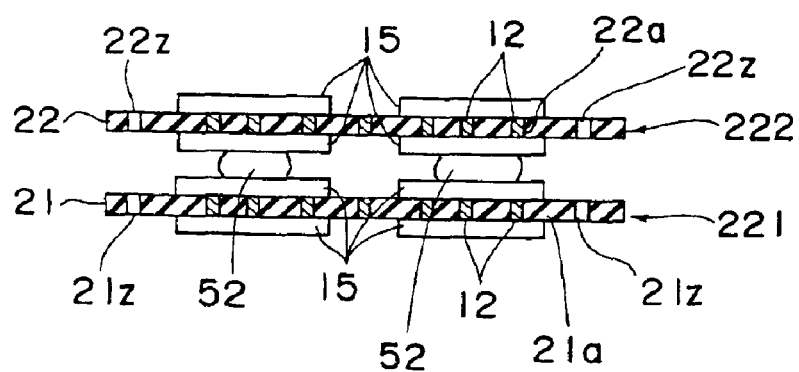

Next, as shown in FIG. 5D, the first memory module 221 and the second memory module 222 are temporally fixed. More specifically, the second memory board 22 is placed on the first memory board 21, and their positions are adjusted so that the positioning holes 21z, 22z in the respective ends are aligned. Then, with use of an insulative temporal-fixing adhesive 52, the top faces of two memory chips 15, 15 mounted on the top face of the first memory board 21 are bonded to the bottom faces of two memory chips 15, 15 mounted on the bottom face of the second memory board 22 so that the first memory module 221 and the second memory module 222 are temporarily fixed to each other. Herein, the first memory board 21 is set approximately parallel to the second memory board 22. This is for adjusting the size of the entire small-size memory card to the standardized size.

Figure 6A:
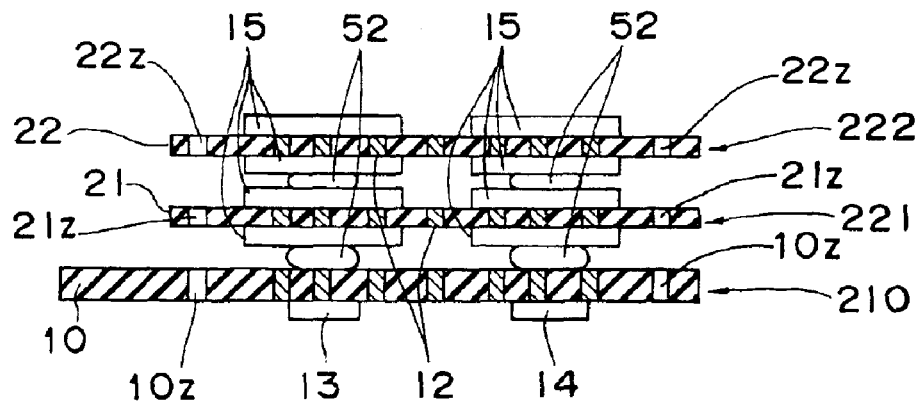
FIGS. 6A, 6B, and 6C are, respectively, partial cross sectional explanatory views showing a process of temporarily fixing the temporarily-fixed first memory module and second memory module to the base board module, a process of individually connecting electrodes of the modules with conductive wires, and a process of connecting electrodes of the modules with a continuous conductive wire as another example of the conductor, in the method for manufacturing the small-size memory card of FIG. 1.

Next, as shown in FIG. 6A, the first memory module 221 and the second memory module 222 temporarily-fixed to each other are temporarily fixed to a base board module 210. More particularly, two memory chips 15 mounted on the bottom face of the first memory module 221 and the top face of the base board module 210 are bonded with an insulative temporarily-fixing adhesive 52, and then on the base board module 210, the temporarily-fixed first memory module 221 and second memory module 222 are temporarily fixed. At this point, the first memory board 21, the second memory board 22, and the base board 10 are disposed approximately parallel to each other. This is for adjusting the size of the entire small-size memory card to the standardized size.

Figure 6B:
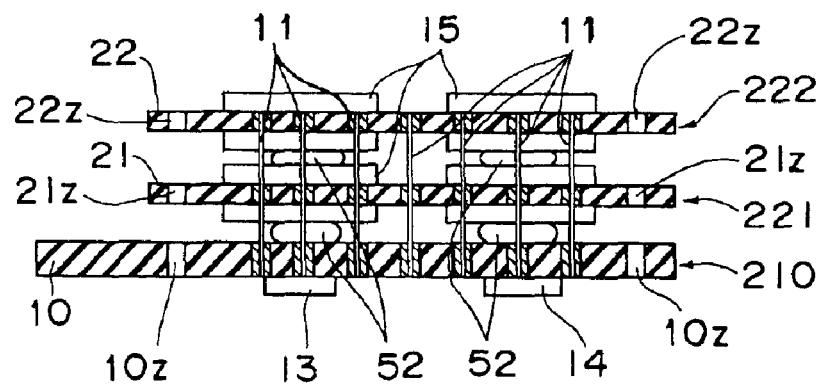

Next, as shown in FIG. 6B, electrodes of the respective modules are individually connected with conductive wires 11. More particularly, each positioning hole 10z of the base board module 210, each positioning hole 21z of the first memory module 221, and each positioning hole 22z of the second memory module 222 are positioned to be matched with each other, where an electrode of the solder paste 12 inside each through hole 10a of the base board module 210, an electrode of the solder paste 12 inside each through hole 21a of the first memory module 221, and an electrode of the solder paste 12 inside each through hole 22a of the second memory module 222 are individually connected with the conductive wire 11.

Then, the modules are put in a reflow furnace or hot winds such as hot air are applied to melt each solder paste 12, so that each solder paste 12 and each conductive wire 11 are fully fixed to each other to secure the electrical connection.

Next, with an insulative sealing resin 200, a space between the base board 10 of the base board module 210 and the first memory board 21 of the first memory module 221, a space between the first memory board 21 of the first memory module 221 and the second memory board 22 of the second memory module 222, and a space between two memory chips 15 on the top face of the second memory board 22 are each sealed.

Next, these modules are housed in upper and lower cases 30 and 31 to provide the small-size memory card.

According to the method for manufacturing the small-size memory card, in the case of the small-size memory card shown in FIG. 1, the first memory module 221 and the second memory module 222 are assembled in advance before being mounted on the base board module 210, which enables examination of the function as an integrated memory module through a burn-in test and the like. Consequently, in the case of occurrence of defects, only a defected memory module may be abandoned and the base board module 210 that is expensive compared to the memory module is not required to be abandoned, resulting in reduction of costs.

Figure 6C:
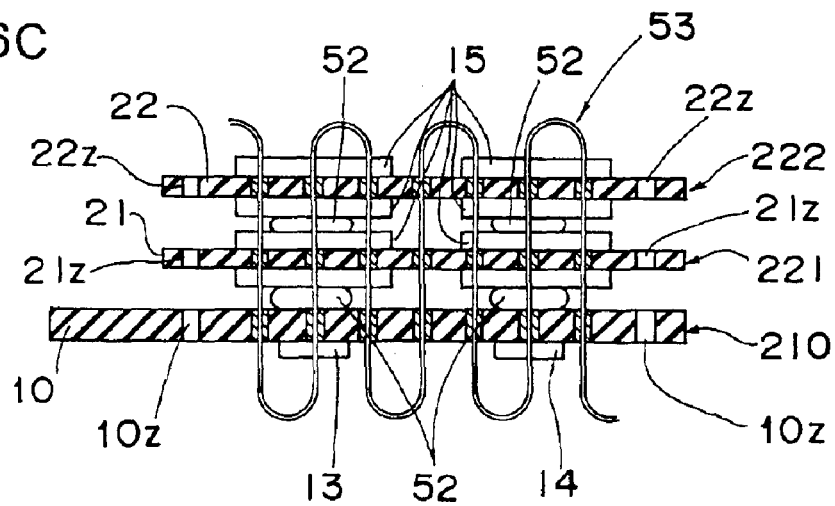

It is noted that in the above-stated first embodiment, instead of individually connecting an electrode of solder paste 12 inside each through hole 10a of the base board module 210, an electrode of solder paste 12 inside each through hole 21a of the first memory module 221, and an electrode of a solder paste 12 inside each through hole 22a of the second memory module 222 with a conductive wire 11 as shown in FIG. 6B, electrodes of each module may be connected with a continuous one or several conductive wires 53 as another example of the conductor as shown in FIG. 6C.

More particularly, the conductive wire 53 is set to pass through three solder paste electrodes 12 located such that the base board module 210, the first memory module 221, and the second memory module 222 are vertically layered. More specifically, the three solder paste electrodes 12 consist of an electrode of the solder paste 12 inside each through hole 22a of the second memory module 222, an electrode of the solder paste 12 inside each through hole 21a of the first memory module 221, and an electrode of the solder paste 12 inside each through hole 10a of the base board module 210. The conductive wire 53 is then bent in a U-shape, and is set to pass through the electrode of the solder paste 12 inside each through hole 10a of the adjacent base board module 210, the electrode of the solder paste 12 inside each through hole 21a of the first memory module 221, and the electrode of the solder paste 12 inside each through hole 22a of the second memory module 222. Then the wire 53 is bent in U-shape again, and is set to pass through, for example, the electrode of the solder paste 12 inside each through hole 22a of the adjacent second memory module 222, the electrode of the solder paste 12 inside each through hole 21a of the first memory module 221, and the electrode of the solder paste 12 inside each through hole 10a of the adjacent base board module 210. Thus, all the solder paste electrodes 12 to be connected are connected.

Next, the module is brought in the reflow furnace for a reflow process, or hot winds such as hot air is applied to melt each solder paste 12, so that each solder paste 12 and the conductive wire 53 are fully fixed to each other in a conducting state to secure electrical connection.

Next, a portion of the conductive wire 53 bent in a U-shape is cut out and removed, so that three solder paste electrodes 12, interposed between the base board 10, the first memory board 21, and the second memory board 22 in an aligned manner, may be connected to each other individually, and may function as a conduction pillar material that enables individual conduction of each connecting section.

Such constitution eliminates the necessity for preparing a number of conductive wires 11 in advance and decreases the number of components to be prepared. Further, in achievement of the connection, passing a continuous conductive wire 53 through solders 12 is easier than connecting a number of conductive wires 11 one by one, and therefore the above constitution makes it possible to reduce operations.

In the first embodiment, it is also possible to perform positioning of the base board 10, the first memory board 21, and the second memory board 22 at the same time for temporal fixing. For temporal fixing, a double sided adhesive tape may be used instead of the adhesive. Further, the three boards may be positioned and held not by using the adhesive but by utilizing other members or the adhesive power of solder.

(Second Embodiment)

Figure 7:
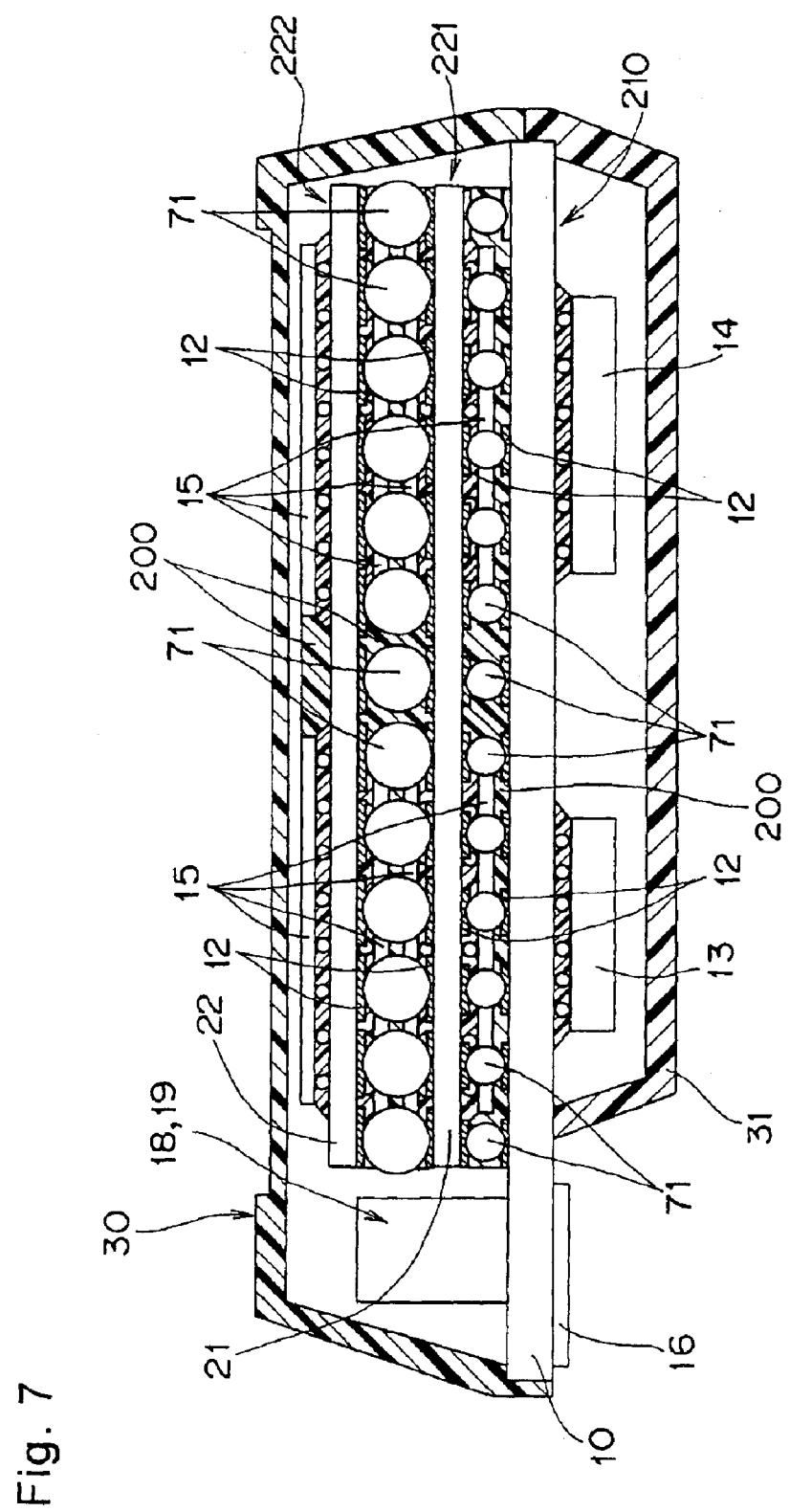
FIG. 7 is a partial cross sectional side view showing a small-size memory card in a completed state according to a second embodiment of the present invention, in which connection portions between memory chips and a board as well as a case are shown by cross section for easier understanding.

FIG. 7 is a partial cross sectional side view showing a small-size memory card in a completed state according to a second embodiment of the present invention. In FIG. 7, instead of the conductive wire 53, a conductive ball 71 made of copper or the like is used. More particularly, the conductive ball 71 is interposed between the solder paste 12 inside each through hole 10a of the base board 10 and the solder paste 12 inside each through hole 10a of the first memory board 21 to keep the space between the base board 10 and the first memory board 21 approximately even (i.e., keep the boards parallel), while at the same time, the conductive ball 71 is interposed between the solder paste 12 inside each through hole 21a of the first memory board 21 and the solder paste 12 inside each through hole 22a of the second memory board 22 to keep the space between the first memory board 21 and the second memory board 22 approximately even (i.e., keep the boards parallel). In this case, it is preferable that the solder pastes 12 of each of the through holes 10a, 21a, and 22a have an outer diameter larger than the diameter of the conductive ball 71, so that the conductive ball 71 is slightly sunk in the electrodes of each solder paste 12 so as to be held stably.

As one example of the conductive ball 71, a copper ball having a diameter of 0.3 μm may be used. Materials of the conductive ball 71 include tin-zinc, tin-silver, and tin-copper in addition to copper.

According to the second embodiment, the same operation and effect as the first embodiment can be implemented. In addition, the conductive balls 71 are interposed between the base board 10 and the first memory board 21, as well as between the first memory board 21 and the second memory board 22, which facilitates equalization of the space between the respective boards, and enables approximately parallel disposition of the respective boards. Also, constituting the conductive ball 71 with a material having a melting point higher than that of solders such as copper prevents the conductive balls 71 from melting in the post-processing that melts the solders by reflow and air blow, thereby making it possible to secure an inter-board space with use of the conductive ball 71, and to keep parallelism between the boards with high accuracy. The conductive balls 71, which hold a space between the boards, are not easily deformed by mechanical stress applied. Consequently, against thermal stress and mechanical stress, the parallelism between the boards may be secured, and contact with adjacent conductive balls 71 may be prevented, which prevents short-circuit. Further, smaller diameter of the conductive ball 71 enables the conductive ball 71 to be disposed with a smaller pitch, which enlarges the degree of freedom of wiring, and enables individual wiring to each memory chip 15, thereby improving the processing speed between the memory chip 15 and IC chips 13 and 14.

The following description discusses a method for manufacturing the small-size memory card of FIG. 7.

First, similar to the method for manufacturing the small-size memory card of FIG. 1 and the like, first and second memory modules 221 and 222, and a base board module 210 are manufactured as shown in FIGS. 4A, 4B, and 4C. Although it is not illustrated in detail, card electrodes 16 of the small-size memory card are formed on the bottom face of the base board 10, and chip capacitors 18 and chip resistors 19 are mounted on the top face of the base board 10.

Figure 8A:
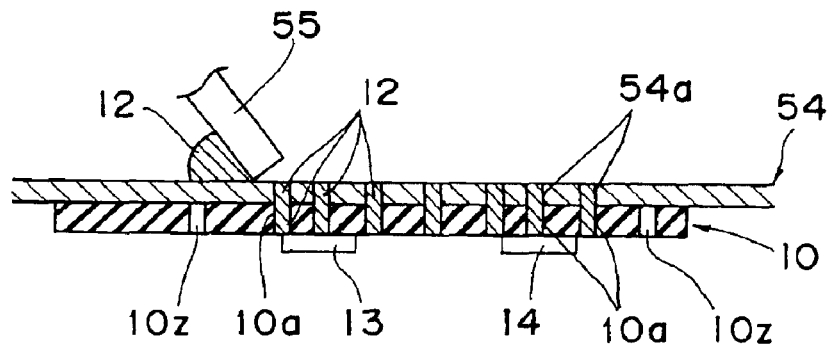
FIGS. 8A, 8B, and 8C are, respectively, partial cross sectional explanatory views showing a process of printing and feeding solder paste to the base board module, a process of feeding conductive balls one by one onto each solder paste electrode of the base board module, and a process of applying solder paste to the first memory module, in a method for manufacturing the small-size memory card of FIG. 7.

Next, as shown in FIG. 8A, solder paste is provided to the base board module 210 by printing. More particularly, a stencil 54 having through holes conforming to the respective through holes 10a of the base board 10, i.e., solder paste insertion holes 54a, is laid on top of the base board 10 of the base board module 210, where a squeegee 55 is moved while the solder paste 12 is moved on the stencil 54 for press-inserting the solder paste 12 in each through hole 10a of the base board 10 from each solder paste insertion hole 54a of the stencil 54. Here, in each through hole 10a of the base board 10, some solder paste 12 is arranged to be slightly overflown from the base board 10 in a direction of the thickness of the base board 10. This is for holding the conductive ball 71 on each solder paste 12 with increased stability through use of adhesive power of the solder paste 12 itself in the later processing.

Figure 8B:
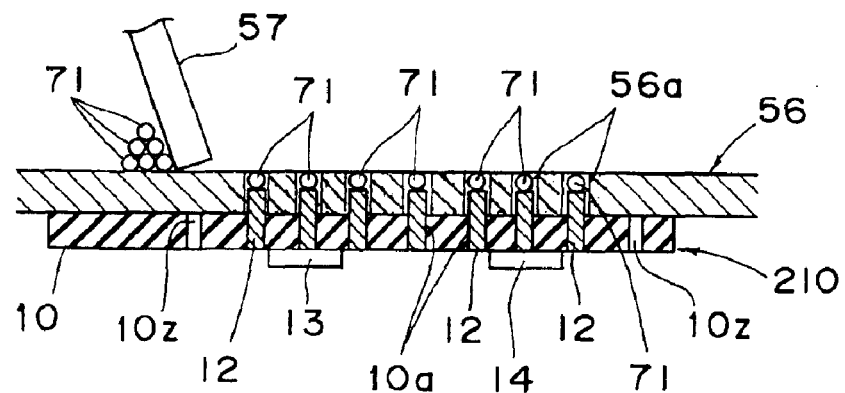

Next, as shown in FIG. 8b, one conductive ball 71 is provided to the electrode of each solder paste 12 of the base board module 210. More particularly, a conductive ball insertion plate 56 having a through hole conforming to the solder paste 12 of each through hole 10a of the base board 10, i.e., a conductive ball insertion hole 56a, is laid on top of the base board 10 of the base board module 210, preferably without contact with the solder paste 12. A squeegee 57 is moved while a number of conductive balls 71 are moved on the conductive ball insertion plate 56 for placing the conductive balls 71 one by one on the solder paste 12 inside each through hole 10a of the base board 10 from each conductive ball insertion hole 56a of the conductive ball insertion plate 56. When being placed on the solder paste 12, each conductive ball 71 is slightly sunk in the solder paste 12 by the stress from the squeegee 57, and held in place through use of adhesive power of the solder paste 12 itself. For ensuring the conductive balls 71 to be placed one by one on each solder paste 12, the thickness of the conductive ball insertion plate 56 is set to be equal to or slightly smaller than the diameter of the conductive ball 71, to ensure that not a plurality of conductive balls 71 but a single conductive ball 71 enters one conductive ball insertion hole 56a. For example, the thickness of the conductive ball insertion plate 56 is set to be 0.2 μm, so that one copper ball with a diameter of 0.3 μm enters each conductive ball insertion hole 56a.

Figure 8C:
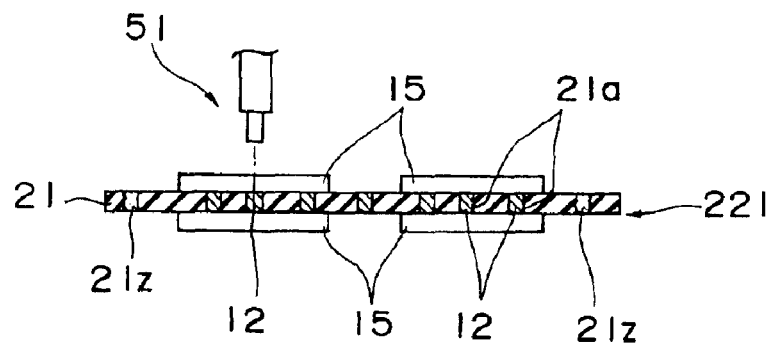

Next, as shown in FIG. 8C, the solder paste 12 is provided to the inside of each through hole 21a of the first memory board 21 of the first memory module 221 that is to be mounted on the base board module 210 by means of a dispenser 51 or the like. This process may be performed simultaneously with the process of FIG. 8B or prior to the process of FIG. 8B.

Figure 9A:
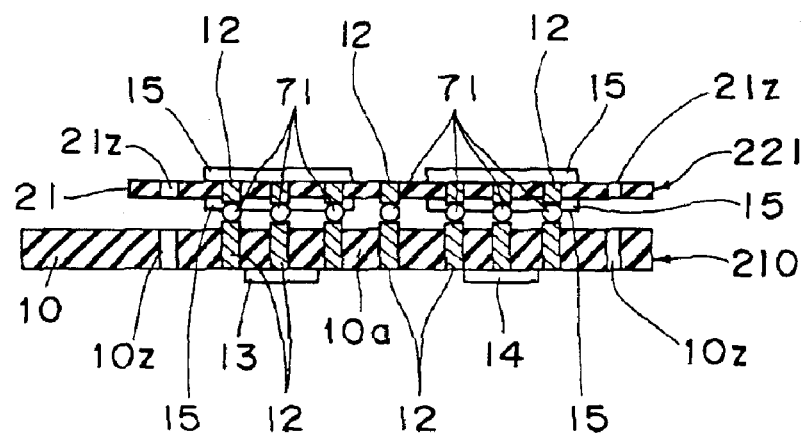
FIGS. 9A and 9B are partial cross sectional explanatory views showing a process of mounting the first memory module on the base board module with the conductive balls that are on the respective solder paste electrodes of the base board module, and a process of applying solder paste to the second memory module, in the method for manufacturing the small-size memory card of FIG. 7.

Next, as shown in FIG. 9A, with the conductive balls 71 on the electrodes of the solder paste 12 of the base board module 210, the first memory module 221 is mounted on the base board module 210. More particularly, in the state that the positioning holes 10z on both ends of the base board 10 match with the positioning holes 21z on both ends of the first memory board 21, the first memory board 21 is laid on top of the base board 10 such that the solder paste 12 inside each through hole 21a of the first memory board 21 is mounted on the conductive ball 71 on each solder paste 12 of the base board 10, where with a certain degree of stress applied, a part of the upper portion of each conductive ball 71 is sunk in the solder paste 12 inside each through hole 21a of the first memory board 21. This positions and holds the base board 10 and the first memory board 21 in approximately parallel. It is noted that when the first memory board 21 is laid on top of the base board 10 and a certain degree of stress is applied, the top face of the base board 10 and the bottom faces of two memory chips 15 placed on the bottom face of the first memory board 21 may be bonded through use of a temporality-fixing adhesive 52. Thus, the first memory board 21 and the base board 10 are secured approximately parallel to each other so as to conform the size of the entire small-size memory card to the standardized size.

Figure 9B:
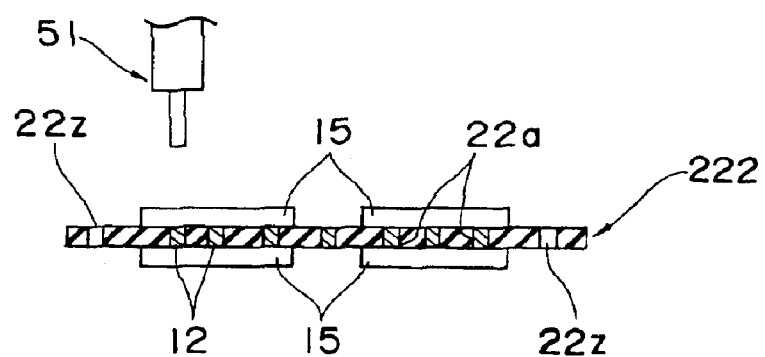

Next, as shown in FIG. 9B, the solder paste 12 is provided to the inside of each through hole 22a of the second memory board 22 of the second memory module 222 that is to be mounted on the first memory module 221 by means of a dispenser 51 or the like. This process may be performed simultaneously with the process of next FIG. 10A or prior to the process of FIG. 10A.

Figure 10A:
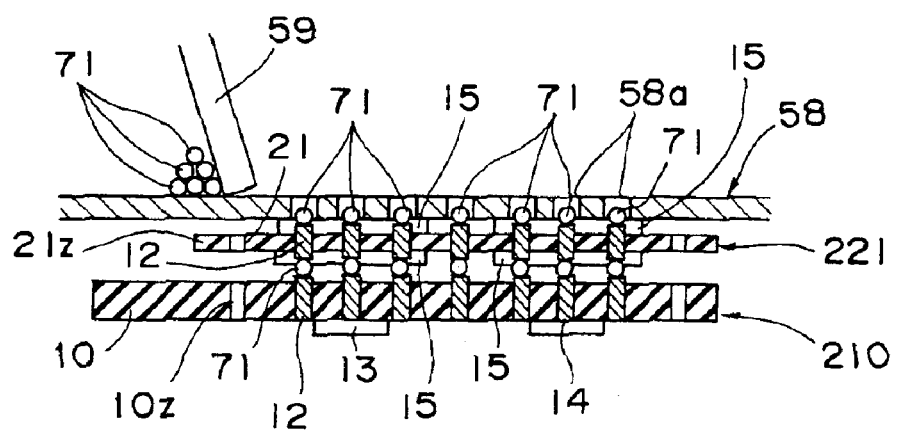
FIGS. 10A and 10B are, respectively, partial cross sectional explanatory views showing a process of feeding a conductive ball one by one onto each solder paste electrode of the first memory module that is on the base board module, a process of mounting the second memory module on the first memory module with the conductive balls that are on the respective solder paste electrodes of the first memory module, in the method for manufacturing the small-size memory card of FIG. 7.

Next, as shown in FIG. 10A, one conductive ball 71 is provided to the electrode of each solder paste 12 of the first memory board 21 of the first memory module 221 on the base board module 210. More particularly, similar to FIG. 8B, a conductive ball insertion plate 58 having through holes conforming to the solder pastes 12 of the respective through holes 21a of the first memory board 21, i.e., conductive ball insertion holes 58a, is laid on top of the first memory board 21 of the first memory module 221, preferably without contact with the solder pastes 12. A squeegee 59 is moved while a number of conductive balls 71 are moved on the conductive ball insertion plate 58 for placing the conductive balls 71 one by one on the solder paste 12 inside each through hole 21a of the first memory board 21 from each conductive ball insertion hole 58a of the conductive ball insertion plate 58. When being placed on the solder paste 12, each conductive ball 71 is slightly sunk in the solder paste 12 by the stress from the squeegee 59, and held in place through use of adhesive power of the solder paste 12 itself. For ensuring the conductive balls 71 to be placed one by one on each solder paste 12, the thickness of the conductive ball insertion plate 58 is set to be equal to or slightly smaller than the diameter of the conductive ball 71, to prevent a plurality of conductive balls 71 from entering one conductive ball insertion hole 58a.

Figure 10B:
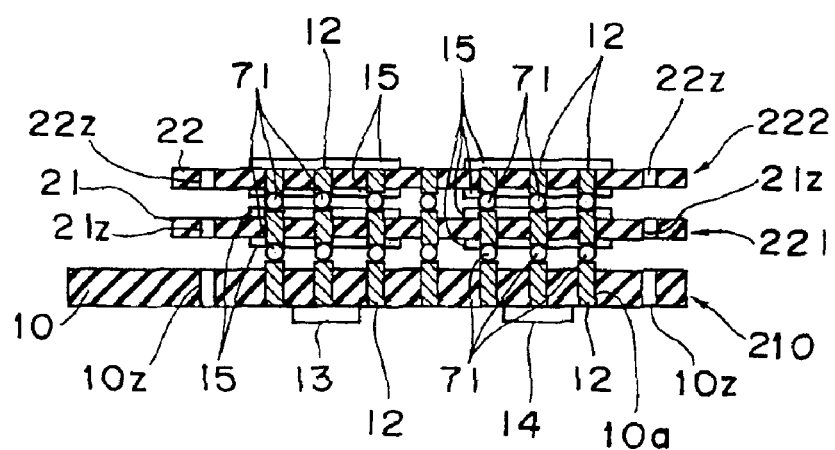

Next, as shown in FIG. 10B, with the conductive balls 71 on the electrodes of the solder pastes 12 of the first memory module 221, the second memory module 222 is mounted on the first memory module 221. More particularly, in the state that the positioning holes 10z on both ends of the base board 10, the positioning holes 21z on both ends of the first memory board 21, and the positioning holes 22z on both ends of the second memory board 22 match with each other, the second memory board 22 is laid on top of the first memory board 21 such that the solder paste 12 inside each through hole 22a of the second memory board 22 is mounted on the conductive ball 71 on each solder paste 12 of the first memory board 21, where with a certain degree of stress applied, a part of the upper portion of each conductive ball 71 is sunk in the solder paste 12 inside each through hole 22a of the second memory board 22. This positions and holds the base board 10, the first memory board 21, and the second memory board 22 in an approximately parallel relationship. It is noted that when the second memory board 22 is laid on top of the first memory board 21 and a certain degree of stress is applied, the top face of the first memory board 21 and the bottom faces of two memory chips 15 placed on the bottom face of the second memory board 22 may be bonded through use of a temporality-fixing adhesive 52. Thus, the first memory board 21 and the second memory board 22 are secured in an approximately parallel relationship with each other so as to conform the size of the entire small-size memory card to the standardized size.

Then, the module is put in a reflow furnace for reflow processing or hot winds such as hot air are applied to melt each solder paste 12, so that each solder paste 12 and each conductive ball 71 are fixed to each other in a conducting state to secure electrical connection.

Next, with an insulative sealing resin 200, there are each sealed a space between the base board 10 of the base board module 210 and the first memory board 21 of the first memory module 221, a space between the first memory board 21 of the first memory module 221 and the second memory board 22 of the second memory module 222, and a space between two memory chips 15 on the top face of the second memory board 22.

Next, these modules are housed in upper and lower cases 30 and 31 to provide the small-size memory card.

It is noted that the conductive ball 71 disposed between the base board module 210 and the first memory module 221 may be different in diameter from the conductive ball 71 disposed between the first memory module 221 and the second memory module 222 as shown in FIG. 7, or these conductive balls 71 may have the same diameter (not shown).

Although in the above process, the solder paste 12 is provided to the inside of each through hole 21a of the first memory board 21 of the first memory module 221 before the first memory module 221 is mounted on the base board module 210, the solder paste 12 may be provided to the inside of each through hole 21a of the first memory board 21 of the first memory module 221 after the first memory module 221 is mounted on the base board module 210. Similarly, although the solder paste 12 is provided to the inside of each through hole 22a of the second memory board 22 of the second memory module 222 before the second memory module 222 is mounted on the first memory module 221, the solder paste 12 may be provided to the inside of each through hole 22a of the second memory board 22 of the second memory module 222 after the second memory module 222 is mounted on the first memory module 221.

The above manufacturing method facilitates holding an inter-board space constant with use of the conductive balls 71, and facilitates securing parallelism of the respective boards.

In the second embodiment, the conductive balls 71 are not limited to the balls provided by printing as disclosed above, but the conductive balls 71 may be provided one by one or a plurality of the conductive balls 71 may be provided simultaneously by sucking.

It is understood that the present invention is not limited to the embodiments disclosed, but is applicable to various other embodiments. Description will be now given of the various embodiments.

(Third Embodiment)

Figure 11:
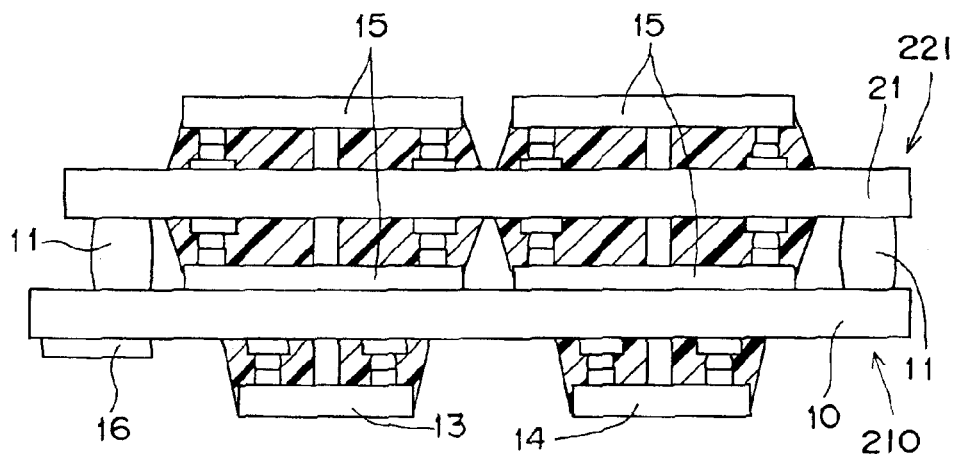
FIG. 11 is a partial cross sectional side view showing a small-size memory card according to a third embodiment of the present invention.

FIG. 11 is a partial cross sectional side view showing a small-size memory card according to a third embodiment of the present invention. Although in the first and second embodiments, the first memory module 221 and the second memory module 222 are disposed so as to be laid on top of the base board module 210, it is also possible as shown in FIG. 11 to omit the second memory module 222 and to dispose only the first memory module 221 on the base board module 210 with conductive wires 11. On both the top and bottom faces of the first memory board 21 of the first memory module 221, there are mounted two memory chips 15 each, and the bottom faces of the two memory chips 15 placed on the bottom face of the first memory board 21 are brought in contact with the top face of the base board 10. However, it is also acceptable to form a space between the bottom faces of the two memory chips 15 placed on the bottom face of the first memory board 21 and the top face of the base board 10 (not illustrated). Also, solders or conductive balls may be used instead of the conductive wires 11 (not illustrated).

Such a constitution makes it possible to dispose a memory chip 15 with high capacity in a space smaller than the small-size memory card shown in FIG. 1 or 7, compared to the constitution of mounting a memory chip only on the top face of the base board 10.

(Fourth Embodiment)

Figure 12:
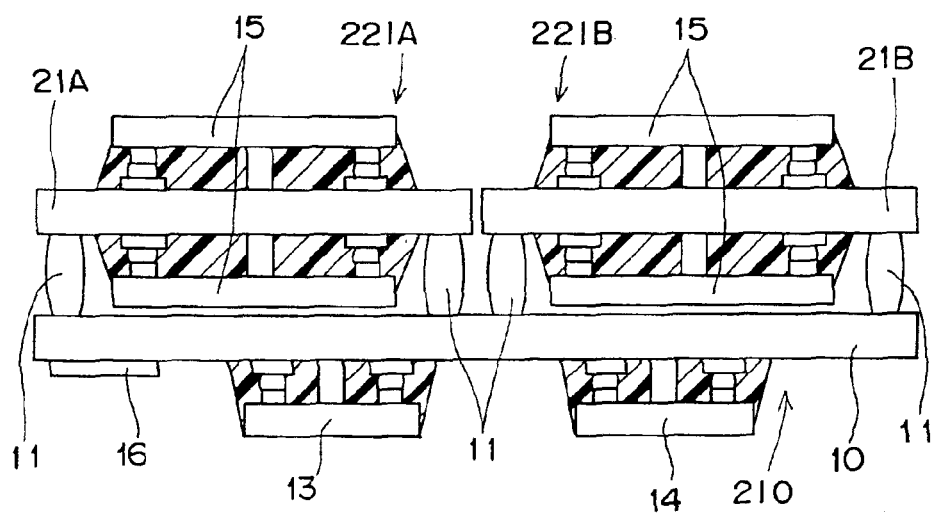
FIG. 12 is a partial cross sectional side view showing a small-size memory card according to a fourth embodiment of the present invention.

FIG. 12 shows a small-size memory card of FIG. 11 with the first memory module 221 divided into two parts according to a fourth embodiment of the present invention. More particularly, a divided first memory module 221A and a divided first memory module 221B are individually mounted on the base board module 210 via conductive wires 11. The divided first memory module 221A and the divided first memory module 221B are each composed of one memory chip 15 mounted on each of both the top and bottom faces of divided first memory boards 21A and 21B whose size is half the first memory board 21 or smaller.

According to such constitution, the degree of freedom may be provided in disposing the divided first memory module 221A and the divided first memory module 221B on the base board module 210. Also, if one memory chip 15 is determined to be defective during the burn-in process of memory modules with the memory chips 15 mounted, the remaining three normal memories will be abandoned in the case of the first memory module 221, whereas in the case of the divided first memory module 221A or 221B, the remaining one memory chip 15 is abandoned, thereby enabling more efficient usage of the memory chip 15.

(Fifth Embodiment)

Figure 13:
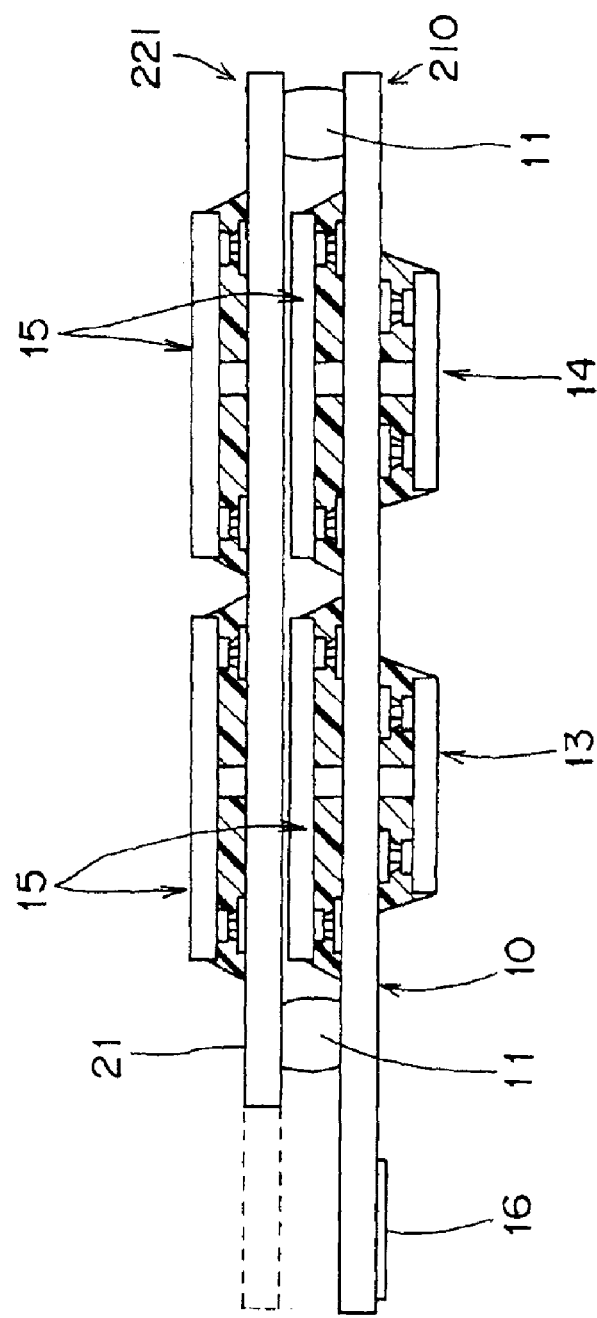
FIG. 13 is a partial cross sectional side view showing a small-size memory card according to a fifth embodiment of the present invention.

FIG. 13 shows a part of a small-size memory card according to a fifth embodiment of the present invention, in which in the small-size memory card of FIG. 11, a memory chip 15 is not mounted on each of both the top and bottom faces of the first memory module 221, but two memory chips 15 are mounted on the top face of the first memory board 21 of the first memory module 221 but no memory chip 15 is mounted on the bottom face thereof, instead of which two memory chips 15 are mounted on the top face of the base board 10 that confronts the bottom face of the first memory board 21.

(Sixth Embodiment)

Figure 14:
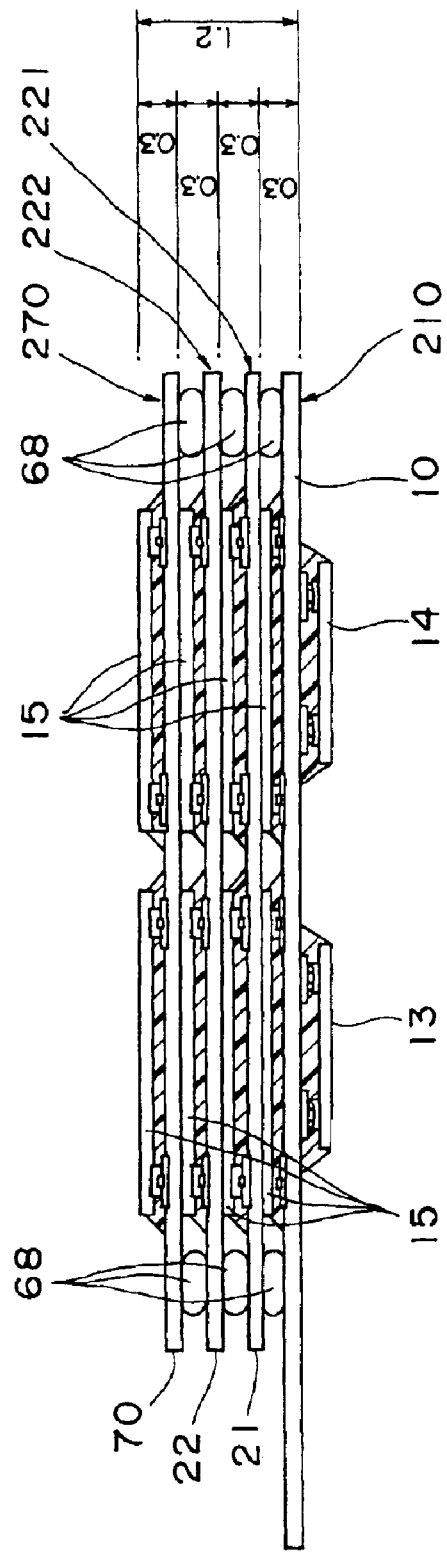
FIG. 14 is a partial cross sectional side view showing a small-size memory card according to a sixth embodiment of the present invention.

FIG. 14 shows a part of a small-size memory card according to a sixth embodiment of the present invention, in which in the small-size memory card of FIG. 13, as with the first memory module 221, two memory chips 15 are mounted only on the top face of the second memory board 22 of the second memory module 222 to be mounted on the first memory module 221, but no memory chip is mounted on the bottom face thereof, and further a third memory module 270 is mounted on top of the second memory module 222. In the third memory module 270, as with the first memory module 221, two memory chips 15 are mounted only on the top face of a third memory board 70, but no memory chip is mounted on the bottom face thereof.

Preferably, the central positions of the memory chips 15 of the first memory module 221, the second memory module 222, and the third memory module 270, and further the central positions of the IC chips 13 and 14 of the base board module 210 are matched, so that as an assembled small-size memory card, components such as memories may be mounted almost symmetrically with respect to the center of the lengthwise direction of the memory boards, which enables the center of the lengthwise direction of the memory boards to resist mechanical stress and thermal stress in good balance, thereby preventing each memory board having a low thickness compared to the base board from curving.

(Seventh Embodiment)

Figure 15:
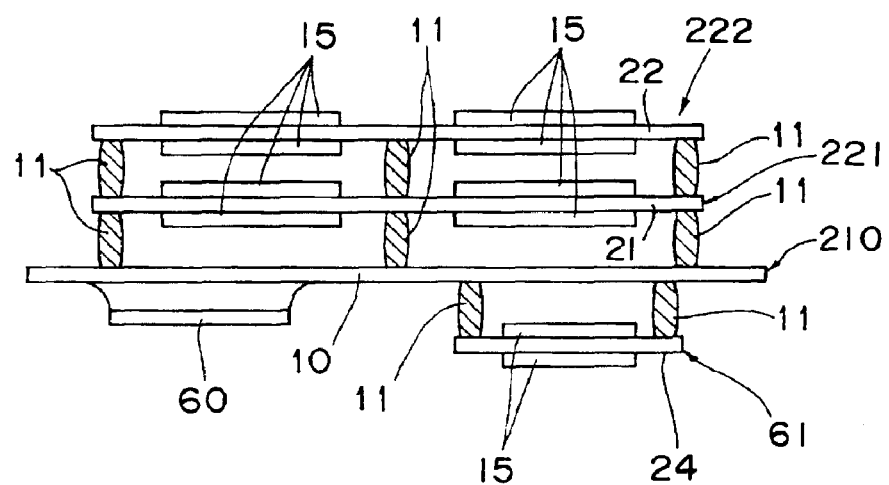
FIG. 15 is a partial cross sectional side view showing a small-size memory card according to a seventh embodiment of the present invention.

FIG. 15 shows a part of a small-size memory card according to a seventh embodiment of the present invention, in which in the small-size memory card of FIGS. 1 and 7, functions of two IC chips: a microprocessor IC chip 14 and an ASIC IC chip 13 are incorporated in one IC chip 60 so as to be applied to a one-chip microcomputer, and an additional memory module 61 is further disposed in a vacant space on the bottom face of the base board 10 without an IC chip mounted thereon. In the additional memory module 61, a memory chip 15 is mounted on the both top and bottom faces of a fourth memory board 24, and the fourth memory board 24 itself is mounted on the base board 10 through use of conductive wires 11 and the like. This implements further increase of memory capacity.

(Eighth Embodiment)

Figure 16:
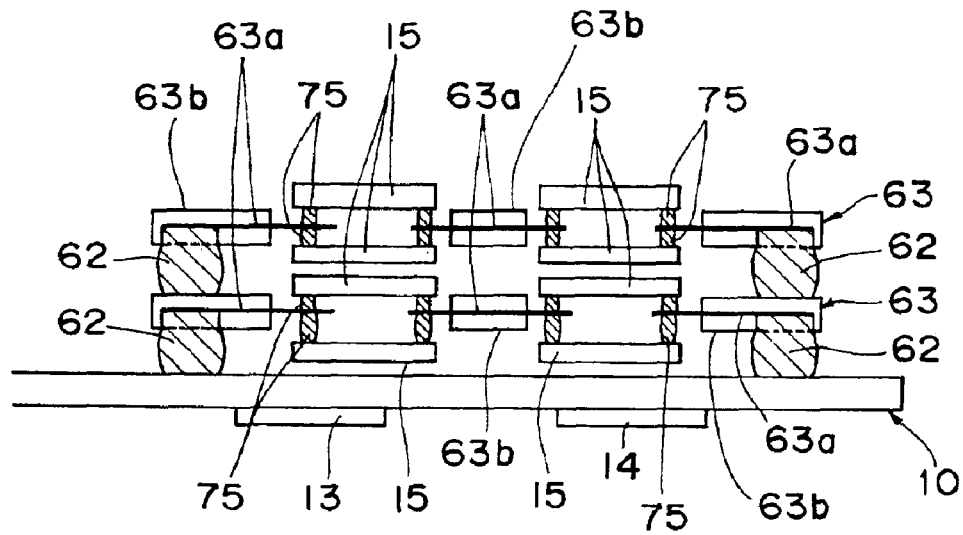
FIG. 16 is a partial cross sectional side view showing a small-size memory card according to an eighth embodiment of the present invention.

FIG. 16 shows a part of a small-size memory card according to an eighth embodiment of the present invention, in which a memory board is not composed of a single layer or laminated layers, but of a thinner film board. More particularly, the memory board is composed of a square frame shaped film board 63, in which lead terminals 63a are disposed inside a frame portion 63b of an insulator resin, and electrodes of a memory chip 15 are directly mounted on both the top and bottom faces of the lead terminals 63a with solders 75. The space between the film boards 63 is secured by pillar-shaped conductors 62 such as solders. Of course, instead of the pillar-shaped conductors 62 such as solders, conductive balls or wires may be used (not illustrated). Thus, it is possible to mount the memory chip 15 directly on each of both the faces of the film board 63, which contributes to providing a smaller and thinner memory card. Also, it is not necessary to connect the memory chip 15 to the base board 10 or the like by extending the leads to the outside of the memory chip 15 by large amounts, which makes it possible to provide a further smaller memory card.

(Ninth Embodiment)

Figure 17:
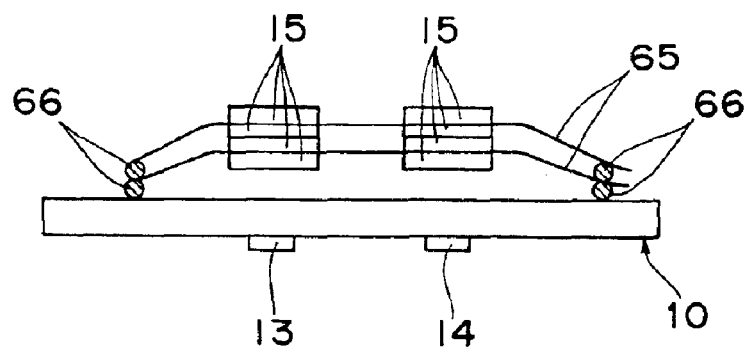
FIG. 17 is a partial cross sectional side view showing a small-size memory card according to a ninth embodiment of the present invention.

FIG. 17 shows a part of a small-size memory card according to a ninth embodiment of the present invention, in which two film boards 65 and 65 are used instead of the first and second memory boards 21 and 22, enabling implementation of a thinner small-size memory card. Reference numeral 66 denotes a conductor such as a solder and a copper ball that establishes electrical connection between the film boards 65 and 65, and between the film boards 65 and 65 and the base board 10.

(Tenth Embodiment)

Figure 18:
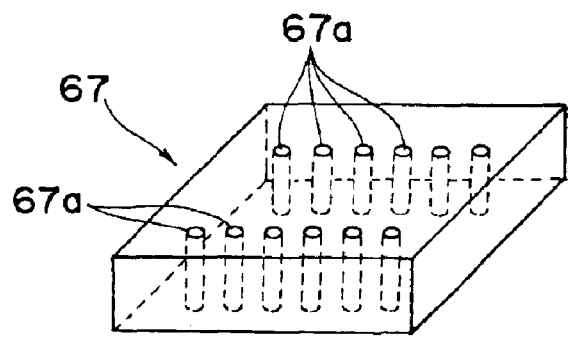
FIG. 18 is a partial cross sectional side view showing a small-size memory card according to a tenth embodiment of the present invention.

FIG. 18 shows a part of a small-size memory card according to a tenth embodiment of the present invention, in which a conductive sheet 67 having a number of conductive pins 67a such as gold wires disposed inside an insulative synthetic resin sheet is disposed between electrodes of the memory boards 21 and 22, or between electrodes of the memory board 21 and electrodes of the base board 10, and is used both for establishing electrical connection and for holding a space between the boards.

Also, instead of the conductive pin 67a, a conductive paste may be used. Further, an anisotropic conductive sheet having conductive particles disposed in an insulative resin sheet may be used in place of the conductive sheet 67.

(Eleventh Embodiment)

Figure 19:
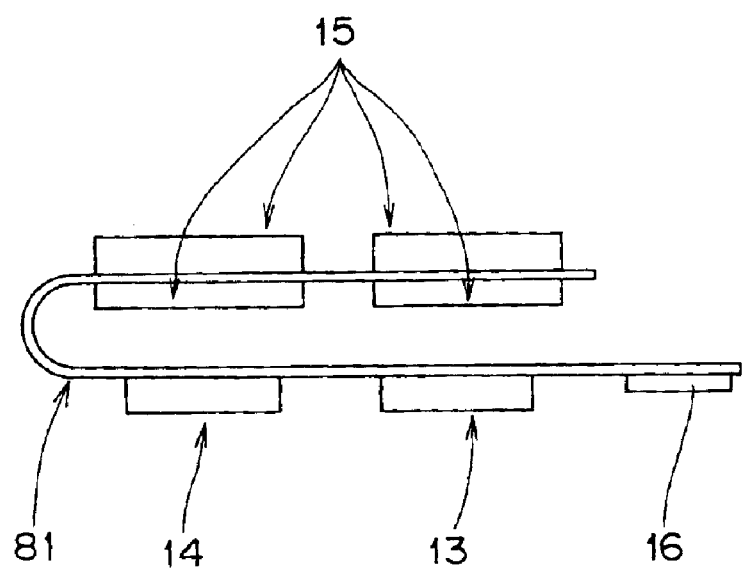
FIG. 19 is a partial cross sectional side view showing a small-size memory card according to an eleventh embodiment of the present invention.

FIG. 19 shows a part of a small-size memory card according to an eleventh embodiment of the present invention, in which the base board 10 and the first memory board 21 are not composed of individual boards, but composed of one long flexible board 81. More particularly, two memory chips 15 are each mounted on both the faces of a first end portion of the long flexible board 81, while two IC chips, i.e., a micro processor IC chip 14 and an ASIC IC chip 13, are mounted on one face of the second end portion, after which the flexible board 81 is bent in a U-shape and housed in a case as shown in FIG. 19.

In this example, the first memory board 21 and the base board 10 can make a flexible board 81, which contributes to making the small-size memory card thinner and lighter. At the same time, such a one-board constitution eliminates a process of connecting a plurality of boards to each other. Further, it is also acceptable to make the flexible board 81 longer and to mount the memory chip 15 further thereon, so that the flexible board 81 also serves as the second memory board 22.

(Twelfth Embodiment)

Figure 20:
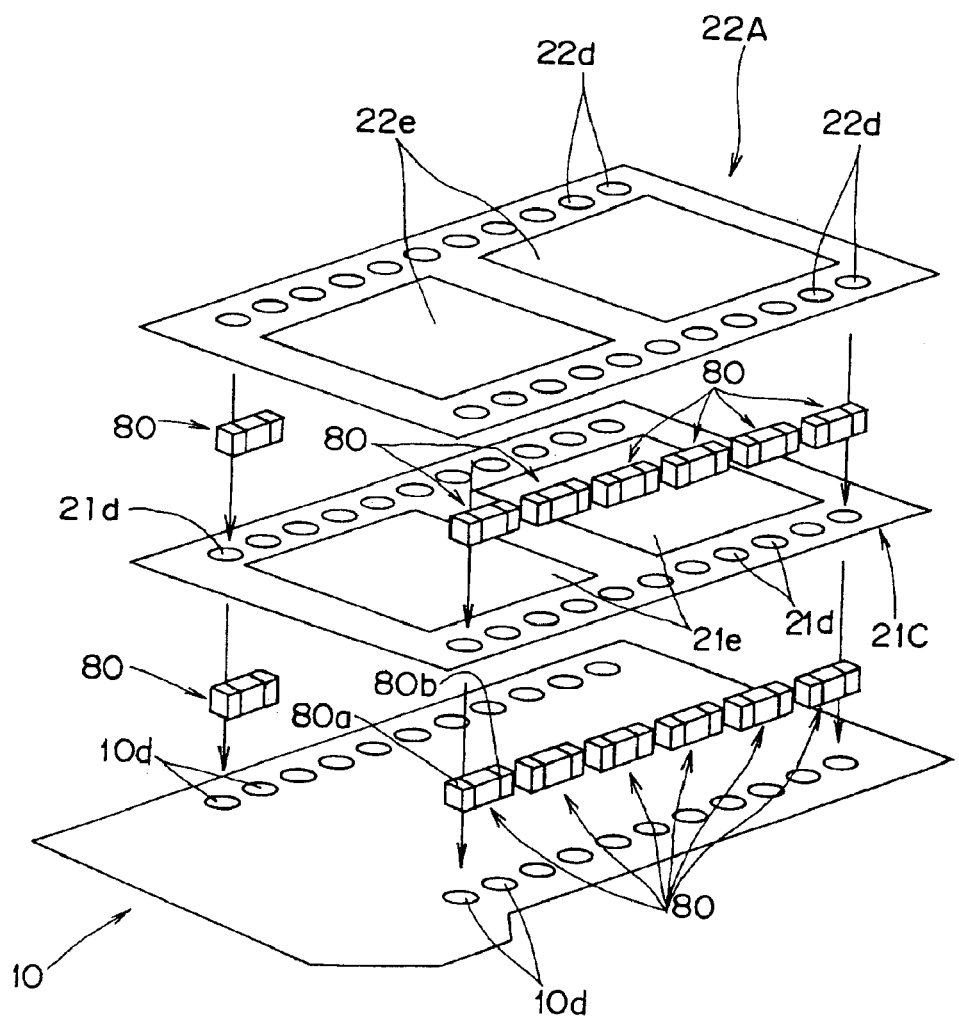
FIG. 20 is a partial cross sectional side view showing a small-size memory card according to a twelfth embodiment of the present invention.

FIG. 20 shows a part of a small-size memory card according to a twelfth embodiment of the present invention, in which rectangular parallelepiped electronic components are used instead of conductive wires or conductive balls. More particularly, passive components in which electrodes 80a and 80b are electrically connected to each other, more particularly, a rectangular parallelepiped chip electronic components 80 such as capacitors and chip resistors, are interposed at top and bottom faces of each edge portion of each board between electrodes of the base board 10 and electrodes of the first memory board 21, between electrodes of the first memory board 21 and electrodes of the second memory board 22, or between both of them, for securing a space between the base board 10 and the first memory board 21, a space between the first memory board 21 and the second memory board 22, or the both spaces, through use of thicknesses of the rectangular parallelepiped chip electronic components 80. At the same time, the electrodes of the base board 10 and the electrodes of the first memory board 21; or the electrodes of the first memory board 21 and the electrodes of the second memory board 22; or the electrode 10d of the base board 10, the electrodes 21d of the first memory board 21, and the electrodes 22d of the second memory board 22 are connected to the electrodes 80a or 80b on top and bottom faces of at least first end portions of the rectangular parallelepiped chip electronic components 80. In each of the end portions of the rectangular parallelepiped chip electronic components 80, there are formed the electrodes 80a and 80b that are continuously disposed on top and bottom faces as well as over 4 faces on both lateral sides. The electrodes 80a and 80b on top and bottom faces are usually electrically connected to each other, so that these electrodes may be used in place of the conductive wires 11 or the conductive balls 71. It is noted that in FIG. 20, reference numerals 21e and 22e denote predetermined areas for mounting memory chips.

It is noted that in the case where chip capacitors and chip resistors 80 are used for their original functions, the electrodes 80a and 80b on both the end portions are connected to the electrodes of the base board 10 and the electrodes of the first memory board 21, or the electrodes of the first memory board 21 and the electrode of the second memory board 22, respectively. In the case where the chip capacitors and the chip resistors 80 are not used for their original functions, the electrodes 80a or 80b on their first end portions are connected to the electrodes of the base board 10 and the electrodes of the first memory board 21, or the electrodes of the first memory board 21 and the electrodes of the second memory board 22, respectively.

(Thirteenth and Fourteenth Embodiments)

Figure 21:
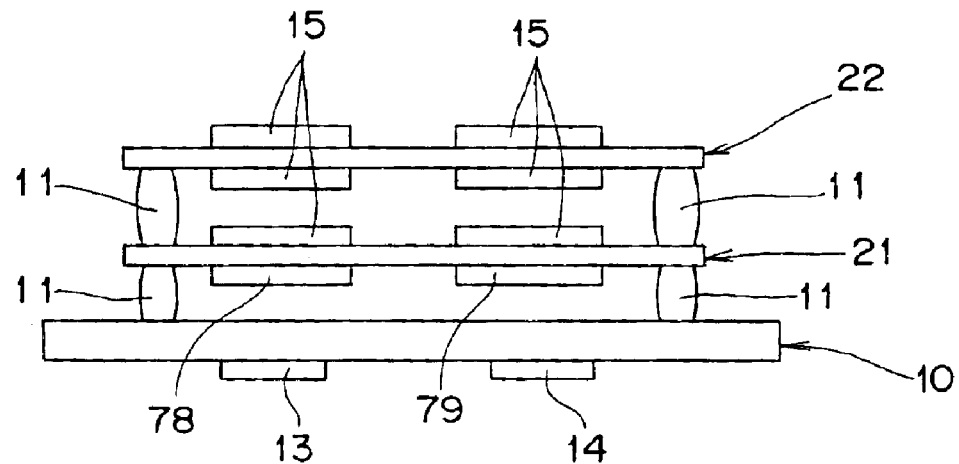
FIG. 21 is a partial cross sectional side view showing a small-size memory card according to a thirteenth embodiment of the present invention.
Figure 22:
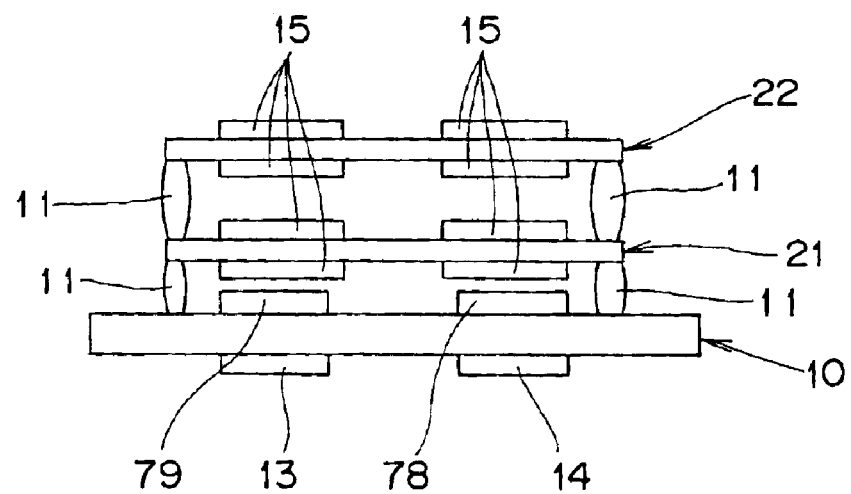
FIG. 22 is a partial cross sectional side view showing a small-size memory card according to a fourteenth embodiment of the present invention.

FIGS. 21 and 22 show a part of a small-size memory card according to thirteenth and fourteenth embodiments of the present invention, in which an embodiment providing not only a function of the recording media but also other functions in addition to the function of the recording media is exemplified by a multifunctional small-size memory card supporting Bluetooth technology. In FIG. 21, an RF LSI chip 78 and a baseband LSI chip 79 are mounted in place of a memory on the bottom face side of the first memory board 21, for enabling wireless communication. In FIG. 22, an RF LSI chip 78 and a baseband LSI chip 79 are mounted on the top face of the base board 10 of the small-size memory card of FIG. 1 for enabling wireless communication. For example, by inserting a multifunctional memory card supporting the Bluetooth technology to portable devices such as portable telephone devices, the portable telephone devices may be used as download terminals. As a result, through wireless communication with a transfer distance of 10 m, music and images become downloadable to the portable telephone devices. In addition, between the portable devices each with the multifunctional memory card supporting the Bluetooth technology inserted (such as music players and digital still cameras), transfer of music and image data from one portable device to another portable device becomes possible. The term "Bluetooth" is used herein to refer to a wireless data communication technology for exchanging image and sound data by connecting mobile terminals such as portable telephone devices, personal computers, digital cameras, and household electric appliances including AV (Audio Visual) equipment, as well as game machines, by air.

(Fifteenth Embodiment)

Figure 26:
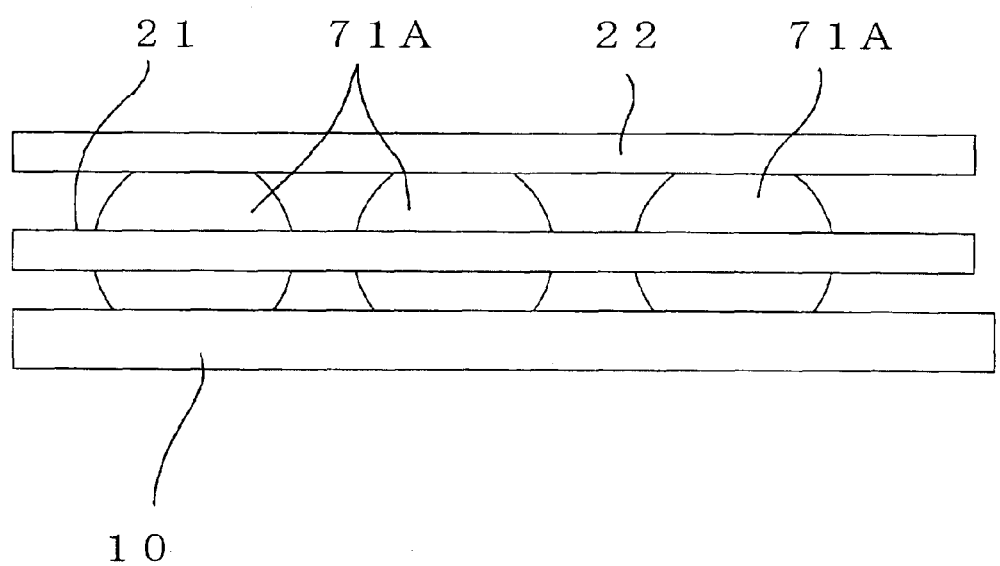
FIG. 26 is a schematic side view showing a small-size memory card according to a fifteenth embodiment of the present invention.

FIG. 26 is a schematic side view showing a small-size memory card according to a fifteenth embodiment of the present invention. In this embodiment, the conductive balls 71 are not disposed between the base board 10 and the first memory board 21, nor between the first memory board 21 and the second memory board 22 like FIG. 7, but with use of conductive balls 71A penetrating the first memory board 21, the space between the base board 10 and the second memory board 22 is secured. More particularly, in the thickness direction of the base board 10, only one conductive ball 71A is disposed between the base board 10 and the first memory board 21. More specifically, each conductive ball 71A having a diameter of, for example, about 0.7 μm is set to pass through a solder paste 12 inside each through hole 21a of the first memory board 21, so that the upper portion of each conductive ball 71A is electrically joined to the solder paste 12 inside each through hole 22a of the second memory board 22, while at the same time the lower portion of each conductive ball 71A is electrically joined to the solder paste 12 inside each through hole 10a of the base board 10. This makes it possible to reduce the number of the conductive balls to half as many as the number shown in the embodiment of FIG. 7.

(Sixteenth Embodiment)

Figure 27:
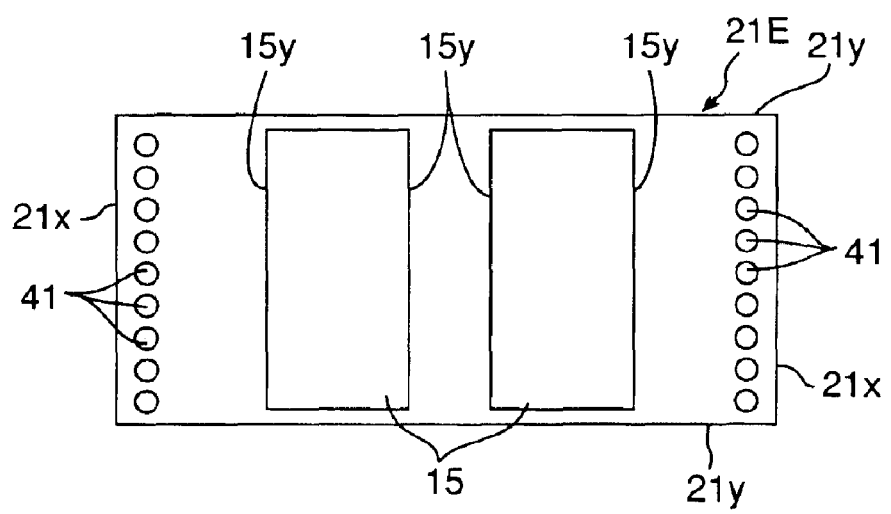
FIG. 27 is a schematic side view showing a small-size memory card with a case removed according to a sixteenth embodiment of the present invention.
Figure 61:
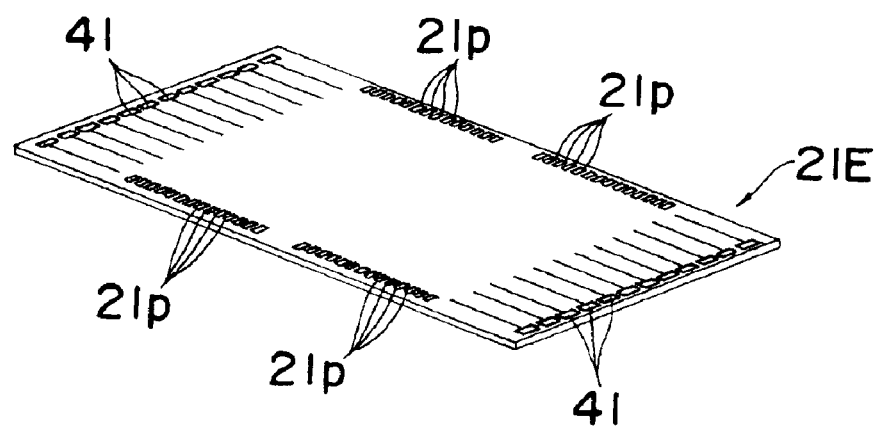
FIG. 61 is a perspective view showing a rectangular memory board for the rectangular small-size memory card of the sixteenth embodiment.
Figure 62:
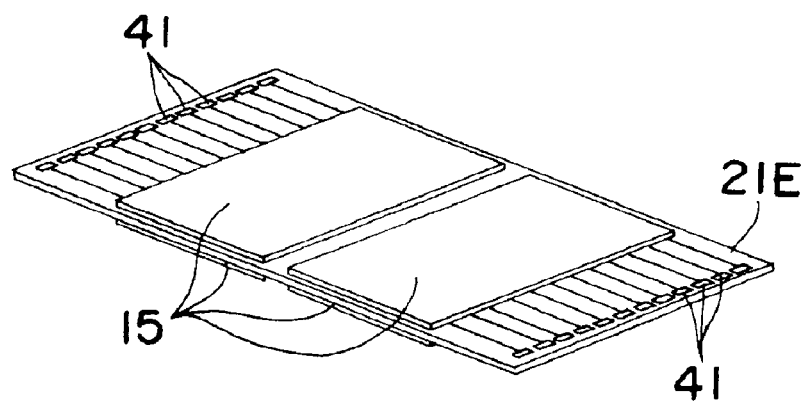
FIG. 62 is a perspective view showing two rectangular memory chips mounted on the memory board of FIG. 61.
Figure 86:
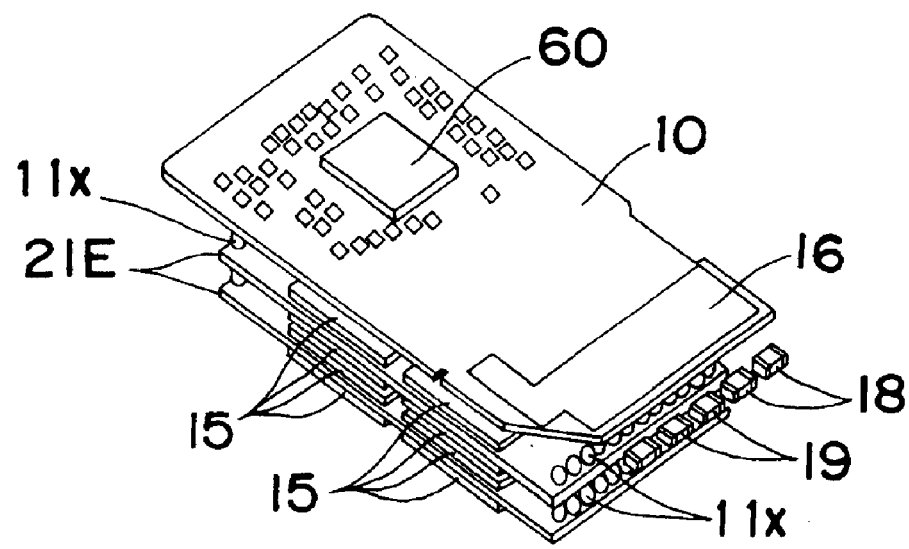
FIG. 86 is an exploded perspective view showing the small-size memory card with a case removed according to the sixteenth embodiment of the present invention.
Figure 87:
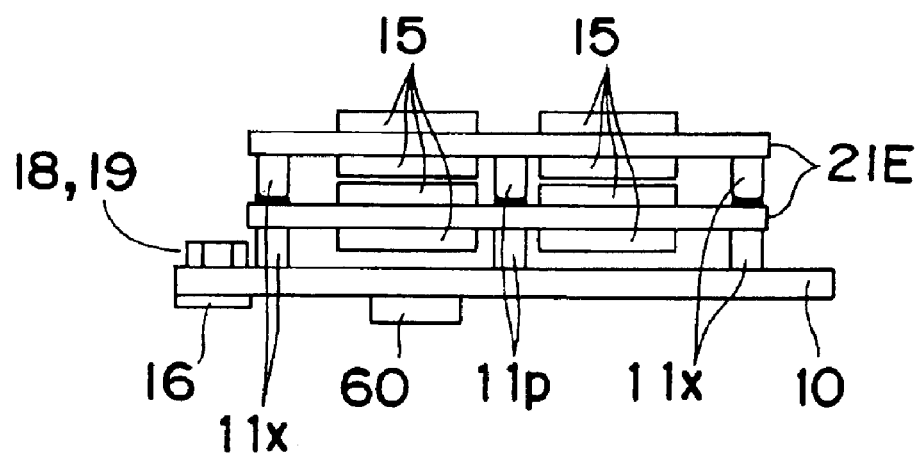
FIG. 87 is a side view showing the small-size memory card of FIG. 86 with a case removed.

FIG. 27 is a plane view showing a small-size memory card with a case removed according to a sixteenth embodiment of the present invention. FIG. 61 and FIG. 62 are respectively a perspective view showing a rectangular memory board for the rectangular small-size memory card and a perspective view showing two rectangular memory chips mounted on the memory board. FIG. 86 and FIG. 87 are, respectively, an exploded perspective view and a side view showing the small-size memory card with a case removed composed of two-layer memory boards with two rectangular memory chips mounted thereon.

As shown in FIG. 27, FIG. 61, and FIG. 62, memory chips 15 are mounted on a memory board 21E so that a short side 21x of the rectangular memory board 21E for the rectangular small-size memory card is approximately parallel to long sides 15y of the rectangular memory chips 15. More specifically, the memory chips 15 are mounted on the memory board 21E so that the longitudinal direction of the memory board 21E and the longitudinal direction of the memory chips 15 intersect with, e.g., are perpendicular to, each other. Inside each of a pair of facing short sides 21x, 21x of the memory board 21E, there are disposed along the short side a line of junction electrodes 41, ..., 41, which are to be joined to electrodes 10d, ..., 10d of other memory boards 21E or the base board 10 disposed in positions corresponding to the junction electrodes 41, ..., 41.

Figure 28:
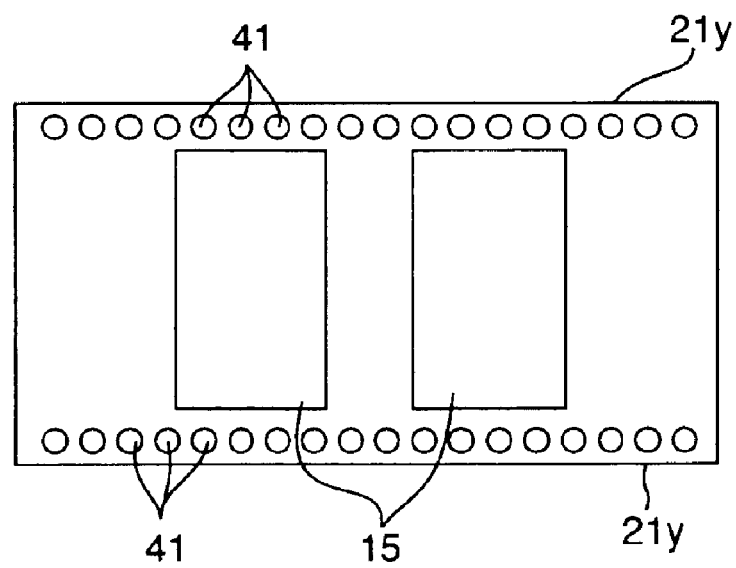
FIG. 28 is a schematic plan view showing a comparative example having electrodes disposed along the long sides of a memory board.

Thus, the electrodes 41, ..., 41 are disposed only along the short side of the rectangular memory board 21, and no electrode is disposed along the long side. Consequently, even if stress caused by torsion that acts upon the rectangular small-size memory card and the like affects the long sides 21y, 21y of the rectangular memory board 21, the electrodes 41, ..., 41 are not disposed along the long side 21y as shown in FIG. 28, so that generation of conduction failure and connection failure is prevented, and further improvement of reliability is achieved.

Figure 29A:
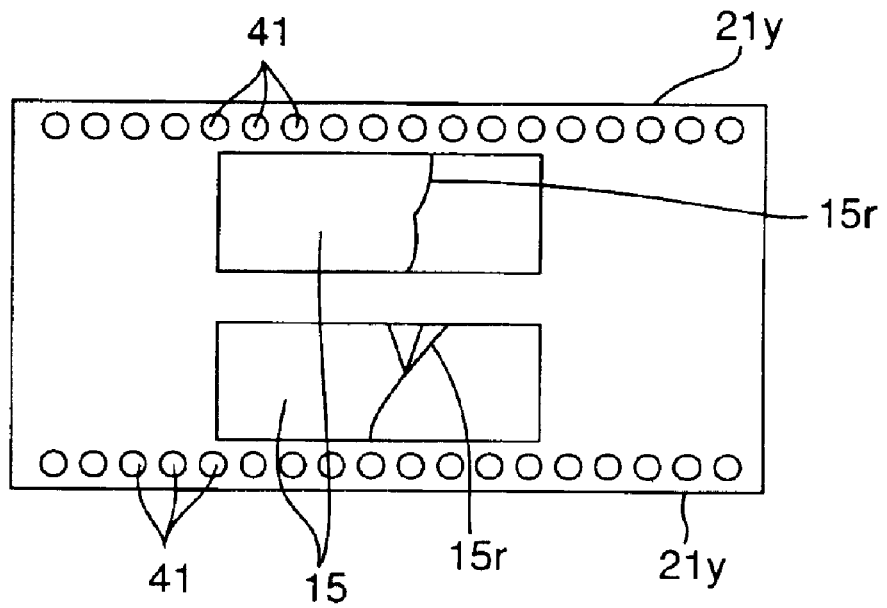
FIGS. 29A and 29B are views showing a comparative example in which the longitudinal directions of memory chips are disposed along the long sides of a memory board, one of which is a schematic plane view showing the state in which breakage is generated on the memory chips, and the other of which is a schematic side view showing the state in which stress concentrated onto a solder joint portion for joining an electrode of the memory chip and the electrode of the memory board generates cracks.
Figure 29B:
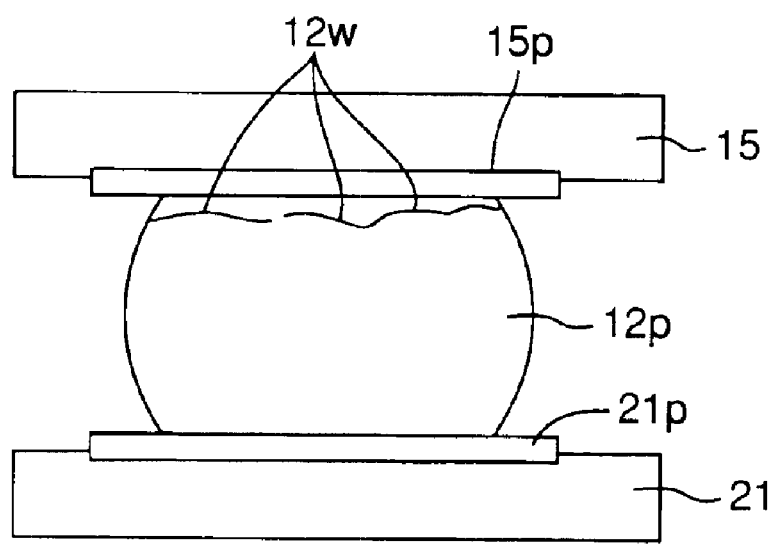

If the memory board 21 on which the memory chips 15, ..., 15 are mounted has insufficient bending or torsional strength as shown in FIG. 29A, stress concentrates upon a solder junction portion 12p for joining an electrode 15p of the memory chip 15 and an electrode 21p of the memory board 21 and then generates a crack 12w, as a result of which the junction between the electrodes 15p and 21p becomes open, causing electric connection failure as shown in FIG. 29B. Also, as shown in FIG. 29A, breakages 15r are generated in the memory chip 15, which cause operation failure, particularly partial read failure or write failure of the memory chip 15.

Accordingly, for the memory board 21 of the sixteenth embodiment that is composed of the electrodes 41, ..., 41 disposed only along the short (lateral) sides of the rectangular memory board 21, a bending test and a torsional test for checking the presence of the above-stated failures are carried out.

Figure 30:
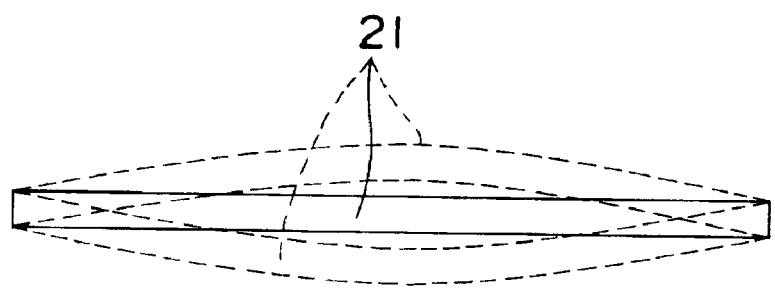
FIG. 30 is an explanatory view showing a bending test.
Figure 31:
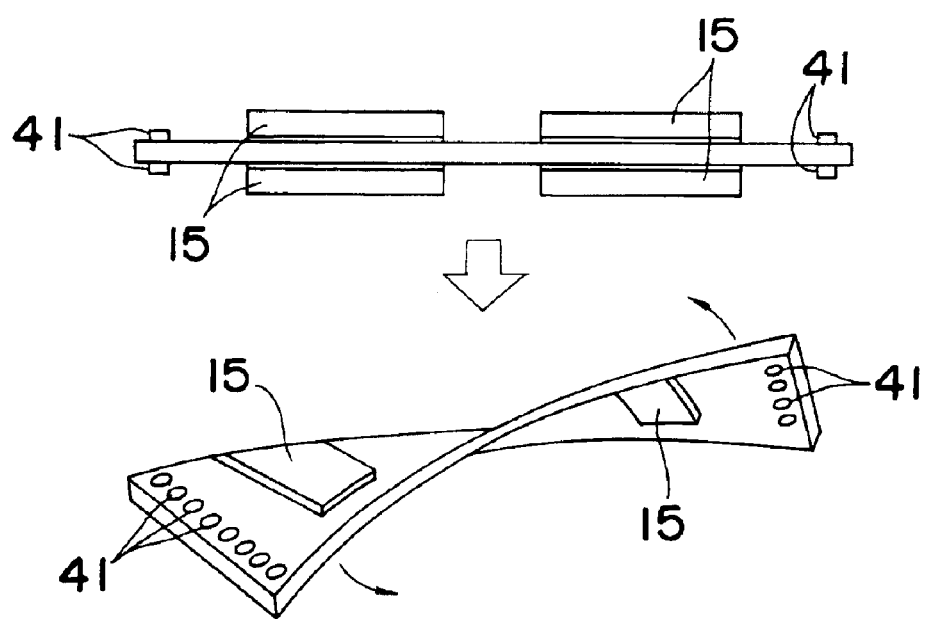
FIG. 31 is an explanatory view showing a torsion test.

The bending test is conducted, as shown in FIG. 30, such that the edge portions of both short sides of the memory board 21 with the memory chips 15, ..., 15 being mounted thereon are secured and 2kg external forces are applied three times for 60 seconds upon, for example, the centers of the short side edge portions in directions that approximate the longitudinal direction of the memory chip to each other, so that the memory board 21 is bent. Also, the torsional test is conducted, as shown in FIG. 31, such that the edge portion of one short side of the memory board 21 with the memory chips 15, ..., 15 being mounted thereon is secured, and the edge portion of the other short side is twisted three times against the edge portion of the one short side with 3kg external force. Results of both tests are determined based on the state of electric connection, the state of data write and read, and the state of externals.

The results of the bending test and the torsional test indicate that the memory board 21 composed of the electrodes 41, ..., 41 disposed only along the short sides 21x of the rectangular memory board 21 does not suffer generation of cracks caused by stress concentrated upon the solder junction portions that join the electrodes of the memory chips 15, ..., 15 and the electrodes of the memory board 21, which makes it possible to reliably maintain the interelectrode junctions as well as the electric connection. Further, the cracks are not generated in the memory chips 15, ..., 15, which prevents operation failure, particularly partial read failure and write failure of the memory chips 15, ..., 15.

Figure 32:
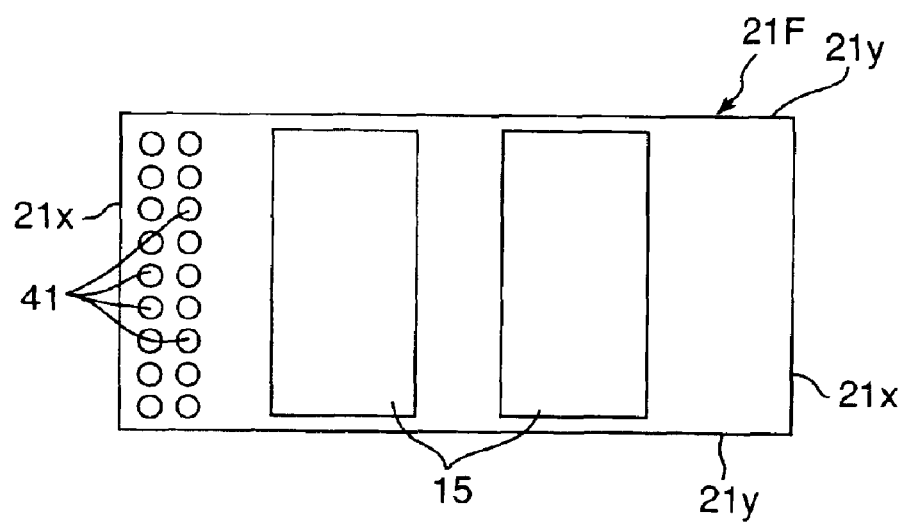
FIG. 32 is a schematic plan view showing the memory board of a modified example of the sixteenth embodiment.

As a modified example of the sixteenth embodiment as shown in FIG. 32, inside of only one short side 21x out of a pair of facing short sides 21x, 21x of a memory board 21F, there may be disposed two lines of junction electrodes 41, ..., 41 along the short side 21x, which are to be joined to other memory boards 21 and the base board 10.

Figure 33:
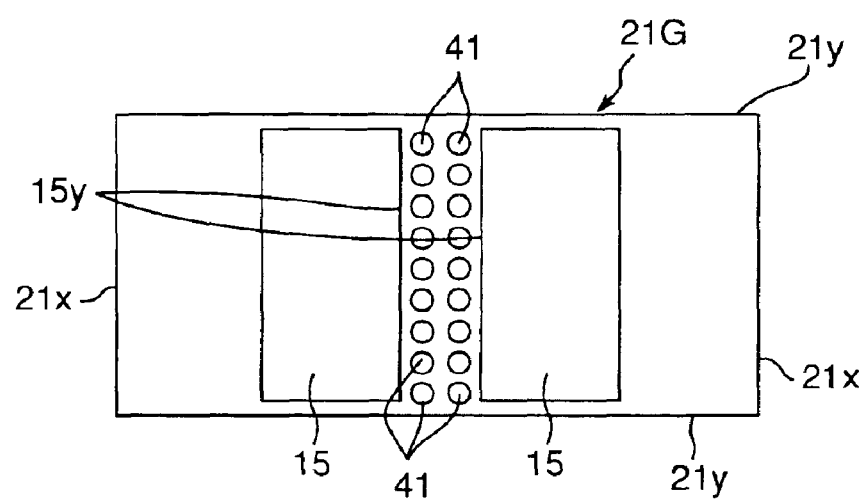
FIG. 33 is a schematic plan view showing the memory board of another modified example of the sixteenth embodiment.

Also, as another modified example of the sixteenth embodiment as shown in FIG. 33, approximately parallel to the short side 21x of a memory board 21G and in the vicinity of the center of the long side 21y, there may be disposed two lines of junction electrodes 41, ..., 41, which are to be joined to other memory boards 21 and the base board 10.

According to the above constitution, when two memory chips 15, 15 are disposed on one memory board 21, there are disposed, in the vicinity of the long sides 15y, 15y of the two memory chips 15, 15 that are adjacent to each other, electrodes 41, ... 41 along the long side 15y, which approximately aligns the lengths of the interconnect lines to corresponding electrodes 41, ..., 41 of the two memory chips 15, 15. Further, the lengths of the interconnect lines from the memory board 21 to a control IC of the base board 10 for connecting the two memory chips 15, 15 to a control IC of the base board 10 such as a microprocessor IC chip 14, an ASIC IC chip 13, or an IC chip 60 that is a one-chip type microprocessor integrating two IC chip functions of the microprocessor IC chip 14 and the ASIC IC chip 13 is approximately aligned. As a result, it becomes possible to make a response speed of the two memory chips 15, 15 approximately identical. It is noted that a description is herein given of the case where two memory chips 15, 15 are mounted on one face of the memory board for simplifying the explanation. However, the same working effects may be brought about in the case where two memory chips 15, 15 are mounted on each of the both front and back faces of the memory board 21. In such a case, it becomes possible to make a response speed of four memory chips 15, ..., 15 approximately identical.

It is noted that in the modified example of the sixteenth embodiment as well as in the following embodiments, description is and will be given of the case where two memory chips 15, 15 are mounted on each of both the front and back faces of the memory board 21. However, the present invention is not limited thereto, and so the two memory chips 15, 15 may be mounted on either one of these faces or one memory chip 15 may be mounted on either one of these faces.

(Seventeenth Embodiment)

Figure 34:
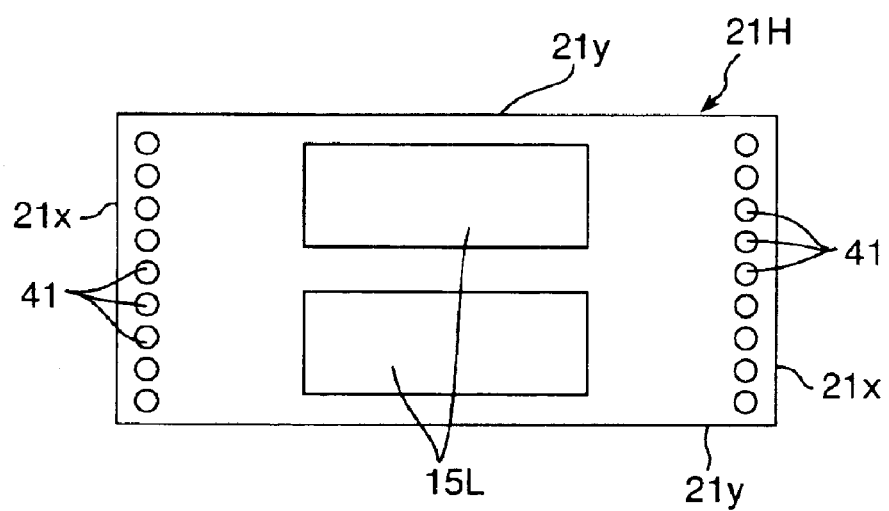
FIG. 34 is a schematic side view showing the upper-side memory board of a small-size memory card according to a seventeenth embodiment of the present invention.
Figure 35:
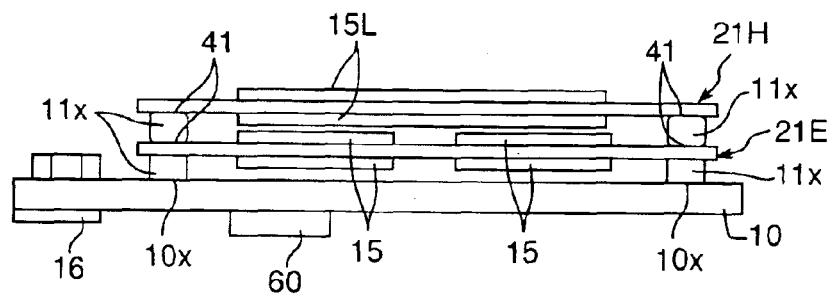
FIG. 35 is a schematic side view showing the small-size memory card with a case removed according to the seventeenth embodiment of the present invention.

FIG. 34 and FIG. 35 are respectively a schematic side view showing the upper side memory board of a small-size memory card according to a seventeenth embodiment of the present invention and a schematic side view showing the small-size memory card with a case removed.

As the lower side memory board 21 of the small-size memory card according to the seventeenth embodiment of the present invention, a memory board 21E of the sixteenth embodiment shown in FIG. 27 is used. More particularly, memory chips 15 are mounted on the memory board 21E such that the short sides 21x of the rectangular memory board 21E for a rectangular small-size memory card become approximately parallel to the long sides 15y of a rectangular memory chip 15.

As the upper side memory board 21 of the small-size memory card, memory chips 15, . . . , 15 are mounted on a memory board 21H such that the short sides 21x of the rectangular memory board 21H are approximately parallel to the short sides 15x of rectangular memory chips 15L as shown in FIG. 34.

Along a pair of facing short sides 21x, 21x of these two memory boards 21E, 21H, there are disposed a line of junction electrodes 41, . . . , 41. As shown in FIG. 35, the memory board 21E of FIG. 27 is mounted on the base board 10, and further thereon the memory board 21H of FIG. 34 is mounted, by which the laminated structure shown in FIG. 33 is obtained. Here, the electrodes 41, . . . , 41 of each of the upper-side memory board 21H and the lower-side memory board 21E are connected to the electrodes 41, . . . , 41 disposed in the vicinity of and along the respectively facing long sides with solder portions 11x, . . . , 11x exemplifying conductors that provide an electric connection. Also, the electrodes 41, . . . , 41 of the lower-side memory board 21E and the electrodes 10x, . . . , 10x of the base board 10 are connected to the electrodes 41, . . . , 41 disposed in the vicinity of and along the respectively facing long sides with solder portions 11x, . . . , 11x exemplifying conductors that provide electric connection.

In such constitution, the longitudinal directions of the memory chips 15, . . . , 15 mounted on each of two memory boards 21E, 21H laminated on the base board 10 are crossed. Consequently, when bending stress or torsional stress acts upon the small-size memory card, the mechanical strength, as well as the bending and torsional strength of the entire small-size memory card, may be further increased compared to a small-size memory card having the memory chips 15, . . . , 15 disposed in the same direction.

(Eighteenth Embodiment)

Figure 36:
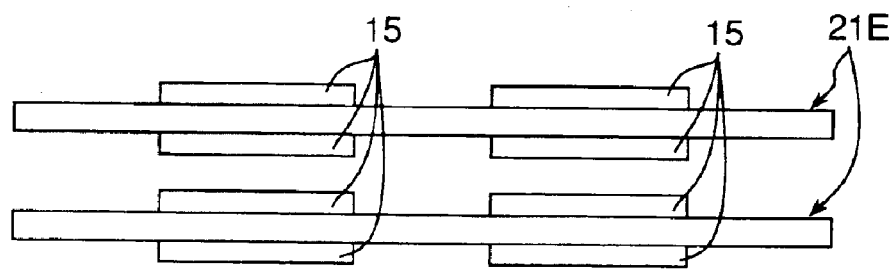
FIG. 36 is a schematic side view showing lower-side two-layer memory boards of a small-size memory card with a case removed according to an eighteenth embodiment of the present invention.
Figure 37:
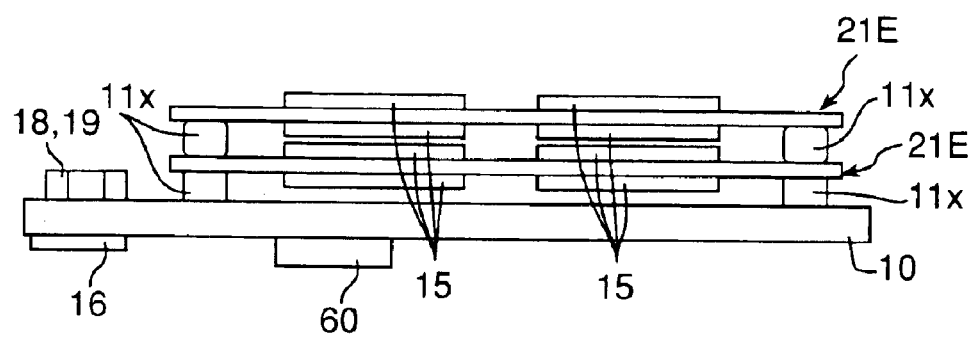
FIG. 37 is a schematic side view showing the lower-side twolayer memory boards of the small-size memory card with a case removed in the state of being mounted on the base board according to the eighteenth embodiment of the present invention.
Figure 38:
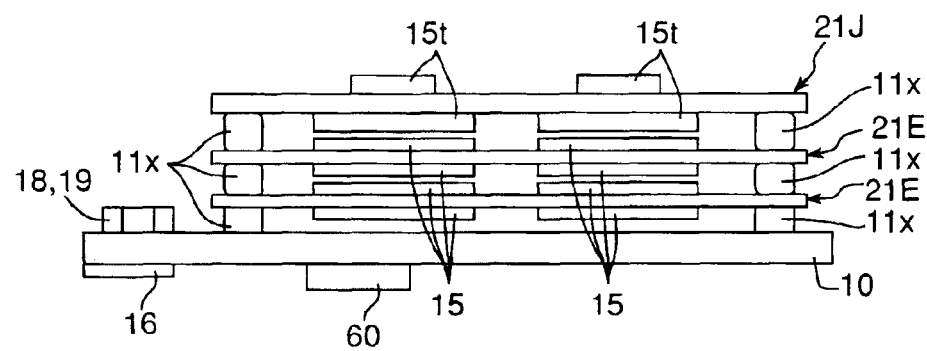
FIG. 38 is a schematic side view showing the small-size memory card with a case removed in the state where a lowermost-layer memory board is further mounted on the lower-side two-layer memory boards mounted on the base board according to the eighteenth embodiment of the present invention.

FIG. 36, FIG. 37 and FIG. 38 are, respectively, a schematic side view showing lower-side two-layer memory boards 21E, 21E, a schematic side view showing the lower-side two-layer memory boards in the state of being mounted on the base board 10, and a schematic side view showing the state where a lowermost-layer memory board 21J is further mounted on the lower-side two-layer memory boards 21E, 21E mounted on the base board 10, in a small-size memory card with a case removed according to an eighteenth embodiment of the present invention.

A total of four memory chips 15t, whose thickness is larger than that of each memory chip 15 mounted on each of the lower two-layer memory boards 21E, 21E of the small-size memory card according to the eighteenth embodiment of the present invention, are mounted on each of both the front and back faces of the upper-most memory board 21J, similar to the memory board 21E as shown in FIG. 38. More specifically, on the back face (bottom face) of the upper-most memory board 21J, as with the memory board 21E, two memory chips 15t, 15t are mounted on the memory board 21J so that the short sides of the rectangular memory board 21J are approximately parallel to the long sides of two rectangular and thick memory chips 15t, 15t. Also, on the front face (top face) of the upper-most memory board 21J, two memory chips 15t, . . . , 15t are mounted on the memory board 21J so that the short sides 21x of the rectangular memory board 21J are approximately parallel to the short sides of a rectangular memory chip 15t whose width (short side) is smaller than that of the rectangular memory chip 15t on the back face. Inside each of a pair of facing short sides 21x, 21x of each of the upper-most memory board 21J and the lower two-layer memory boards 21E, 21E, there is disposed a line of junction electrodes 41, . . . , 41 along the short sides 21x, which are to be joined to the electrodes 41, . . . , 41 or 10x, . . . , 10x disposed in the respective positions of other memory boards 21E or the base board 10.

In such constitution, three modules 21, . . . , 21 incorporating the memory chips 15, . . . , 15 having the same thickness are not piled and disposed on one face of the base board, but two memory boards 21E, 21E incorporating the memory chips 15, . . . , 15 having smaller thickness are piled and disposed on one face of the base board 10, and further on top thereof, one module 21J incorporating the memory chips 15t, . . . , 15t having large thickness is disposed. This makes it possible to increase the mechanical strength as well as the bending and torsional strength of the small-size memory card.

(Nineteenth Embodiment)

Figure 39:
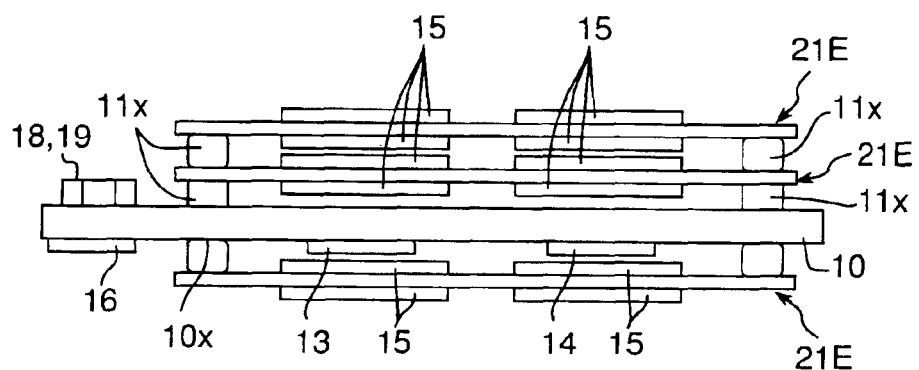
FIG. 39 is a schematic side view showing a small-size memory card with a case removed according to a nineteenth embodiment of the present invention.

FIG. 39 is a schematic side view showing a small-size memory card with a case removed according to a nineteenth embodiment of the present invention. In the nineteenth embodiment, the memory board 21E is disposed not only on the front face of the base board 10 but also on the back face as with the front face of the base board 10. More specifically, on the front face of the base board 10, two-layer memory boards 21E, 21E are disposed in a laminated state. On the back face of the base board 10, a one-layer memory board 21E is disposed. It is noted that the electrodes 10x, . . . , 10x of the base board 10 are each connected to the electrodes 41, . . . , 41 of the one-layer memory board 21E on the back face of the base board 10 with solder portions 11x, . . . , 11x.

In such a constitution, the modules incorporating the memory chips 15, . . . , 15 are disposed not only on one face of the base board 10, but the modules incorporating the memory chips 15, . . . , 15 may be disposed on both the front and back face of the base board 10. This makes it possible to balance the module configuration, thereby contributing to an increase of the mechanical strength as well as the bending and torsional strength of the entire small-size memory card.

(Twentieth Embodiment)

Next, in a small-size memory card according to a twentieth embodiment of the present invention, between the memory board 21E and the upper case 30, between the memory boards 21E, 21E, between the memory board 21E and the base board 10, between the memory board 21E and the upper case 30, or between the base board 10 and the upper case 30, there may be disposed insulative reinforcing resins such as thermoset epoxy resin for reinforcing the small-size memory card, particularly for increasing the mechanical strength as well as the bending and torsional strength of the small-size memory card. It is noted that in the twentieth embodiment, if an insulative reinforcing resin is disposed on the side portion of the memory chip 15, the insulative reinforcing resin is preferably injected into a space around electric junction portions between the memory chip 15 and the memory board 21 to seal the electric junction portions for protecting the electric junction portions. Therefore, it is preferable that the insulative reinforcing resin functions as sealing resin in addition to the reinforcing function.

It is understood that the twentieth embodiment is applicable to the case of disposing one-layer memory board 21E, the case of disposing two-layer memory boards 21E, and the case of disposing three-layer or more memory boards 21E, each at least on one face out of both the front and back faces of the base board 10.

Figure 40:
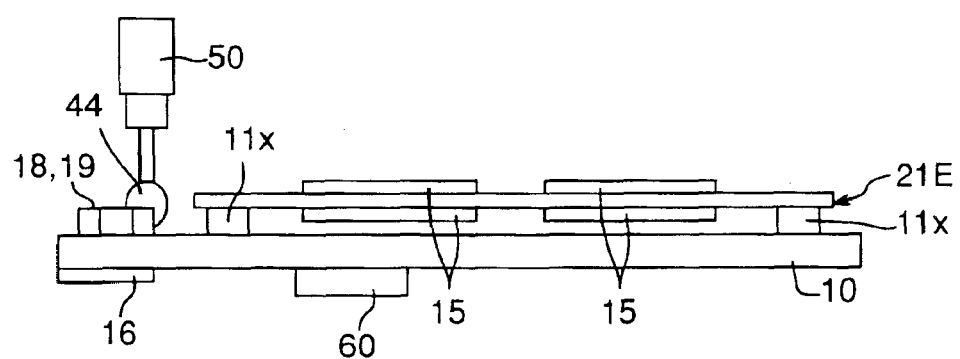
FIG. 40 is a schematic side view showing a small-size memory card with a case removed in the state of being applied an insulative reinforcing resin with use of an application nozzle according to a twentieth embodiment of the present invention.
Figure 41:
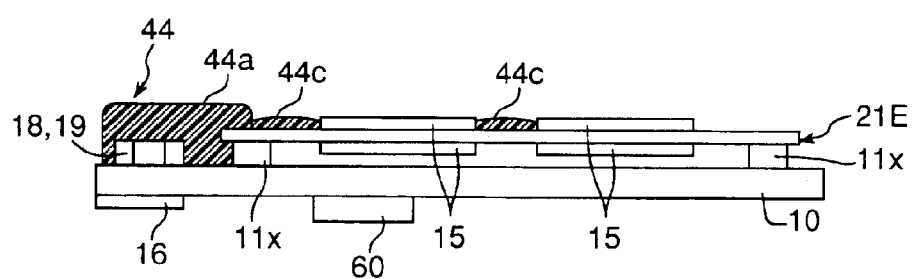
FIG. 41 is a schematic side view showing a small-size memory card with a case removed according to the twentieth embodiment of the present invention.
Figure 42:
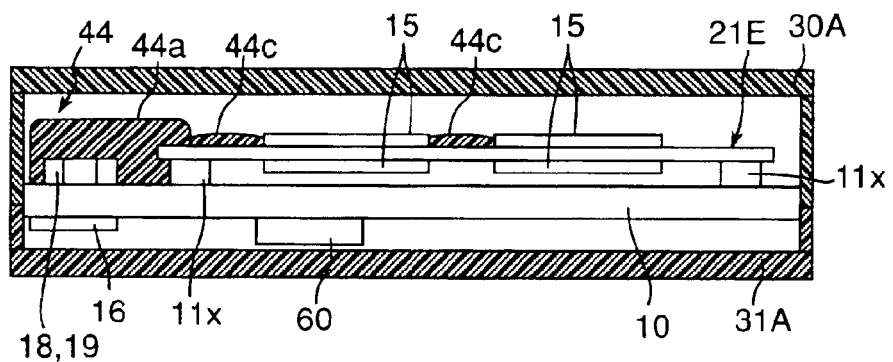
FIG. 42 is a schematic side view showing a small-size memory card with a case removed according to the twentieth embodiment of the present invention.

More specifically, in the case where one-layer memory board 21E is disposed on the front face of the base board 10, an insulative reinforcing resin is applied, as shown in FIG. 40, to a region at a first end portion on the front face of the base board 10 on which chip capacitors 18 and chip resistors 19 are mounted, by means of an application nozzle 50 exemplifying an application device for applying an insulative reinforcing resin so as to form a first end portion reinforcing portion 44a exemplifying an insulative reinforcing portion 44 as shown in FIG. 41. Also, an insulative reinforcing resin is fed by an applying operation and the like to between the memory chip 15 of the memory board 21E and the first end portion reinforcing portion 44a and between adjacent memory chips 15, 15 of the memory board 21E, to form uppermost-layer reinforcing portions 44c, 44c as shown in FIG. 41. After being applied so as not to be thicker than the memory chip 15 of the memory board 21E, the uppermost-layer reinforcing portions 44c, 44c may be set thicker than the memory chip 15 in heat curing as shown in FIG. 42 up to approximately the same thickness as the top face of the first end portion reinforcing portion 44a. Alternatively, the uppermost-layer reinforcing portions 44c, 44c may be formed to be equal to or thicker than the memory chip 15 of the memory board 21E by an applying operation and the like before heat curing. This makes it possible to increase a protecting function of the memory chip 15.

In such a constitution, the first end portion reinforcing portion 44a is disposed at the first end portion on the front face of the base board 10 on which the chip capacitors 18 and the chip resistors 19 are mounted, so that particularly the mechanical strength as well as the bending and torsional strength of the small-size memory card on the side of the card electrodes 16 may be increased. Also, since the uppermost-layer reinforcing portions 44c, 44c are disposed in a space between the memory chips 15, 15 of the memory board 21E and the like, particularly the mechanical strength as well as the bending and torsional strength of the memory board 21E may be increased. Also, the thickness of the uppermost-layer reinforcing portions 44c, 44c is larger than the thickness of the memory chips 15, 15 on the front face of the memory board 21E. Consequently, even if an external force acts upon the memory chips 15, 15 from the upper case 30A side, the uppermost-layer reinforcing portions 44c, 44c support the inside face of the upper case 30A so as to interrupt the external force acting upon the memory chips 15, 15, thereby implementing a protecting function of the memory chips 15, 15.

Figure 43:
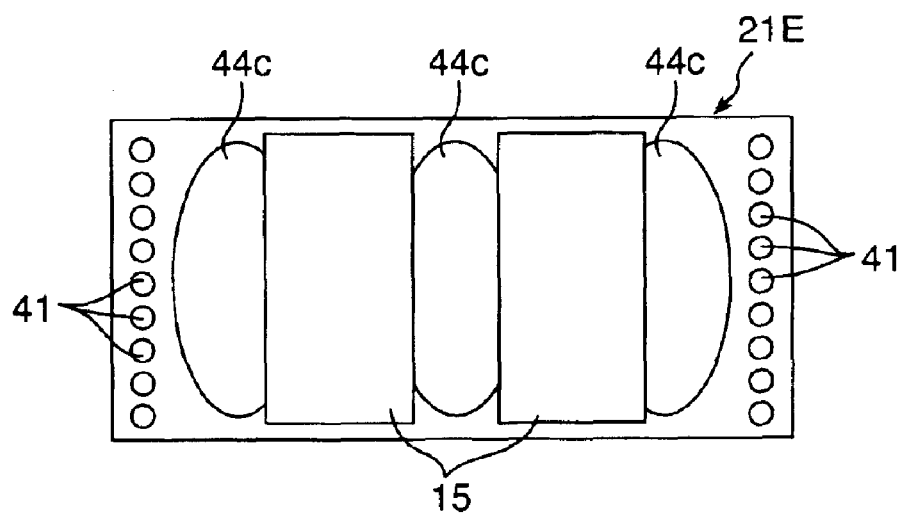
FIG. 43 is a schematic plan view showing a memory board of a first modified example of the twentieth embodiment.
Figure 44:
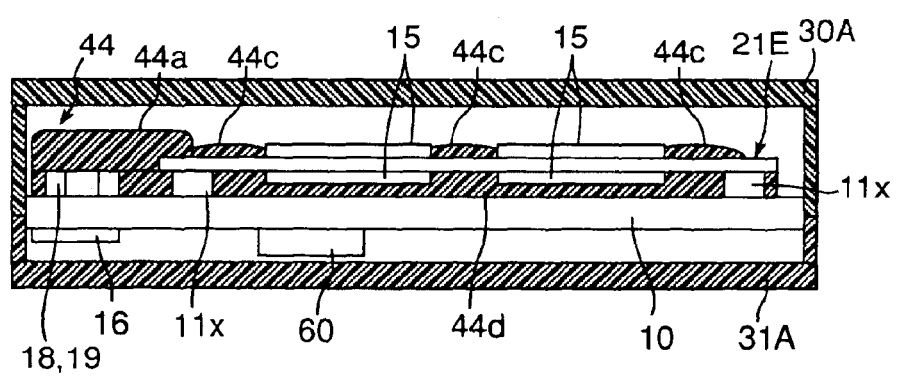
FIG. 44 is a partial cross sectional schematic side view showing the small-size memory card of the first modified example of the twentieth embodiment.

Also, as a first modified example of the twentieth embodiment, as shown in FIG. 43 and FIG. 44, the uppermost-layer reinforcing portions 44c, 44c may be formed on both sides of each memory chip 15 of the memory board 21E with an insulative reinforcing resin being fed by an applying operation or the like. More specifically, insulative reinforcing resins may be fed by an applying operation and the like to between the memory chip 15 of the memory board 21E on the side of the first end portion and the first end portion reinforcing portion 44a, between adjacent memory chips 15, 15 of the memory board 21E, and between the memory board 21E on the side of the other (second) end portion opposite to the first end portion reinforcing portion 44a and the electrodes 41, . . . , 41 of the second end portion of the memory board 21E, so as to form uppermost-layer reinforcing portions 44c, 44c, 44c. Further, an insulative reinforcing resin may also be fed by an applying operation and the like to between the memory board 21E and the base board 10 to form a layer-shaped memory board reinforcing portion 44d. The memory board reinforcing portion 44d may be disposed so as to cover the surroundings of solder portions 11x, . . . , 11x that connect the electrodes 41, . . . , 41 of the memory board 21E and the electrodes 10x, . . . , 10x of the base board 10 for enabling protection of the electrode junction portions. Thus, the first end portion reinforcing portion 44a, the memory board reinforcing portion 44d and the uppermost-layer reinforcing portion 44c constitute the reinforcing portion 44. It is noted that the thickness of the memory board reinforcing portion 44d is approximately equal to the thickness of the solder portion 11x (i.e., approximately equal to a space between the memory board 21E and the base board 10). It is noted that reference numeral 30A denotes an upper case of the small-size memory card, and 31A denotes a lower case of the small-size memory card.

In such constitution, since the memory board reinforcing portion 44d is disposed between the memory board 21E and the base board 10, the memory board 21E is integrated with the base board 10, which makes it possible to further increase the mechanical strength as well as the bending and torsional strength of the entire small-size memory card. Of course, in this example, the reinforcing effect of the first end portion reinforcing portion 44a and each uppermost-layer reinforcing portion 44c may be implemented.

Figure 45:
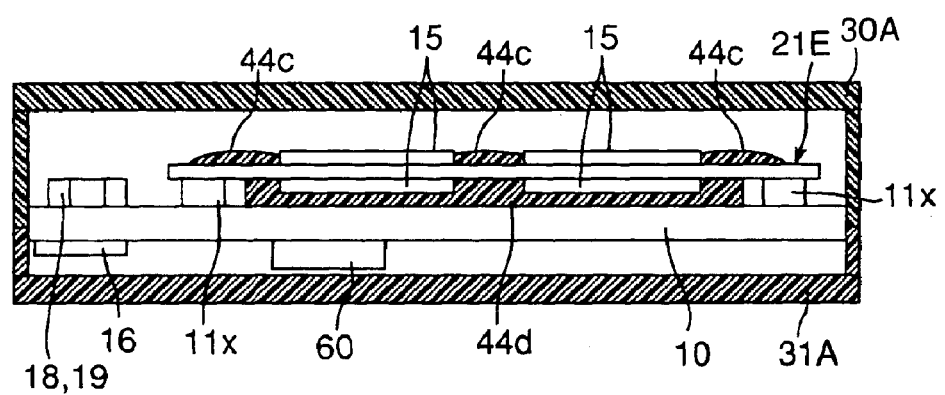
FIG. 45 is a partial cross sectional schematic side view showing a small-size memory card of a second modified example of the twentieth embodiment.

Also, as a second modified example of the twentieth embodiment, as shown in FIG. 45, there may be formed a simplified version of the small-size memory card of FIG. 44, in which the first end portion reinforcing portion 44a is omitted, and a layer-shaped second memory board reinforcing portion 44e is formed by shortening the short sides of the layer-shaped memory board reinforcing portion 44d to the extent that the electrodes 41, . . . , 41 on the short sides are exposed. Thus, the second memory board reinforcing portion 44e and the uppermost-layer reinforcing portion 44c may constitute the reinforcing portion 44. It is noted that the thickness of the memory board reinforcing portion 44d is approximately equal to the thickness of the solder portion 11x, or approximately equal to a space between the memory board 21E and the base board 10. It is noted that reference numeral 30A denotes an upper case of the small-size memory card, and 31A denotes a lower case of the small-size memory card.

In such a constitution, since the memory board reinforcing portion 44d is disposed between the memory board 21E and the base board 10, the memory board 21E is integrated with the base board 10, which makes it possible to further increase the mechanical strength as well as the bending and torsional strength of the entire small-size memory card. It is noted that the thickness of the layer-shaped second memory board reinforcing portion 44e is approximately equal to the thickness of the solder portion 11x (i.e., approximately equal to a space between the memory board 21E and the base board 10).

In such a constitution, three uppermost-layer reinforcing portions 44c, 44c, 44c are disposed on both the sides of each memory chip 15 on the memory board 21E and the second memory board reinforcing portion 44e is also disposed, so that the memory board 21E and the base board 10 are approximately integrated with each other. This arrangement makes it possible to increase the mechanical strength as well as the bending and torsional strength of the entire small-size memory card.

Figure 46:
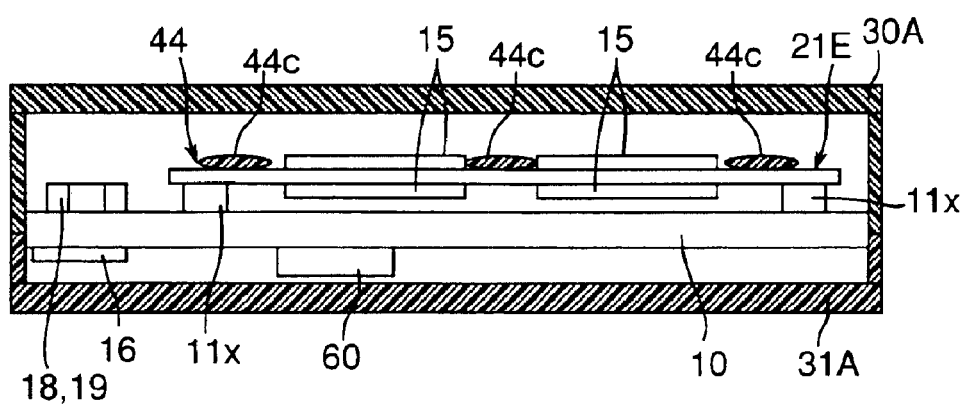
FIG. 46 is a partial cross sectional schematic side view showing a small-size memory card of a third modified example of the twentieth embodiment.

Also, as a third modified example of the twentieth embodiment, as shown in FIG. 46, there may be formed a simplified version of the small-size memory card of FIG. 44, in which one end portion reinforcing portion 44a and the second memory board reinforcing portion 44e are omitted, and only three uppermost-layer reinforcing portions 44c constitute the reinforcing portion 44.

In such a constitution, since the uppermost-layer reinforcing portion 44c is disposed on each of both the sides of each memory chip 15 on the top face of the memory board 21E, each memory chip 15 on the top face of the memory board 21E may be protected and reinforced, which enables a further increase of the mechanical strength as well as the bending and torsional strength of the small-size memory card.

Figure 47:
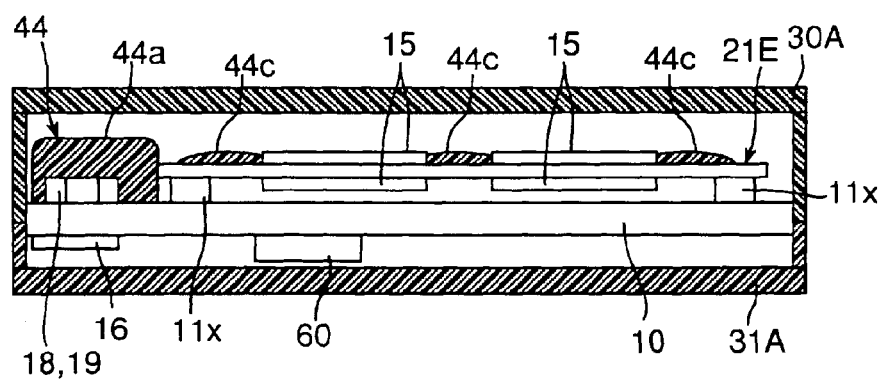
FIG. 47 is a partial cross sectional schematic side view showing a small-size memory card of a fourth modified example of the twentieth embodiment.

Also, as a fourth modified example of the twentieth embodiment, as shown in FIG. 47, a first end portion reinforcing portion 44a may be added to the small-size memory card of FIG. 46, so that the first end portion reinforcing portion 44a and three uppermost-layer reinforcing portions 44c, . . . , 44c constitute the reinforcing portion 44.

In such constitution, due to the first end portion reinforcing portion 44a in addition to three uppermost-layer reinforcing portions 44c, . . . , 44c, each memory chip 15 on the top face of the memory board 21E may be protected and reinforced, while at the same time the mechanical strength as well as the bending and torsional strength of the small-size memory card on the side of the card electrodes 16 may be increased.

Figure 48:
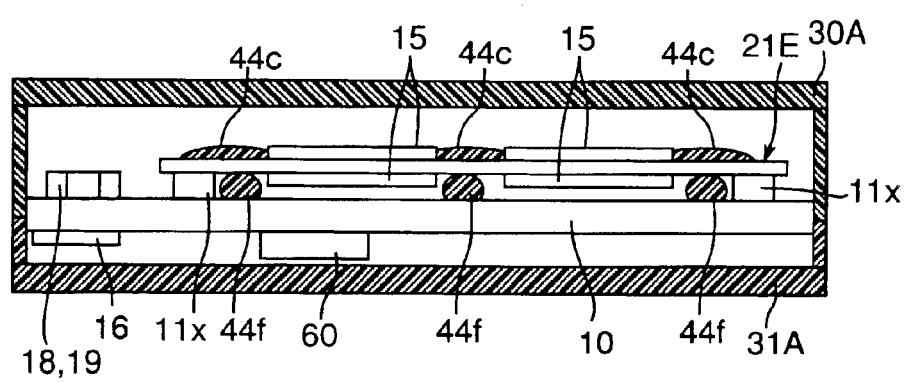
FIG. 48 is a partial cross sectional schematic side view showing a small-size memory card of a fifth modified example of the twentieth embodiment.

Also, as a fifth modified example of the twentieth embodiment, as shown in FIG. 48, there may be formed the small-size memory card of FIG. 45, in which the layer-shaped memory board reinforcing portion 44d is replaced with rod-shaped memory board reinforcing portions 44f, so that the uppermost-layer reinforcing portions 44c and the rod-shaped memory board reinforcing portions 44f constitute the reinforcing portion 44. It is noted that the thickness of the rod-shaped memory board reinforcing portion 44f is approximately equal to the thickness of the solder portion 11x (i.e., approximately equal to a space between the memory board 21E and the base board 10).

In such a constitution, since the rod-shaped memory board reinforcing portions 44f are disposed below the respective uppermost-layer reinforcing portions 44c via the memory board 21E, i.e., disposed on the side of the base board, it becomes possible to achieve more stable and reliable protection and reinforcement of the memory board 21, thereby enabling a further increase of the mechanical strength as well as the bending and torsional strength of the entire small-size memory card.

Figure 49:
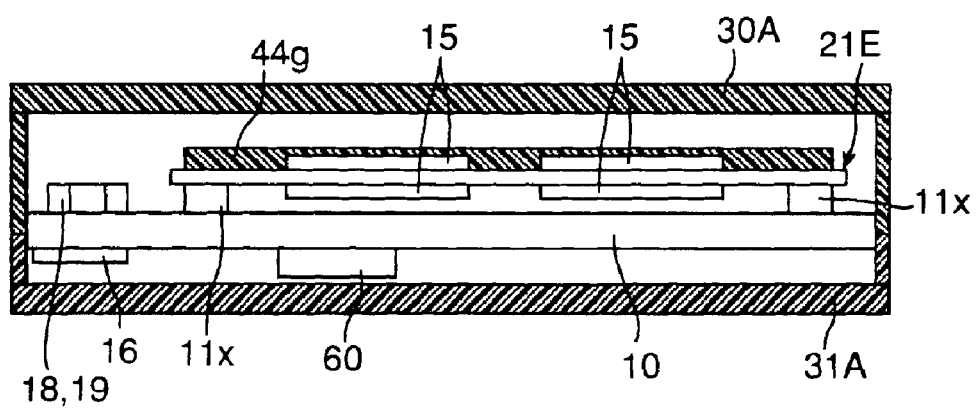
FIG. 49 is a partial cross sectional schematic side view showing a small-size memory card of a sixth modified example of the twentieth embodiment.

Also, as a sixth modified example of the twentieth embodiment, as shown in FIG. 49, there may be formed a simplified version of the small-size memory card of FIG. 46, in which three uppermost-layer reinforcing portions 44c, . . . , 44c are connected to make a one layer-shaped uppermost-layer reinforcing portion 44g, so that the layer-shaped uppermost-layer reinforcing portion 44g constitutes the reinforcing portion 44. It is preferable that the layer-shaped uppermost-layer reinforcing portion 44g is formed equal to or thicker than the memory chip 15 on the top face of the memory board 21E so as to ensure protection and reinforcement of each memory chip 15.

In such constitution, the one layer-shaped uppermost-layer reinforcing portion 44g is disposed so as to cover two memory chips 15, 15 on the top face of the memory board 21E, which enables more stable and reliable protection and reinforcement of two memory chips 15, 15 on the top face of the memory board 21E, resulting in a further increase of the mechanical strength as well as the bending and torsional strength of the entire small-size memory card. It is noted that in this modified example, a first end portion reinforcing portion 44a may be added to this configuration.

Also, in the following modified example of the twentieth embodiment, a description will be given of the case in which two-layer memory boards 21E are disposed at least on one face of the front and back faces of the base board 10.

Figure 50:
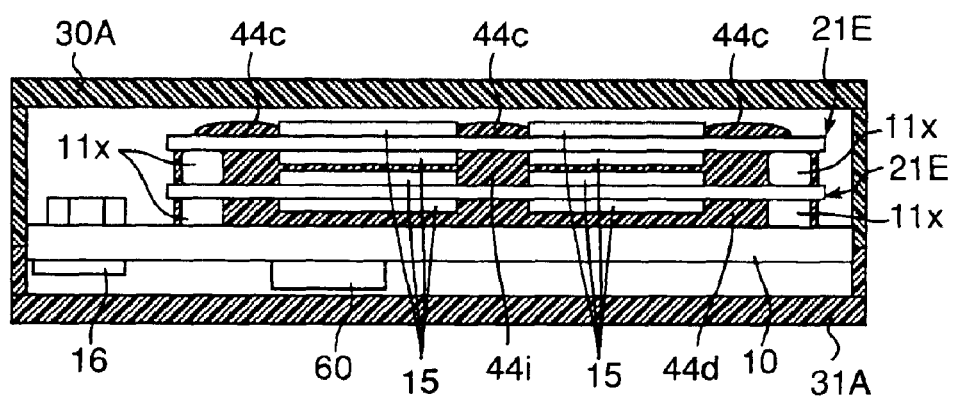
FIG. 50 is a partial cross sectional schematic side view showing a small-size memory card of a seventh modified example of the twentieth embodiment.

First, as a seventh modified example of the twentieth embodiment, as shown in FIG. 50, the reinforcing portion 44 is constituted by three uppermost-layer reinforcing portions 44c, . . . , 44c disposed on the top face of the uppermost memory board 21E, a layer-shaped third memory board reinforcing portion 44i similar to the layer-shaped memory board reinforcing portion 44d disposed between an uppermost memory board 21E and its lower memory board 21E, and a layer-shaped memory board reinforcing portion 44d disposed between the lower memory board 21E and the base board 10. It is noted that the thickness of the layer-shaped third memory board reinforcing portion 44i is approximately equal to the thickness of the solder portion 11x, in other words, approximately equal to a space between the uppermost memory board 21E and its lower memory board 21E. As with the layer-shaped memory board reinforcing portion 44d, the layer-shaped third memory board reinforcing portion 44i is disposed so as to cover over the surroundings of the solder portions 11x, . . . , 11x that connects the electrodes 41, . . . , 41 of two memory boards 21E, 21E for providing protection of the electrode junction portions.

In such constitution, since three uppermost-layer reinforcing portions 44c, . . . , 44c, the layer-shaped third memory board reinforcing portion 44i, and the layer-shaped memory board reinforcing portion 44d are provided, the two memory boards 21E, 21E and the base board 10 are integrated, thereby enabling a further increase of the mechanical strength as well as the bending and torsional strength of the entire small-size memory card.

Figure 51:
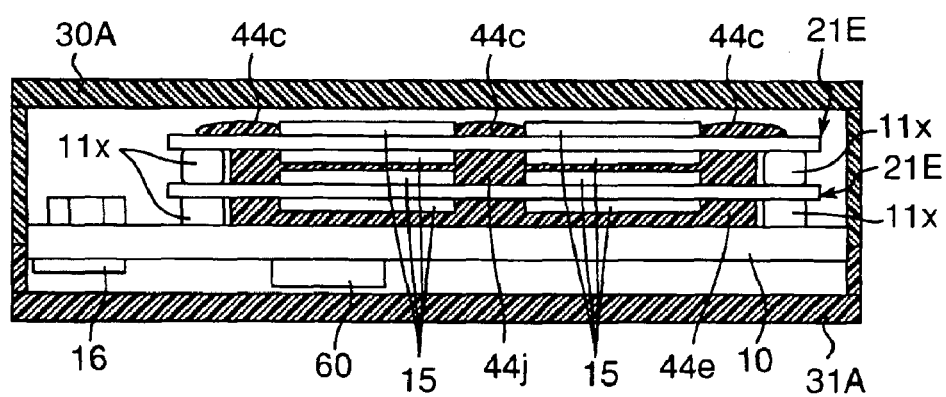
FIG. 51 is a partial cross sectional schematic side view showing a small-size memory card of an eighth modified example of the twentieth embodiment.

Also as an eighth modified example of the twentieth embodiment, as shown in FIG. 51, a layer-shaped second memory board reinforcing portion 44e may be formed by shortening the short sides of the layer-shaped memory board reinforcing portion 44d of the small-size memory card of FIG. 50 to the extent that the electrodes 41, . . . , 41 on the short sides are exposed. Similarly, a layer-shaped fourth memory board reinforcing portion 44j may be formed by shortening the layer-shaped third memory board reinforcing portion 44i to the extent that the electrodes 41, . . . , 41 on the short sides are exposed. As a result, the reinforcing portion 44 may be constituted by three uppermost-layer reinforcing portions 44c, . . . , 44c, the layer-shaped second memory board reinforcing portion 44e, and the layer-shaped fourth memory board reinforcing portion 44j.

In such a constitution, since the three uppermost-layer reinforcing portions 44c, . . . , 44c, the layer-shape second memory board reinforcing portion 44e, and the layer-shaped fourth memory board reinforcing portion 44j are disposed, the two memory boards 21E, 21E and the base board 10 are integrated, which enables further increase of the mechanical strength as well as the bending and torsional strength of the entire small-size memory card.

Figure 52:
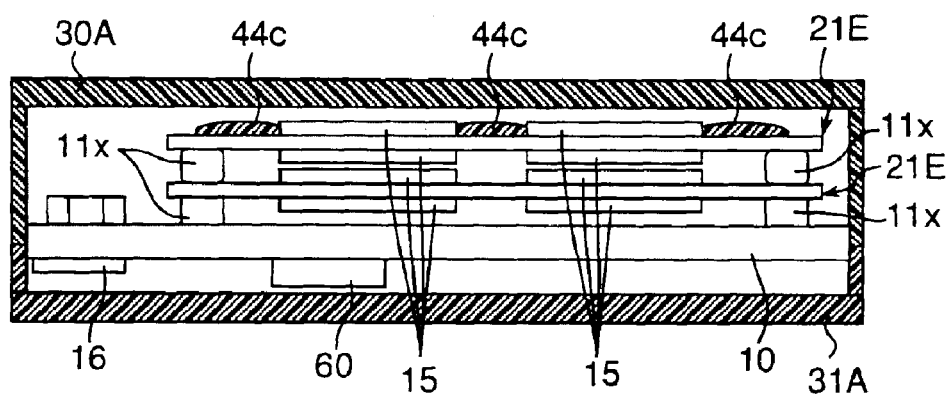
FIG. 52 is a partial cross sectional schematic side view showing a small-size memory card of a ninth modified example of the twentieth embodiment.

Also, as a ninth modified example of the twentieth embodiment, as shown in FIG. 52, similar to FIG. 46, three uppermost-layer reinforcing portions 44c, . . . , 44c may be disposed only on the uppermost memory board 21E out of two-layer memory boards 21E, 21E, so that the three uppermost-layer reinforcing portions 44c, . . . , 44c may constitute the reinforcing portion 44.

In such a constitution, since the uppermost-layer reinforcing portion 44c is disposed on each of both the sides of each memory chip 15 on the top face of the uppermost memory board 21E, each memory chip 15 on the top face of the uppermost memory board 21E may be protected and reinforced, which enables a further increase of the mechanical strength as well as the bending and torsional strength of the small-size memory card.

Figure 53:
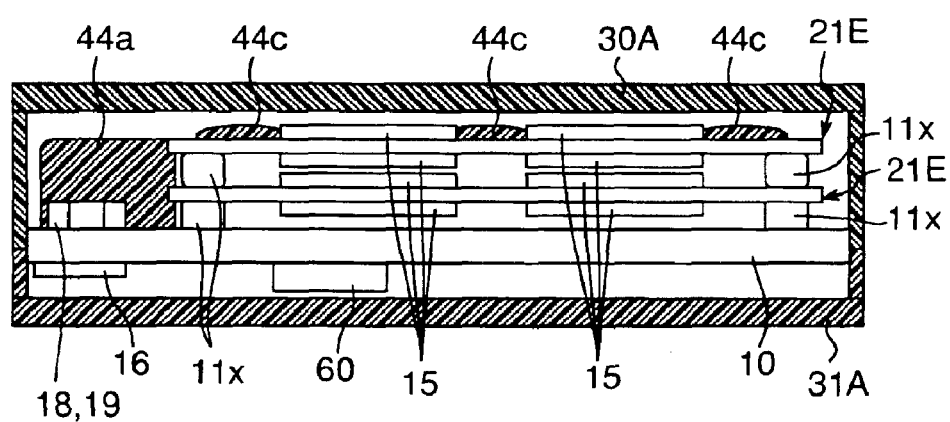
FIG. 53 is a partial cross sectional schematic side view showing a small-size memory card of a tenth modified example of the twentieth embodiment.

Also, as a tenth modified example of the twentieth embodiment, as shown in FIG. 53, similar to FIG. 47, a one (first) end portion reinforcing portion 44a may be added to the small-size memory card of FIG. 52, so that the one end portion reinforcing portion 44a and three uppermost-layer reinforcing portions 44c, . . . , 44c constitute the reinforcing portion 44.

In such a constitution, since the first end portion reinforcing portion 44a is disposed in addition to the three uppermost-layer reinforcing portions 44c, . . . , 44c, each memory chip 15 on the top face of the uppermost memory board 21E may be protected and reinforced, while at the same time the mechanical strength as well as the bending and torsional strength of the small-size memory card on the side of the card electrodes 16 may be increased.

Figure 54:
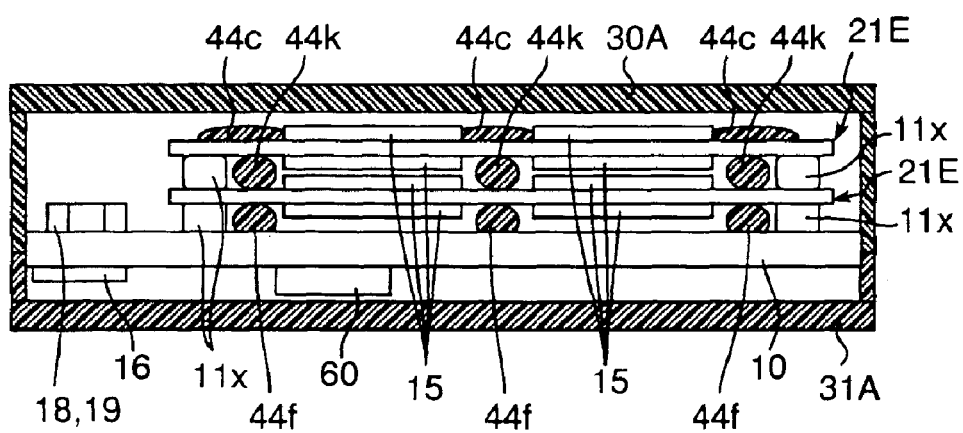
FIG. 54 is a partial cross sectional schematic side view showing of a small-size memory card of an eleventh modified example of the twentieth embodiment.

Also, as an eleventh modified example of the twentieth embodiment, as shown in FIG. 54, similar to FIG. 48, the layer-shaped memory board reinforcing portions 44e, 44j in the small-size memory card of FIG. 51 may be each replaced with rod-shaped memory board reinforcing portions 44f, 44K, so that the uppermost reinforcing portion 44c and the rod-shaped memory board reinforcing portions 44f, 44K may constitute the reinforcing portion 44. It is noted that the thickness of the rod-shaped memory board reinforcing portion 44f is approximately equal to the thickness of the solder portion 11x (i.e., is approximately equal to a space between the memory board 21E and the base board 10). Also, the thickness of the rod-shaped memory board reinforcing portion 44k is approximately equal to the thickness of the solder portion 11x (i.e., is approximately equal to a space between two-layer memory boards 21E, 21E).

In such a constitution, the rod-shaped memory board reinforcing portions 44f, 44k are disposed below each uppermost-layer reinforcing portion 44c via the two memory boards 21E, 21E, i.e., on the side of the base board, which enables more stable and reliable protection and reinforcement of the two memory boards 21E, 21E, resulting in a further increase of the mechanical strength as well as the bending and torsional strength of the entire small-size memory card.

Figure 55:
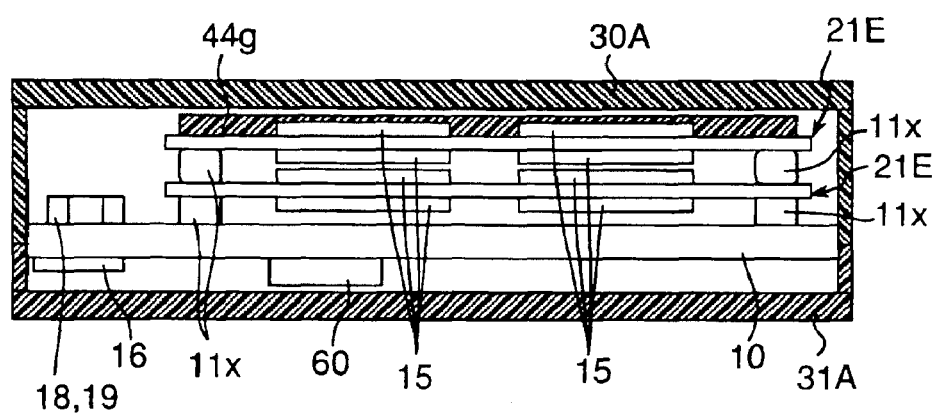
FIG. 55 is a partial cross sectional schematic side view showing a small-size memory card of a twelfth modified example of the twentieth embodiment.

Also, as a twelfth modified example of the twentieth embodiment, as shown in FIG. 55, similar to FIG. 49, there may be formed a simplified version of FIG. 52, in which three uppermost-layer reinforcing portions 44c, . . . , 44c are connected to make a one layer-shaped uppermost-layer reinforcing portion 44g, so that the layer-shaped uppermost-layer reinforcing portion 44g constitutes the reinforcing portion 44. It is preferable that the layer-shaped uppermost-layer reinforcing portion 44g is equal to or thicker than the memory chip 15 on the top face of the uppermost memory board 21E, and that a space is present between the layer-shaped uppermost-layer reinforcing portion 44g and the inner face of the upper case 30A so that the layer-shaped uppermost-layer reinforcing portion 44g is disposed independently of the upper case 30A for ensuring protection and reinforcement of each memory chip 15.

In such a constitution, since the one layer-shaped uppermost-layer reinforcing portion 44g is disposed so as to cover the two memory chips 15, 15 on the top face of the memory board 21E, the two memory chips 15, 15 on the top face of the uppermost memory board 21E may be protected and reinforced more stably and reliably, thereby enabling a further increase of the mechanical strength as well as the bending and torsional strength of the entire small-size memory card.

Figure 56:
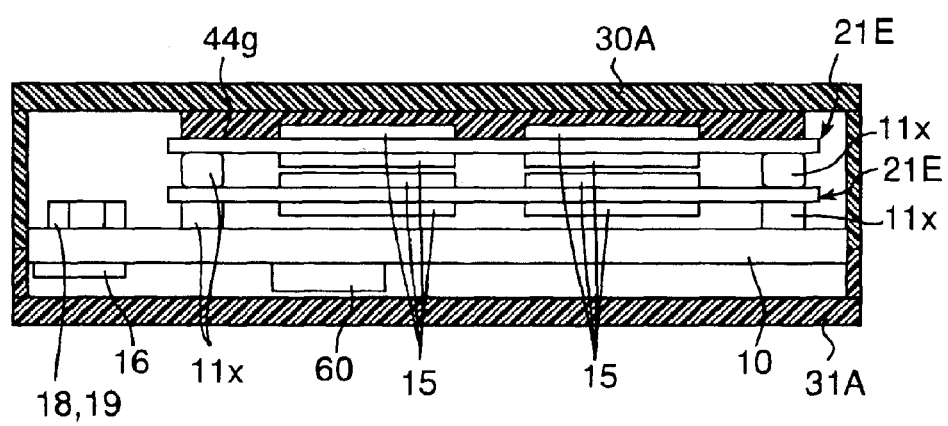
FIG. 56 is a partial cross sectional schematic side view showing a small-size memory card of a thirteenth modified example of the twentieth embodiment.

Also, as a thirteenth modified example of the twentieth embodiment, as shown in FIG. 56, there may be formed a modified version of FIG. 55, in which a one layer-shaped uppermost-layer reinforcing portion 44g formed by connecting three uppermost-layer reinforcing portions 44c, . . . ,44c is brought into contact with the inner face of the upper case 30A, so that the layer-shaped uppermost-layer reinforcing portion 44g constitutes the reinforcing portion 44. It is preferable that the layer-shaped uppermost-layer reinforcing portion 44g is equal to or thicker than the memory chip 15 on the top face of the memory board 21E, and is sized so as to be in contact with the inner face of the upper case 30A for ensuring protection and reinforcement of each memory chip 15.

In such a constitution, the one layer-shaped uppermost-layer reinforcing portion 44g is disposed so as to cover the two memory chips 15, 15 on the top face side of the memory board 21E. Since the layer-shaped uppermost-layer reinforcing portion 44g is in contact with the inner face of the upper case 30A, the layer-shaped uppermost-layer reinforcing portion 44g makes the uppermost memory board 21E integrate with the upper case 30A, thereby ensuring more stable and reliable protection and reinforcement of the two memory chips 15, 15 on the top face of the uppermost memory board 21E, and enabling a further increase of the mechanical strength as well as the bending and torsional strength of the entire small-size memory card.

Figure 57:
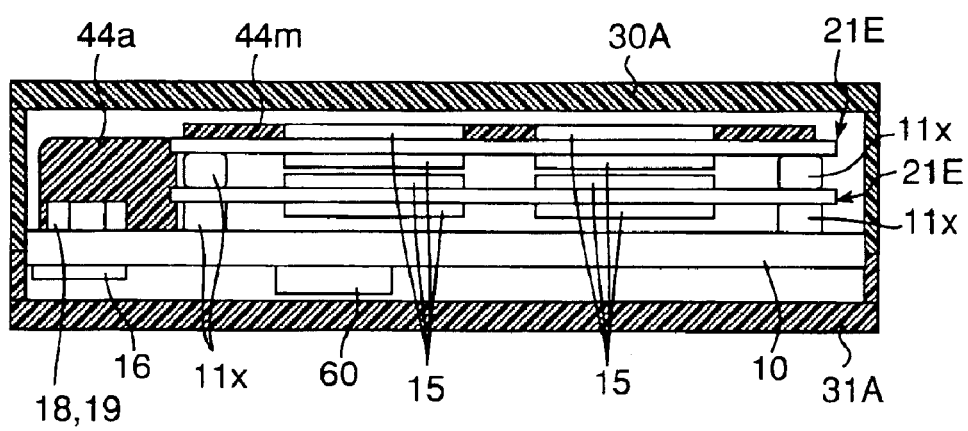
FIG. 57 is a partial cross sectional schematic side view showing a small-size memory card of a fourteenth modified example of the twentieth embodiment.

Also, as a fourteenth modified example of the twentieth embodiment, as shown in FIG. 57, there may be formed a modified version of FIG. 55, in which a one (first) end portion reinforcing portion 44a is further added to a one layer-shaped uppermost-layer reinforcing portion 44g that connects three uppermost-layer reinforcing portions 44c, . . . , 44c, so that the layer-shaped uppermost-layer reinforcing portion 44g and the one end portion reinforcing portion 44a constitute the reinforcing portion 44.

In such constitution, the layer-shaped uppermost-layer reinforcing portion 44g is disposed so as to cover two memory chips 15, 15 on the top face side of the memory board 21E, and the one (first) end portion reinforcing portion 44a is also disposed, which ensures more stable and reliable protection and reinforcement of the two memory chips 15, 15 on the top face side of the uppermost memory board 21E, while at the same time the mechanical strength as well as the bending and torsional strength of the small-size memory card on the side of the card electrodes 16 may be increased, thereby enabling a further increase of the mechanical strength as well as the bending and torsional strength of the entire small-size memory card.

Figure 58:
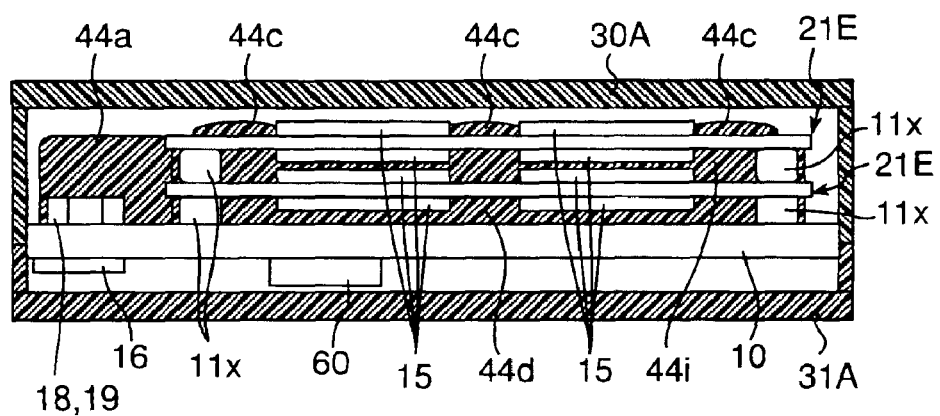
FIG. 58 is a partial cross sectional schematic side view showing a small-size memory card of a fifteenth modified example of the twentieth embodiment.

Also, as a fifteenth modified example of the twentieth embodiment, as shown in FIG. 58, there may be formed a modified version of FIG. 51, in which a one end portion reinforcing portion 44a in addition to three uppermost-layer reinforcing portions 44c, . . . , 44c, the layer-shaped third memory board reinforcing portion 44i, and the layer-shaped memory board reinforcing portion 44d constitute the reinforcing portion 44.

In such constitution, since there are disposed the three uppermost-layer reinforcing portions 44c, . . . , 44c, the layer-shaped third memory board reinforcing portion 44i, the layer-shaped memory board reinforcing portion 44d, and the one end portion reinforcing portion 44a, two memory boards 21E, 21E and the base board 10 are integrated with each other, which enables a further increase of the mechanical strength as well as the bending and torsional strength of the entire small-size memory card, and also enables an increase of the mechanical strength as well as the bending and torsional strength of the small-size memory card on the side of the card electrodes 16.

Figure 59:
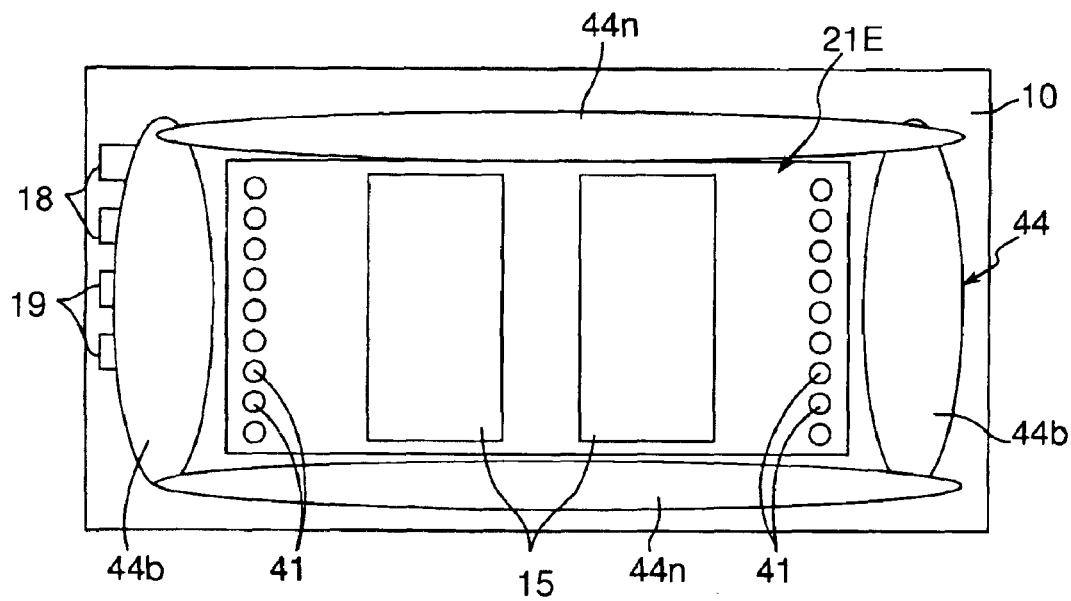
FIG. 59 is a schematic plan view showing a small-size memory card of a sixteenth modified example of the twentieth embodiment.
Figure 60:
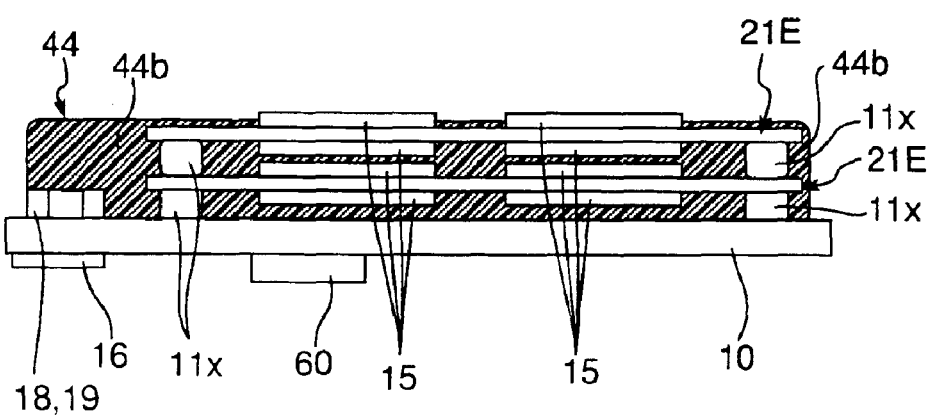
FIG. 60 is a partial cross sectional schematic side view showing a small-size memory card of a sixteenth modified example of the twentieth embodiment.

Also, as a sixteenth modified example of the twentieth embodiment, as shown in FIG. 59 and FIG. 60, there may be formed a modified version of FIG. 58, in which three uppermost-layer reinforcing portions 44c, . . . , 44c, the layer-shaped third memory board reinforcing portion 44i, the layer-shaped memory board reinforcing portion 44d, and the one end portion reinforcing portion 44a are integrally formed from insulative reinforcing resin to constitute the reinforcing portion 44. More particularly, as shown in a plan view of FIG. 59, in portions along the short sides inside a pair of facing short sides of the base board (i.e., a portion of the small-size memory card on the side of the card electrodes 16 that is on one end side of the base board 10, and a portion on the other end side of the base board 10), wide reinforcing portions 44b, 44b having a large width may be formed, and in portions along the long sides inside a pair of facing long sides of the base board 10, long and narrow reinforcing portions 44n, 44n may be forned for further increase of the mechanical strength as well as the bending and torsional strength of the entire small-size memory card. Particularly, the portions along the short sides inside a pair of facing short sides are vicinity portions of the electrodes 41, . . . , 41, and therefore increasing the width of the reinforcing portions 44b, 44b in the vicinity of the electrodes 41, . . . , 41 ensures reinforcement of the vicinity portions of the electrodes 41, . . . ,41.

Figure 63:
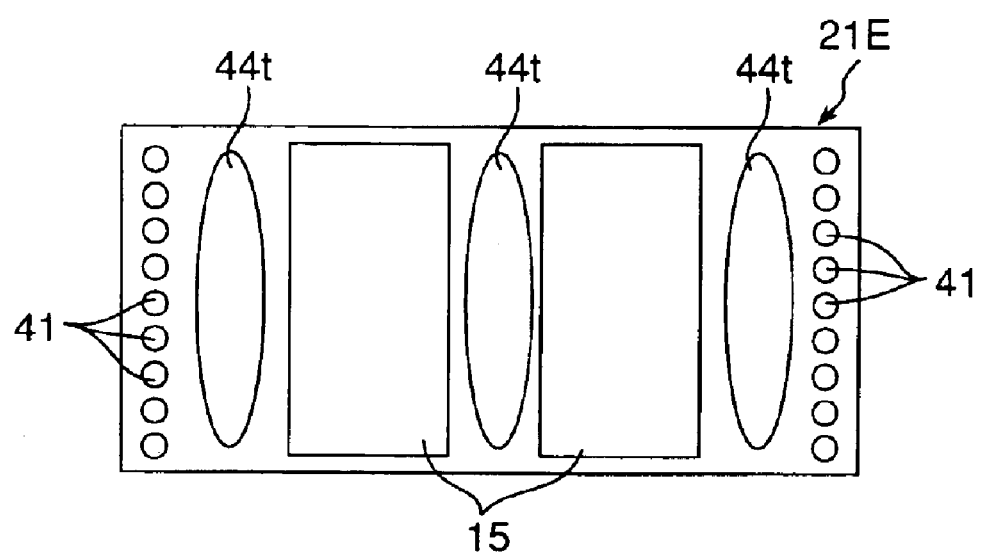
FIG. 63 is a schematic plan view showing a memory board of a small-size memory card according to a seventeenth modified example of the twentieth embodiment of the present invention.
Figure 64:
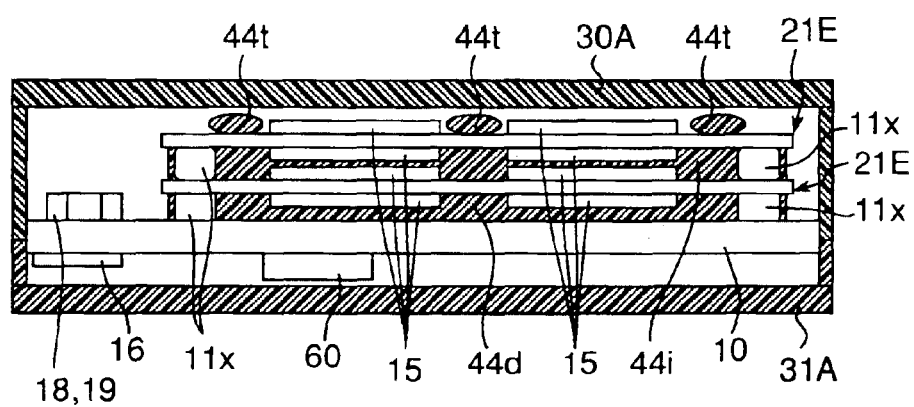
FIG. 64 is a partial cross sectional schematic side view showing the small-size memory card according to the seventeenth modified example of the twentieth embodiment of the present invention.

Also, as a seventeenth modified example of the twentieth embodiment, as shown in FIG. 63 and FIG. 64, three uppermost-layer reinforcing portions 44c, . . . , 44c disposed on the top face of the uppermost memory board 21E of FIG. 50 may be replaced with three uppermost-layer reinforcing portions 44t, . . . , 44t that are thicker than the uppermost-layer reinforcing portions 44c, . . . , 44c and thicker than each memory chip 15. More particularly, the three uppermost-layer reinforcing portions 44t, . . . , 44t, the layer-shaped third memory board reinforcing portion 44i, and the layer-shaped memory board reinforcing portion 44d may constitute the reinforcing portion 44.

In such constitution, since the three uppermost-layer reinforcing portions 44t, . . . , 44t, the layer-shaped third memory board reinforcing portion 44i, and the layer-shaped memory board reinforcing portion 44d are provided, two memory boards 21E, 21E and the base board 10 are integrated with each other, which enables a further increase of the mechanical strength as well as the bending and torsional strength of the entire small-size memory card. Also, the three uppermost-layer reinforcing portions 44t, . . . , 44t are thicker than the memory chips 15, 15 on the top face side of the memory board 21E. Consequently, even if an external force acts upon the memory chips 15, 15 from the upper case 30A side, the uppermost-layer reinforcing portions 44t, . . . , 44t support the inside face of the upper case 30A so as to interrupt the external force acting upon the memory chips 15, 15, thereby implementing a protecting function of the memory chips 15, 15.

Figure 65:
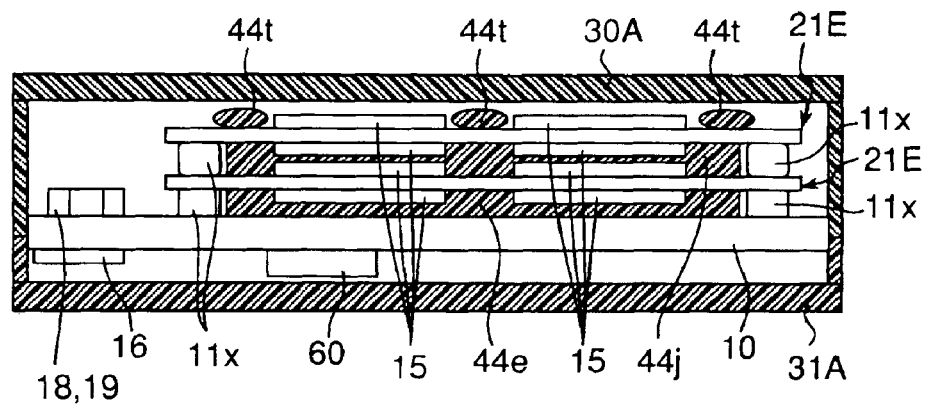
FIG. 65 is a partial cross sectional schematic side view showing a small-size memory card according to an eighteenth modified example of the twentieth embodiment of the present invention.

Also, as an eighteenth modified example of the twentieth embodiment, as shown in FIG. 65, three uppermost-layer reinforcing portions 44c, . . . , 44c disposed on the top face of the uppermost memory board 21E of FIG. 51 may be replaced with three uppermost-layer reinforcing portions 44t, . . . , 44t that are thicker than the uppermost-layer reinforcing portions 44c, . . . , 44c and thicker than each memory chip 15. More particularly, the three uppermost-layer reinforcing portions 44t, . . . , 44t, the layer-shaped second memory board reinforcing portion 44e, and the layer-shaped fourth memory board reinforcing portion 44j may constitute the reinforcing portion 44.

In such constitution, since the three uppermost-layer reinforcing portions 44t, . . . , 44t, the layer-shaped second memory board reinforcing portion 44e, and the layer-shaped fourth memory board reinforcing portion 44j are disposed, two memory boards 21E, 21E and the base board 10 are integrated with each other, which enables a further increase of the mechanical strength as well as the bending and torsional strength of the entire small-size memory card. Also, the three uppermost-layer reinforcing portions 44t, . . . , 44t are thicker than the memory chips 15, 15 on the top face side of the memory board 21E. Consequently, even if an external force acts upon the memory chips 15, 15 from the upper case 30A side, the uppermost-layer reinforcing portions 44t, . . . , 44t support the inside face of the upper case 30A so as to interrupt the external force acting upon the memory chips 15, 15, thereby implementing a protecting function of the memory chips 15, 15.

Figure 66:
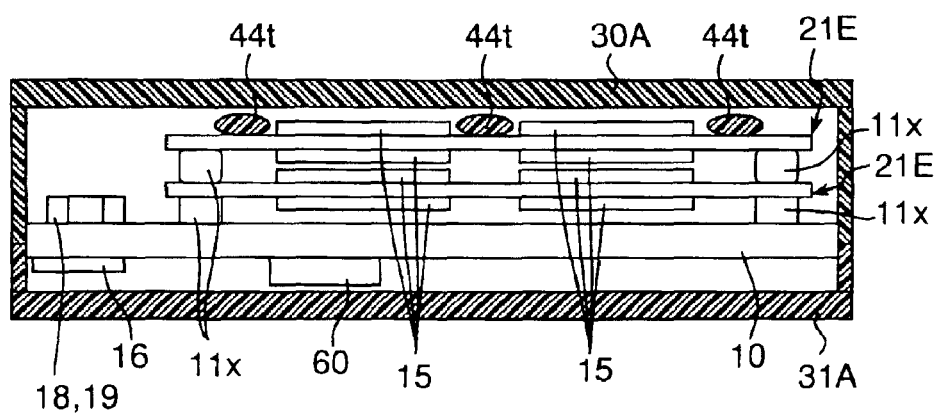
FIG. 66 is a partial cross sectional schematic side view showing a small-size memory card according to a nineteenth modified example of the twentieth embodiment of the present invention.

Also, as a nineteenth modified example of the twentieth embodiment, as shown in FIG. 66, three uppermost-layer reinforcing portions 44c, . . . , 44c disposed on the top face of the uppermost memory board 21E of FIG. 52 may be replaced with three uppermost-layer reinforcing portions 44t, . . . , 44t that are thicker than the uppermost-layer reinforcing portions 44c, . . . , 44c and thicker than each memory chip 15, so that the three uppermost-layer reinforcing portions 44t, . . . , 44t constitute the reinforcing portion 44.

In such constitution, since the uppermost-layer reinforcing portions 44t, . . . , 44t are disposed on both the sides of each memory chip 15 on the top face side of the uppermost memory board 21E, each memory chip 15 on the top face side of the uppermost memory board 21E may be protected and reinforced, thereby enabling a further increase of the mechanical strength as well as the bending and torsional strength of the small-size memory card. More particularly, the three uppermost-layer reinforcing portions 44t, ..., 44t are thicker than the memory chips 15, 15 on the top side of the memory board 21E. Consequently, even if an external force acts upon the memory chips 15, 15 from the upper case 30A side, the uppermost-layer reinforcing portions 44t, ..., 44t support the inside face of the upper case 30A so as to interrupt the external force acting upon the memory chips 15, 15, thereby implementing a protecting function of the memory chips 15, 15.

Figure 67:
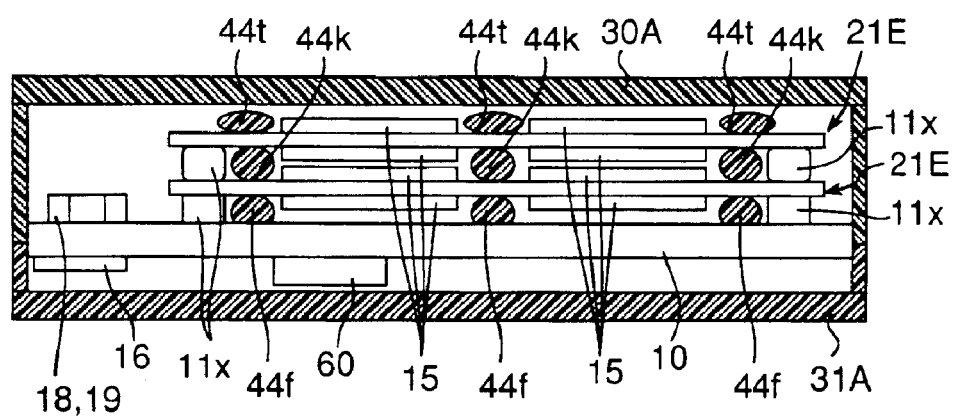
FIG. 67 is a partial cross sectional schematic side view showing a small-size memory card according to a twentieth modified example in the twentieth embodiment of the present invention.

Also, as a twentieth modified example of the twentieth embodiment, as shown in FIG. 67, instead of the three uppermost-layer reinforcing portions 44c, ..., 44c disposed on the top face of the uppermost memory board 21E of FIG. 54, three uppermost-layer reinforcing portions 44t, ..., 44t that are thicker than the uppermost-layer reinforcing portions 44c, ..., 44c and thicker than each memory chip 15, and rod-shaped memory board reinforcing portions 44f, 44k may constitute the reinforcing portion 44.

In such a constitution, the rod-shaped memory board reinforcing portions 44f, 44k are disposed below each uppermost-layer reinforcing portion 44c via two memory boards 21E, 21E, i.e., on the side of the base board, which enables more stable and reliable protection and reinforcement of the two memory boards 21E, 21E, resulting in a further increase of the mechanical strength as well as the bending and torsional strength of the entire small-size memory card. Also, the three uppermost-layer reinforcing portions 44t, ..., 44t are thicker than the memory chips 15, 15 on the top side of the memory board 21E. Consequently, even if an external force acts upon the memory chips 15, 15 from the upper case 30A side, the uppermost-layer reinforcing portions 44t. ..., 44t support the inside face of the upper case 30A so as to interrupt the external force acting upon the memory chips 15, 15, thereby implementing a protecting function of the memory chips 15, 15.

(Twenty-First Embodiment)

Next, in a small-size memory card according to a twenty-first embodiment of the present invention, memory chips 15, ..., 15 are pressure-bonded and fixed to both the front and back faces of the memory board 21 so that the positions of the memory chips 15, ..., 15 disposed on both the front and back faces of the memory board 21 are approximately the same.

Figure 68:
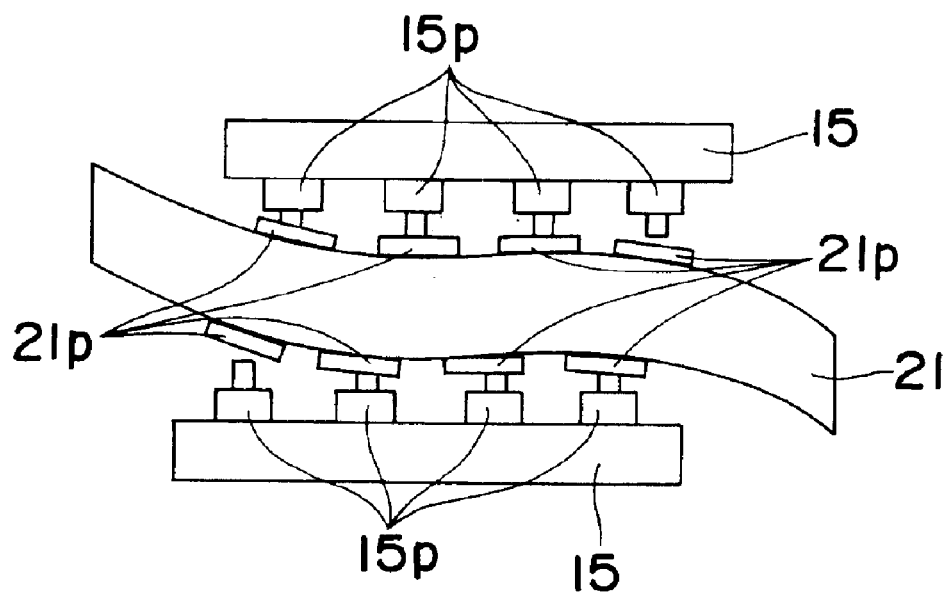
FIG. 68 is an explanatory view showing an issue for explaining a small-size memory card according to a twenty-first embodiment of the present invention.

In the case where layout of electrodes 21p, ..., 21p on the front and back faces of the memory board 21 is out of alignment, ununiformity of load is generated when the memory chips 15, 15 are each pressure-bonded to the front and back faces of the memory board 21, which may cause, for example as shown in a right-end junction portion on the front face side in FIG. 68 and in a left-end portion on the back face side, junction failure between the electrodes 21p of the memory board 21 and the electrodes 15p of the memory chip 15.

Figure 69:
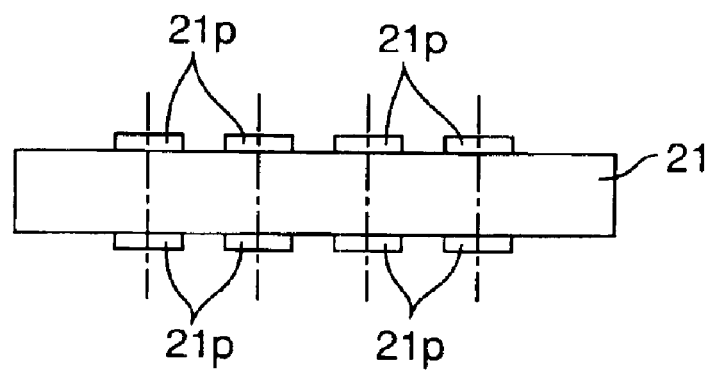
FIG. 69 is a schematic side view showing a memory board of the small-size memory card according to the twenty-first embodiment of the present invention.

In order to prevent generation of such a junction failure between the electrodes, as shown in FIG. 69, the positions of the electrodes 15p, ..., 15p disposed on both the front and back faces of the memory board 21, i.e., the layout, is set approximately the same and the shape thereof is also set the same. More specifically, the centers and the land of the electrodes 21p, ..., 21p of the memory board 21 are designed to be in the same positions and the same shapes. Then, after the memory chip 15 is pressure-bonded and fixed to either one of the front and back faces of the memory board 21 as shown in FIG. 70, the memory chip 15 is pressure-bonded and fixed to the other face of both the front and back faces of the memory board 21 as shown in FIG. 71 so as to make uniform and eliminate deformation of the memory board 21 at the time of pressure bonding and fixing for elimination of junction failure.

Figure 70:
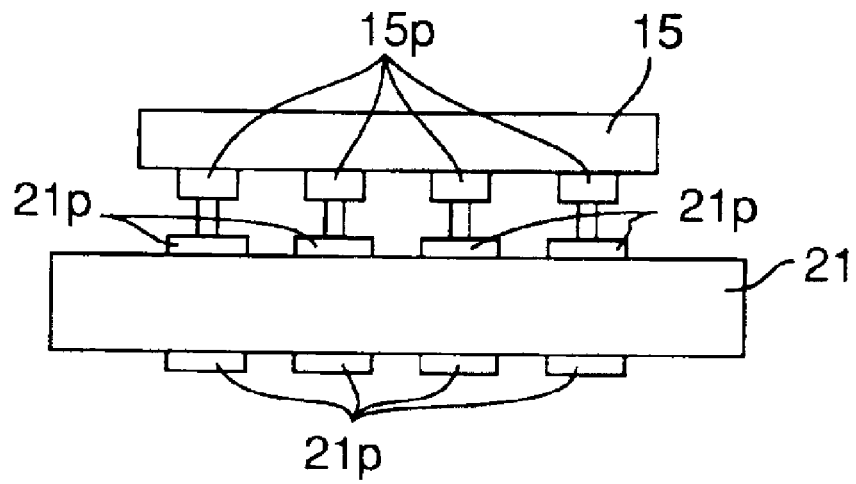
FIG. 70 is a schematic side view showing the state in which a memory chip is mounted on one surface of the memory board of the small-size memory card according to the twenty-first embodiment of the present invention.
Figure 71:
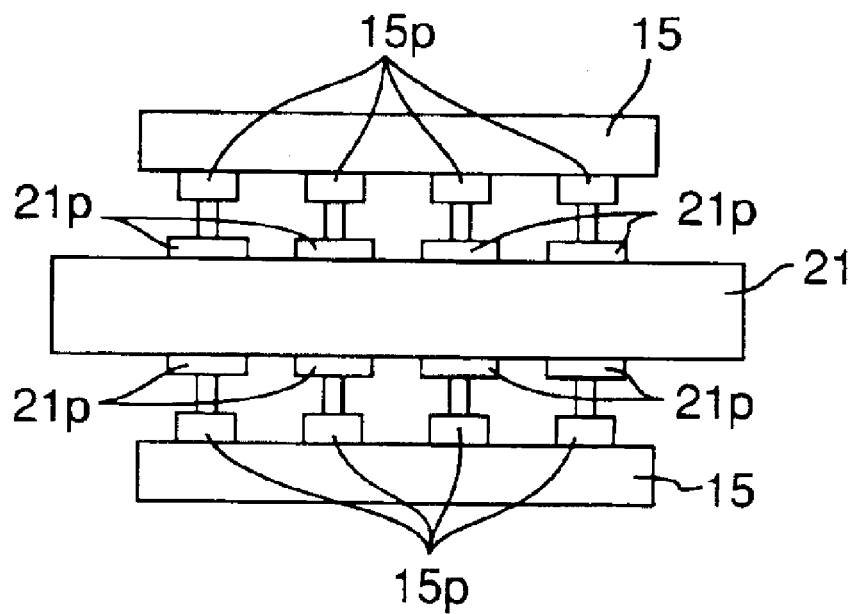
FIG. 71 is a schematic side view showing the state in which memory chips are mounted on both the back and front surfaces of the memory board of the small-size memory card according to the twenty-first embodiment of the present invention.
Figure 72:
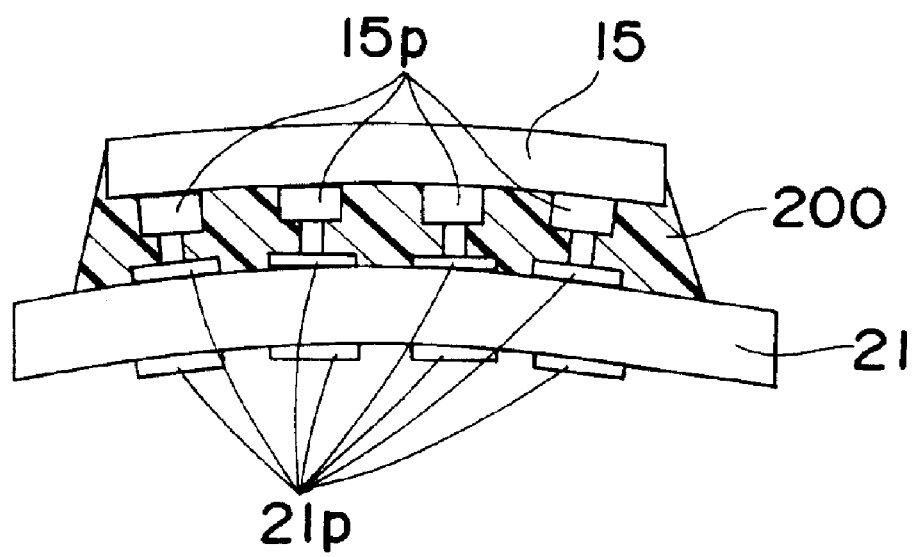
FIG. 72 is a partial cross sectional schematic side view showing the state in which a memory chip is mounted on one surface of the memory board of the small-size memory card and then electrode joint portions are sealed by a sealing resin according to the twenty-first embodiment of the present invention.
Figure 73:
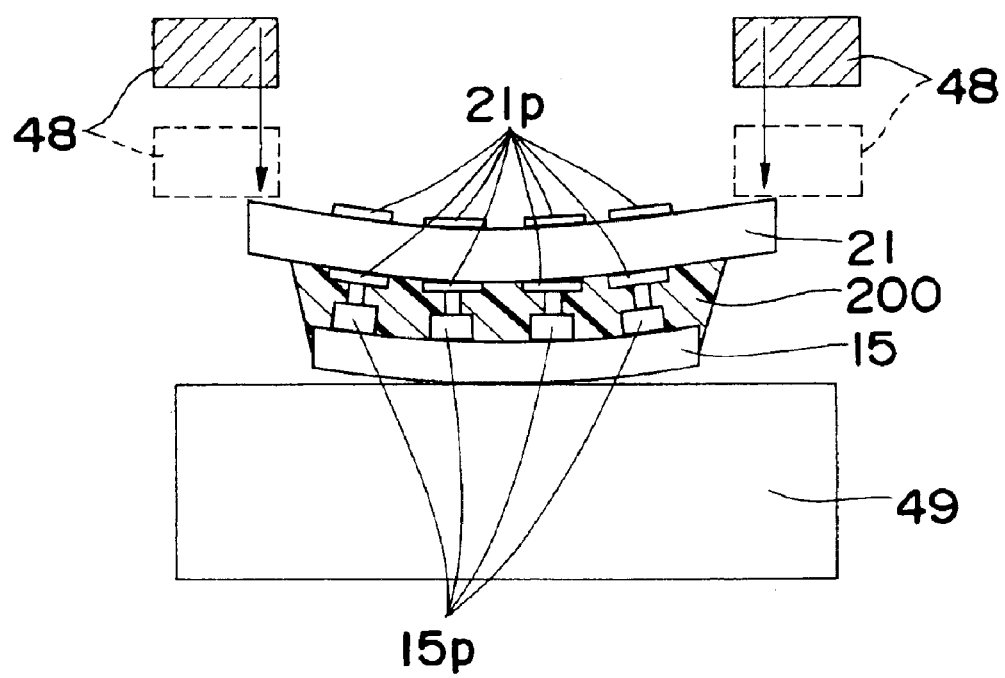
FIG. 73 is a partial cross sectional schematic side view showing the state in which a memory chip is mounted on the other surface of the memory board of the small-size memory card following the step of FIG. 72.
Figure 74:
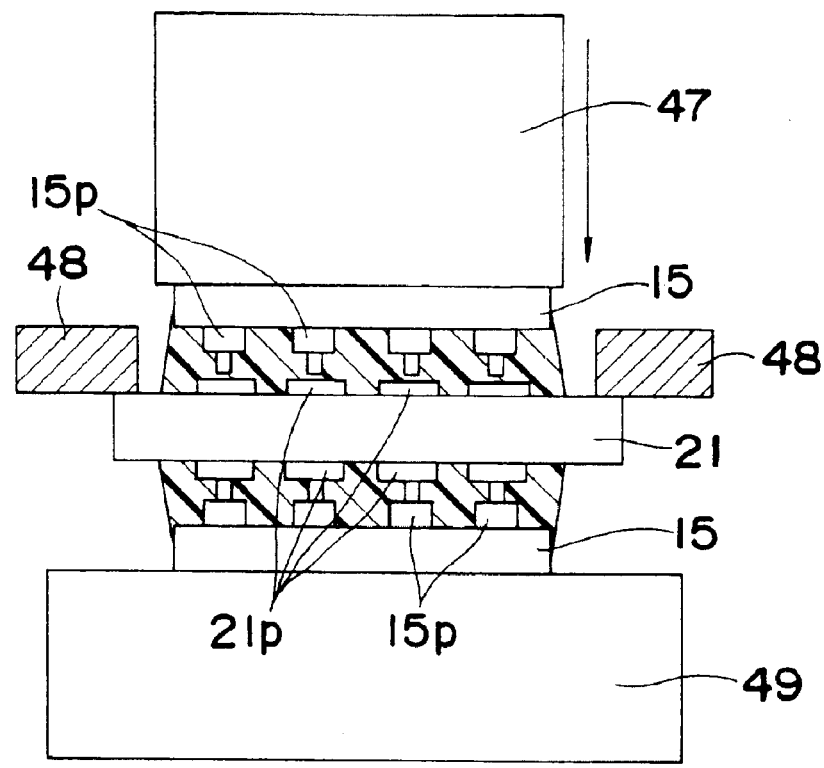
FIG. 74 is a partial cross sectional schematic side view showing the state in which a memory chip is mounted on the other surface of the memory board of the small-size memory card following the step of FIG. 73.
Figure 75:
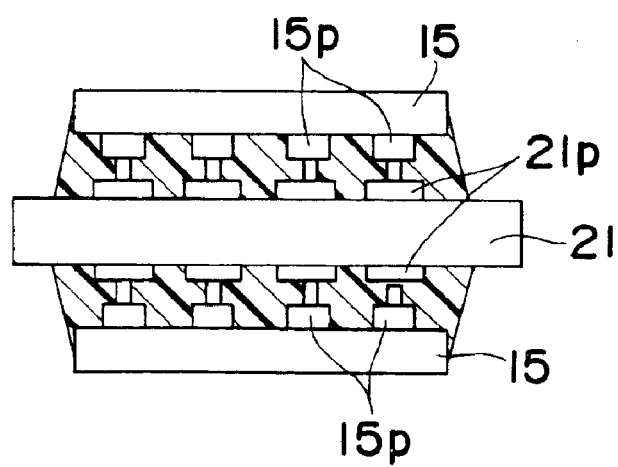
FIG. 75 is a partial cross sectional schematic side view showing the memory board of the small-size memory card manufactured by the step of FIG. 74.

More specifically, the mounting process is such that as shown in FIG. 70, the memory chip 15 is pressure-bonded and fixed to either face of both the front and back faces of the memory board 21. Next as shown in FIG. 72, an insulative sealing resin 200 is filled in between the memory board 21 and the memory chip 15 so as to seal electrode junction portions between the electrodes 15p and the electrodes 21p. Next as shown in FIG. 73, the memory board 21 is placed on a memory board placement stage 49 with the other face of the memory board 21 facing up, and then the surrounding area of the memory board 21 is pressed toward the memory board placement stage 49 by means of a frame-shaped or rod-shaped board fixing jig 48 so as to reform curvature or warp of the memory board 21. In this state, as shown in FIG. 74, with an insulative thermosetting resin sheet being present between the other face of the memory board 21 and the memory chip 15, the memory chip 15 is compression-bonded and fixed to the other face of the memory board 21 while being heated by means of a thermal compression-bonding tool 47, so that the insulative sealing resin 200 is filled in between the memory board 21 and the memory chip 15 for sealing the electrode junction portions between the electrodes 15p and the electrodes 21p as shown in FIG. 75.

Figure 76:
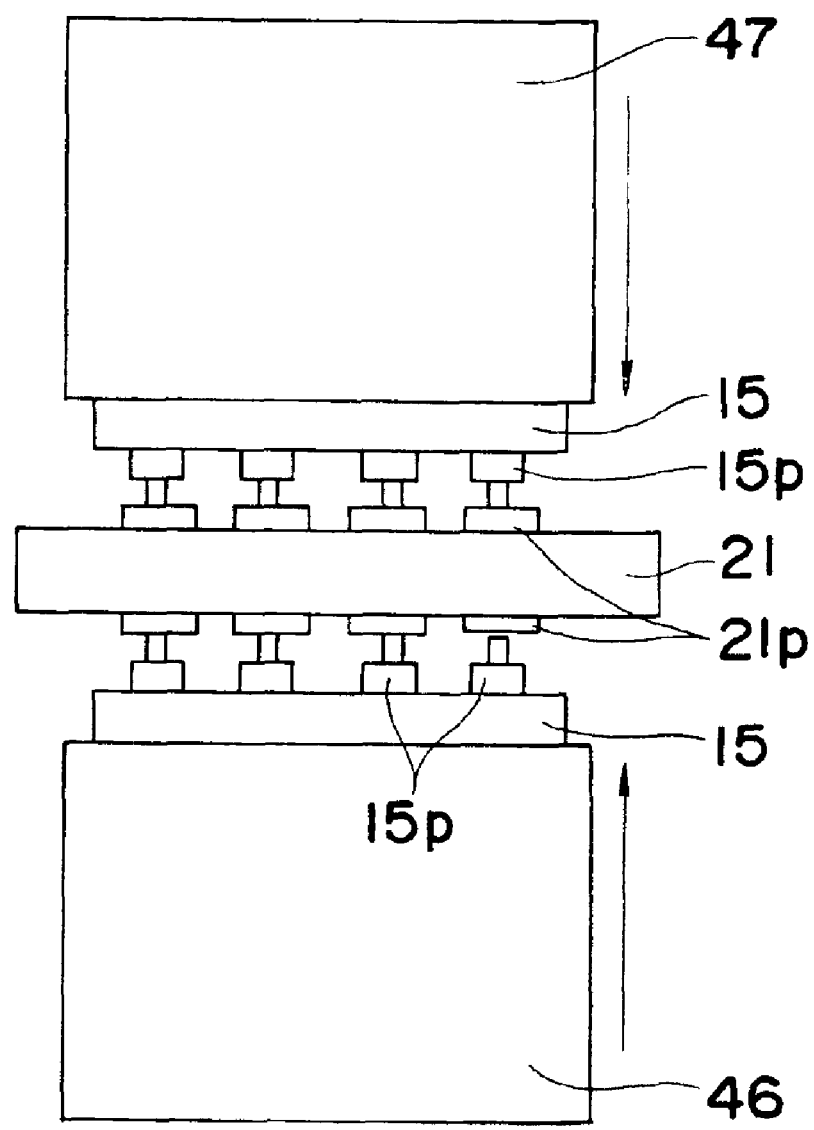
FIG. 76 is a schematic side view showing the state in which memory chips are mounted on both surfaces of a memory board of a small-size memory card by a method other than the methods of FIG. 73 and FIG. 74.

Also, another mounting process is such that as shown in FIG. 70, the memory chip 15 is temporarily fixed to either face of both the front and back faces of the memory board 21. Next, as shown in FIG. 71, the memory chip 15 is temporarily fixed to the other face of both the front and back faces of the memory board 21. Next as shown in FIG. 76, the memory board 21 on which the memory chip 15 is fixed is placed on a thermal compression-bonding tool 46 with the other face of the memory board 21 facing up, and then the thermal compression-bonding tool 46 and the thermal compression-bonding tool 47 are simultaneously driven in directions that make them move close to each other so as to pressure-bond and fix each of the memory chips 15, 15 to the both faces of the memory board 21.

Next, an insulative sealing resin 200 is filled in between one face of the memory board 21 and the memory chip 15 for sealing the electrode junction portions between the electrodes 15p and the electrodes 21p, while an insulative sealing resin 200 is also filled in between the other face of the memory board 21 and the memory chip 15 for sealing the electrode junction portions between the electrodes 15p and the electrodes 21 p.

In such constitution, the positions of the memory chips 15, ..., 15 disposed on both the front and back faces of the memory board 21 are aligned, so that as a result of pressure-bonding of the memory chips 15, ..., 15 to the memory board 21, coefficients of linear expansion on both the front and back faces of the memory board 21 become approximately the same. This makes it possible to cancel the curvatures or warps generated on both the front and back faces of the memory board 21, thereby achieving considerable reduction or elimination of the curvatures or warps of the memory board 21.

(Twenty-Second Embodiment)

A small-size memory card according to a twenty-second embodiment of the present invention is structured such that a junction portion 11p is disposed between the central portion of the memory board 21 and the base board 10 so as to increase reliability of curvature or warp prevention and bending strength of the memory board 21.

Figure 77:
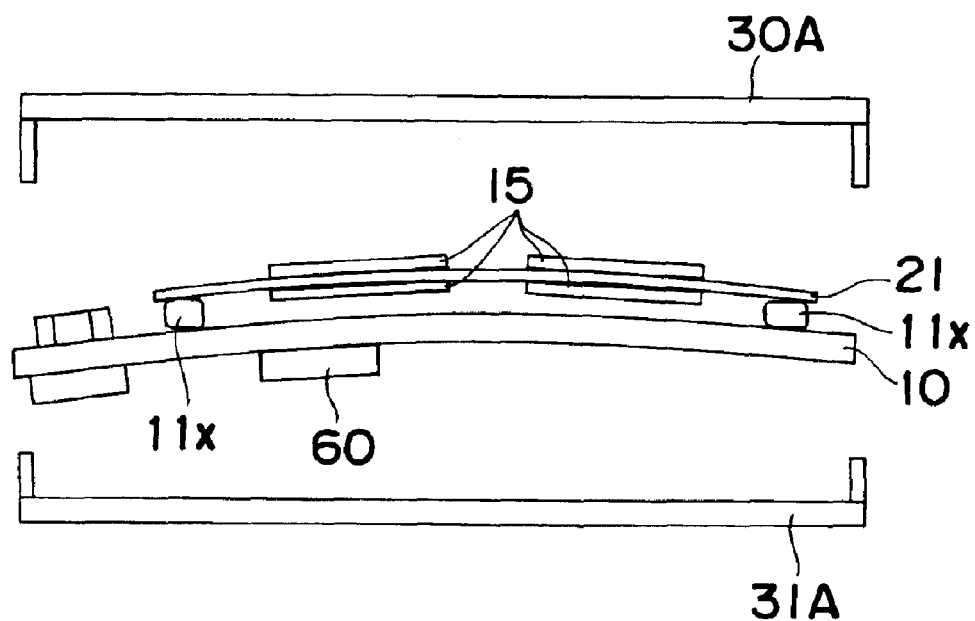
FIG. 77 is an explanatory view showing the state in which a memory board prior to being housed in a case is warped for explaining an issue of a small-size memory card according to a twenty-second embodiment of the present invention.
Figure 78:
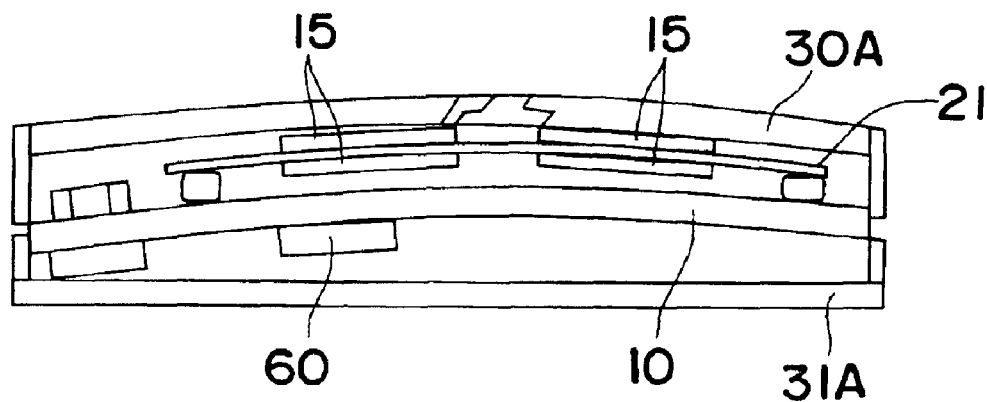
FIG. 78 is an explanatory view showing the state in which the memory board prior to being housed in a case is warped for explaining an issue of the small-size memory card according to a twenty-second embodiment of the present invention.

More particularly, as shown in FIG. 77, when the memory board 21 incorporating two memory chips 15, 15 each on the front and back faces is mounted on the base board 10, only the ends with respect to a longitudinal direction of the memory board 21 are supported by the base board 10 and the central portion of the memory board 21 is not at all supported since the electrodes 41, . . . , 41 of the memory board 21 are disposed along each short side in the vicinity of each short side of the memory board 21. Eventually, due to a difference in the coefficient of linear expansion and thickness between the memory board 21 and the base board 10, the memory board 21 tends to curve. As a result, for example, if the memory board 21 is housed in between upper case 30A and a lower case 31A in the state of being curved upward, the central portion of the memory board 21 comes into contact with the inner face of the upper case 30A, which may cause cracks in the central portion of the upper case 30A as shown in FIG. 78.

Figure 79:
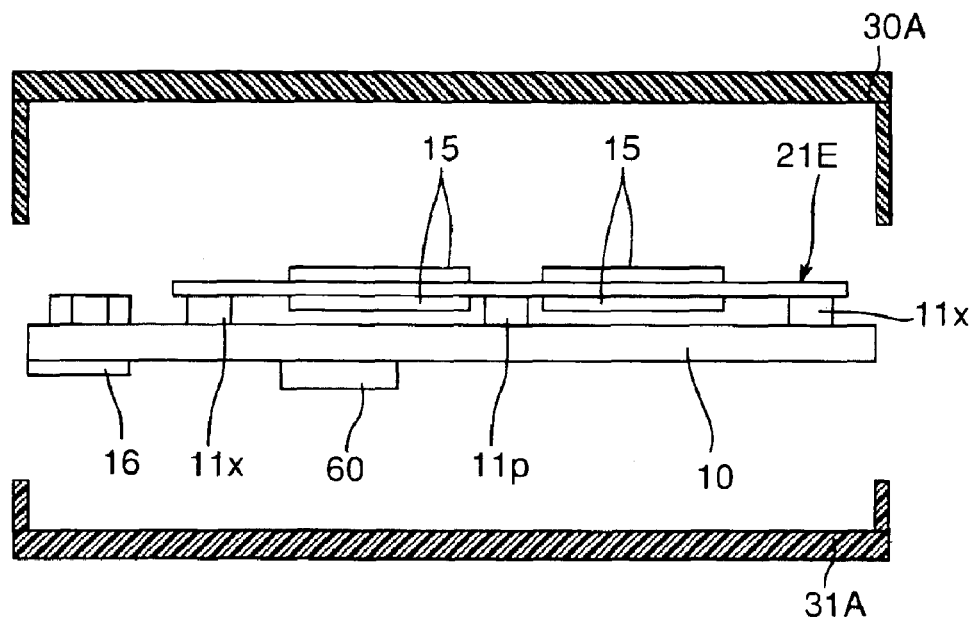
FIG. 79 is an explanatory view showing the state in which a certain space is maintained between a one-layer memory board and a base board prior to being housed in a case for explaining the small-size memory card according to the twenty-second embodiment of the present invention.
Figure 80:
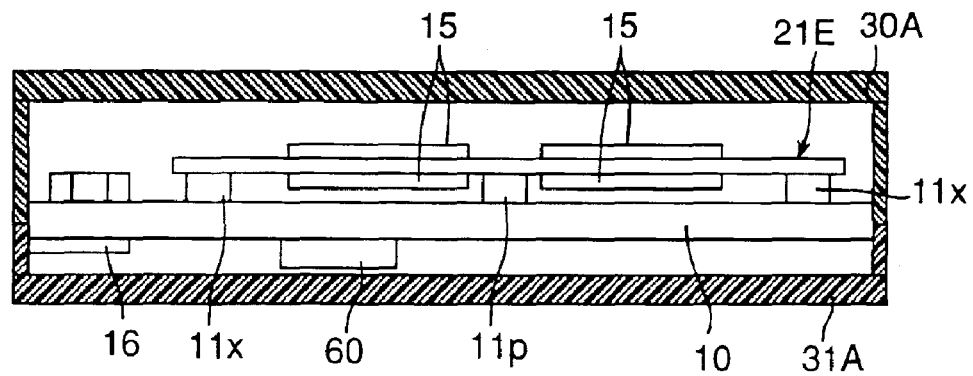
FIG. 80 is an explanatory view showing the state in which a certain space is maintained between the one-layer memory board and the base board after being housed in a case for explaining the small-size memory card according to the twenty-second embodiment of the present invention.

In order to prevent the above, as shown in FIGS. 79, 80, and 87, a junction portion 11p is disposed between the central portion on a longitudinal direction of the memory board 21 and the base board 10 so as to keep a constant space between the memory board 21 and the base board 10 for increasing the reliability of curvature prevention and bending strength of the memory board 21. The requirements for the junction portion 11p are to keep a constant space between the memory board 21 and the base board 10. The junction portion 11p is set to be approximately the same in height as the solder portion 11x, and may be conductive or nonconductive. The shape of the junction portion 11p may be any shape such as a ball shape or a rod shape. The number of junction portions 11p may be either one or two for keeping a constant space between the memory board 21 and the base board 10.

Figure 81:
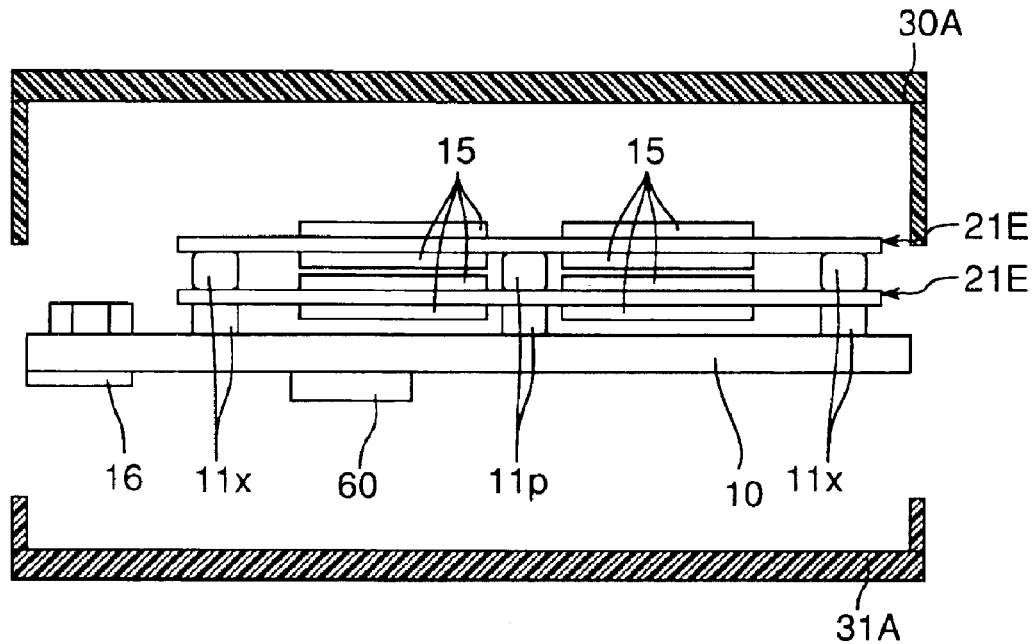
FIG. 81 is an explanatory view showing the state in which a certain space is maintained between two layer memory boards as well as between the lower-side memory board and the base board prior to being housed in a case for explaining the small-size memory card according to the twenty-second embodiment of the present invention.
Figure 82:
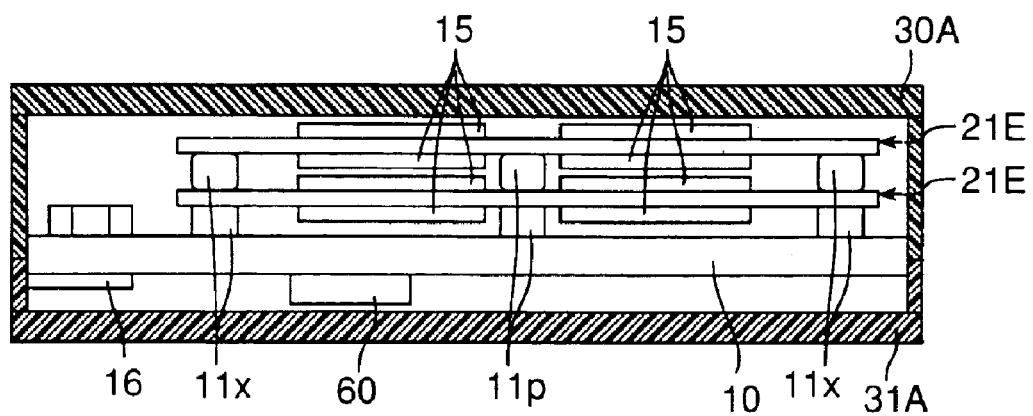
FIG. 82 is an explanatory view showing the state in which a certain space is maintained between the two layer memory boards as well as between the lower-side memory board and the base board after being housed in a case for explaining the small-size memory card according to the twenty-second embodiment of the present invention.

Also, in the case where two-layer memory boards 21, 21 are mounted on the base board 10, as shown in FIG. 81 and FIG. 82, the junction portion 11p is disposed between the lower-side memory board 21 and the base board 10, while the junction portion 11p is also disposed in between the two-layer memory boards 21, 21, so that the space between the memory board 21 and the base board 10 is stably maintained. The space between the memory boards 21, 21 is also stably maintained, resulting in achieving an increase in the reliability of the curvature prevention and the bending strength of the two-layer memory boards 21, 21.

It is noted that in the above embodiment, since the electrodes 41, . . . , 41 are disposed on both the end portions in the longitudinal direction of the memory board 21, the junction portion 11p is disposed in the central portion where the electrodes 41, . . . , 41 are not disposed. However, the present embodiment is not limited thereto. Therefore, the junction portion 11p may be disposed on each of both ends in the longitudinal direction of the memory board 21 in the case where the electrodes 41, . . . , 41 are disposed on the central portion on the longitudinal direction of the memory board 21 as shown in FIG. 33. Also in the case where the electrodes 41, . . . , 41 are disposed on one end on the longitudinal direction of the memory board 21 as shown in FIG. 32, the junction portion 11p may be disposed at the other end of the longitudinal direction of the memory board 21, or at the other end and the central portion. Also, as the junction portion, there may be disposed electrodes 41, . . . , 41 which are electrically connected, or are not electrically connected to other board(s) or do not form a circuit necessary as a small-size memory card.

(Twenty-Third Embodiment)

In a small-size memory card according to a twenty-third embodiment of the present invention, for joining circuits formed on both the front and back faces of the memory board 21, through holes 21q are formed on the memory board 21, and on the inner circumferential faces of the through holes 21g, conductor layers 21r are formed, and further for covering the conductor layers 21r, , synthetic resin resists 21s are disposed. Protruding amounts of the resists 21s to the memory board 21 are set approximately the same as protruding amounts of memory chip junction electrodes 21p.

Figure 83:
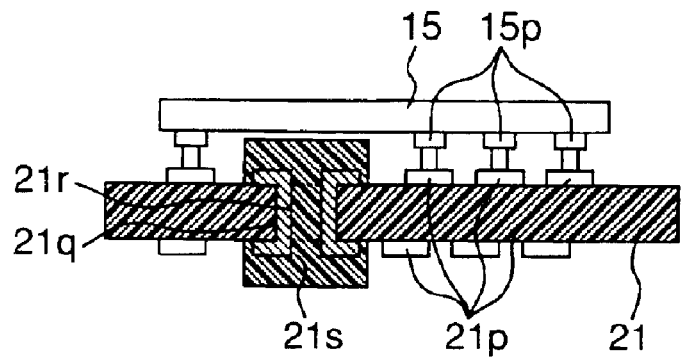
FIG. 83 is a partial cross sectional side view showing the state in which a protruding amount of a resistor for the memory board is larger than protruding amounts of electrodes for joining the memory chips.

More specifically, as shown in FIG. 83, protruding amounts of the resists 21s of the memory board 21 are larger than protruding amounts of other electrodes, i.e., protruding amounts of the memory chip junction electrodes 21p , in some cases. In such a case, when the memory chip 15 is pressure-bonded to the memory board 21, loads acting upon the memory board 21 become ununiform due to differences in protruding amounts between the resists 21s and the memory chip junction electrodes 21p. This may cause, for example as shown in a right-end junction portion on the front face side in FIG. 68 and in a left-end portion on the back face side, a junction failure between the memory chip junction electrodes 21p and the electrodes 15p of the memory chip 15.

Figure 84:
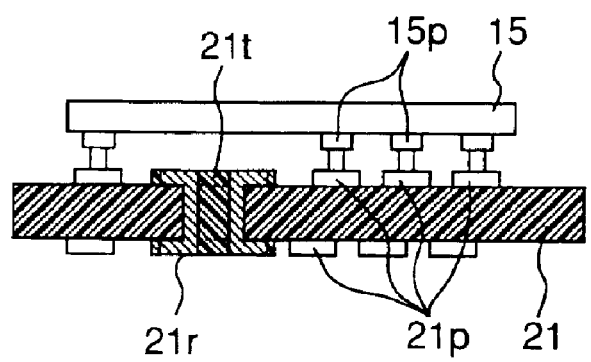
FIG. 84 is a partial cross sectional side view showing a memory board of a small-size memory card according to a twenty-third embodiment of the present invention.

Here, by grinding the resists 21s or the like, as shown in FIG. 84, there are formed resists 21t having protruding amounts whose heights are approximately identical to those of protruding amounts of the electrodes 15p of the memory chip 15. Consequently, the heights of protruding amounts of the electrodes 15p of the memory chip 15 become approximately identical to the heights of the protruding amounts of the resists 21t, by which when the memory chip 15 is pressure-bonded to the memory board 21, loads acting upon the memory board 21 become uniform, thereby achieving prevention of junction failure between the electrodes 21p of the memory board 21 and the electrodes 15p of the memory chip 15.

Figure 85:
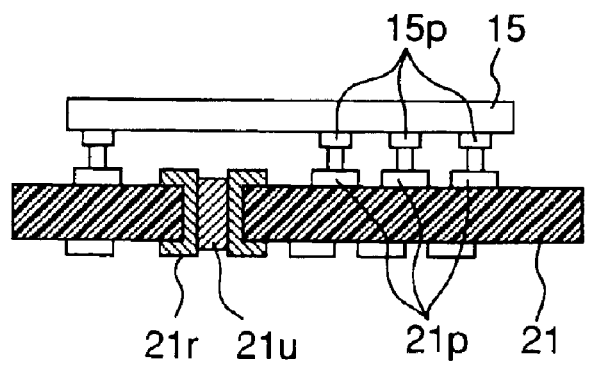
FIG. 85 is a partial cross sectional side view showing a memory board of a small-size memory card according to a modified example in the twenty-third embodiment of the present invention.

Also, as a modified example of the twenty-third embodiment, as shown in FIG. 85, the inside of the conductor layers 21r, of the through holes 21q in the memory board 21 may be filled by plating to form plated portions 21u that do not protrude from the openings of the conductor layers 21r, . In such a constitution, since the plated portions 21u are smaller than protruding amounts of the electrodes 15p of the memory chip 15, loads acting upon the memory board 21 become uniform when the memory chip 15 is pressure-bonded to the memory board 21, thereby enabling prevention of junction failure between the electrodes 21p of the memory board 21 and the electrodes 15p of the memory chip 15.

(Twenty-Fourth Embodiment)

Figure 95:
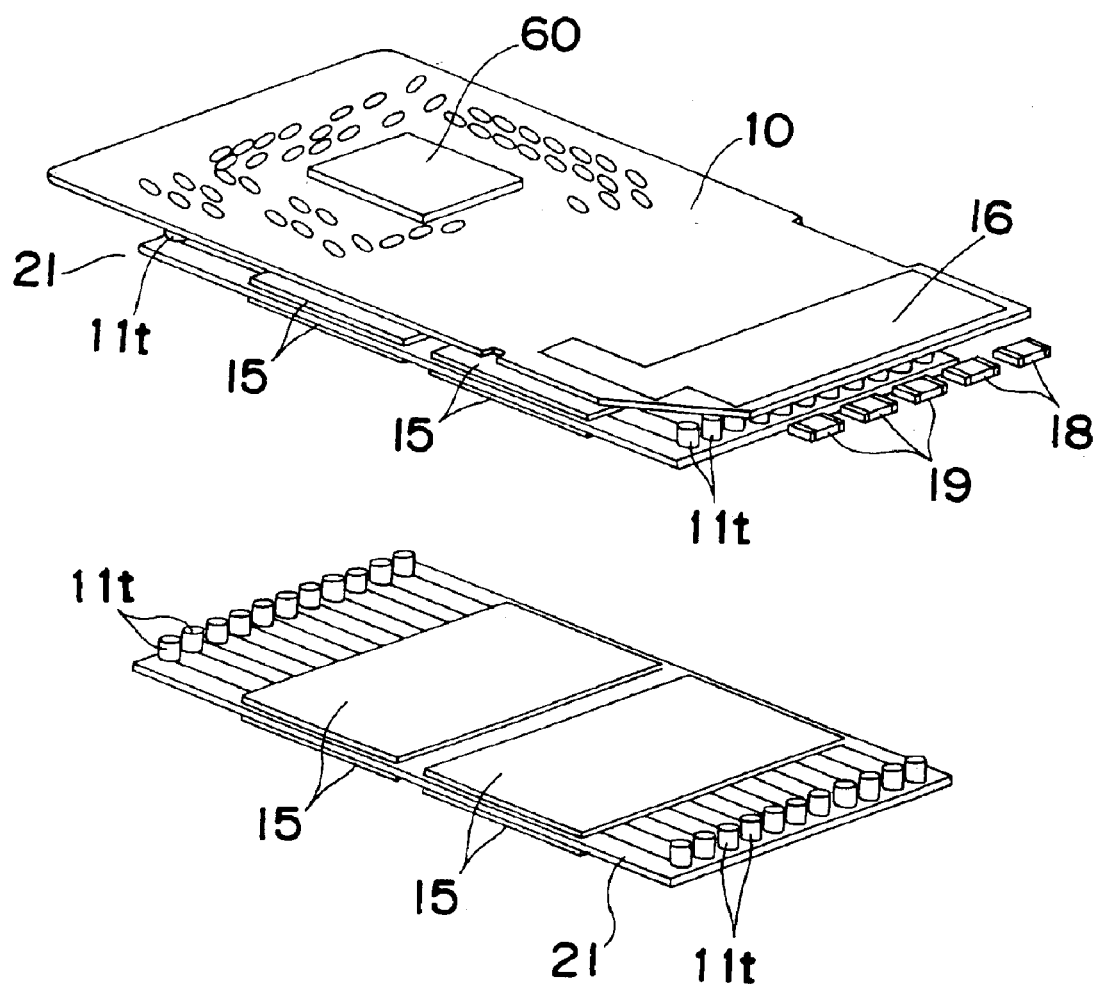
FIG. 95 is an exploded perspective view showing a small-size memory card according to a twenty-fourth embodiment of the present invention.
Figure 100:
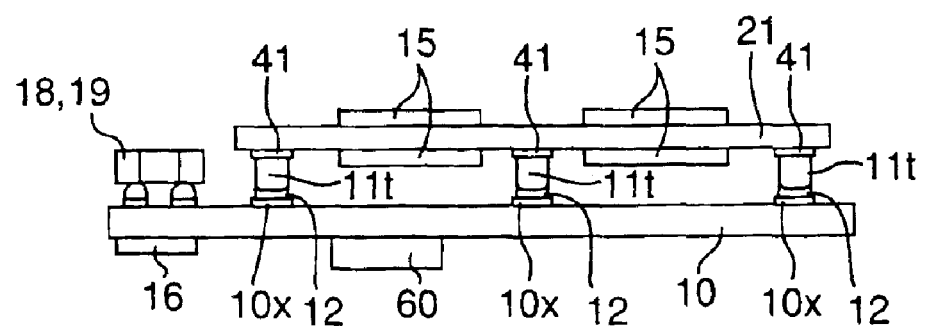
FIG. 100 is an explanatory view showing a process in the method for manufacturing the small-size memory card following the process of FIG. 99 according to the twenty-fourth embodiment of the present invention.

A small-size memory card according to a twenty-fourth embodiment of the present invention is structured such that a conductor for electrically connecting the boards (such as the conductive wires 11, 53, the conductive ball 71, and the solder portion 11x) is not disposed on the memory board 21, but as shown in FIG. 95 and FIG. 100, protruding electrodes 11t, . . . , 11t are integrally formed on the electrodes 41, . . . , 41 so as to eliminate the necessity of disposing the conductor. It is noted that a description will be given of the case where in a manufacturing process the protruding electrodes 11t, , . . . , 11t, are fixed onto the electrodes 41, . . . , 41 of the memory board 21. However in the manufacturing process, the protruding electrodes 11t, . . . , 11t may be fixed onto electrodes 10, . . . , 10 of the base board 10.

The height of each protruding electrode 11t is equal to or larger than the thickness of the memory chip 15, and the protruding electrodes 11t are integrally formed by plating on the electrodes 41, . . . , 41 of the memory board 21.

A Description will be herein given of a method for manufacturing the small-size memory card with use of the protruding electrodes 11t, . . . , 11t.

First, before describing the method for manufacturing the small-size memory card with use of the protruding electrodes 11t, . . . , 11t, a method for manufacturing a small-size memory card without use of the protruding electrodes 11t, . . . , 11t will be described for comparison.

Figure 88:
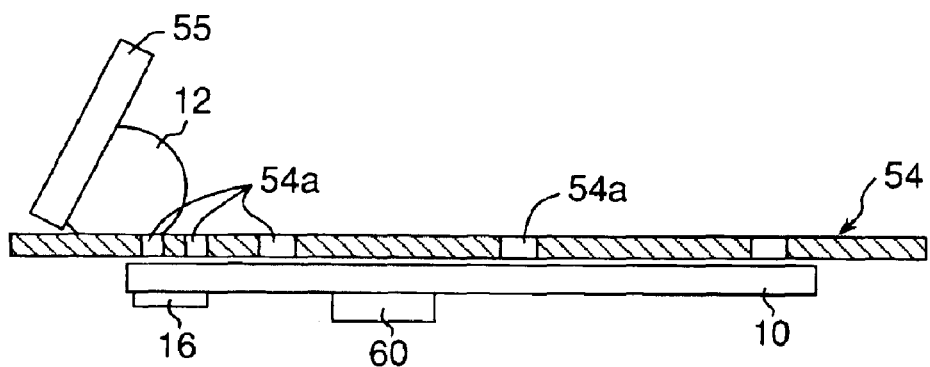
FIG. 88 is an explanatory view showing a process in a method for manufacturing a small-size memory card without using a protruding electrode in the above embodiment of the present invention.
Figure 89:
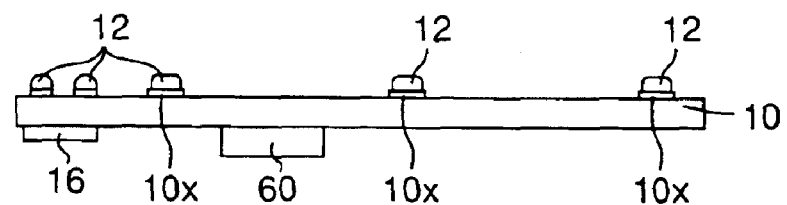
FIG. 89 is an explanatory view showing a process in the method for manufacturing the small-size memory card without using a protruding electrode following the process of FIG. 88 in the above embodiment of the present invention.

First, as shown in FIG. 88, solder paste is fed by printing to the base board 10 of the base board module 210. More specifically, a stencil 54 having a through hole corresponding to each through hole 10a of the base board 10, i.e., a solder paste insertion hole 54a is put on top of the base board 10 of the base board module 210, and a squeegee 55 is moved while moving solder paste 12 on the stencil 54. Then, the solder paste 12 is inserted so as to be pressed into each through hole 10a of the base board 10 from each solder paste insertion hole 54a of the stencil 54, so that the solder paste 12 is disposed on the electrodes 10x as shown in FIG. 89. Here, in each through hole 10a of the base board 10, the solder paste 12 is set to slightly protrude from the base board 10 in a thickness direction of the base board 10. This is for holding conductive balls (such as solder balls and copper balls) on the respective solder pastes 12 more stably by adhesive strength of the solder paste 12 itself in later process. It is noted that the solder paste may be fed by a dispenser instead of by printing.

Figure 90:
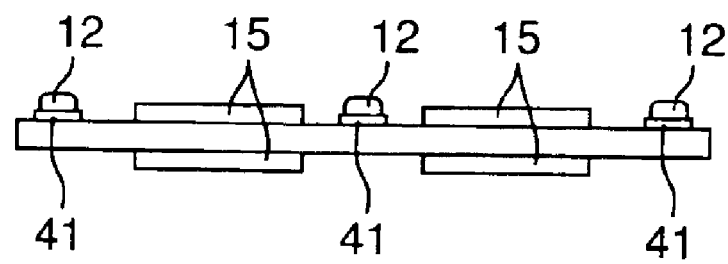
FIG. 90 is an explanatory view showing a process in the method for manufacturing the small-size memory card without using a protruding electrode following the process of FIG. 89 in the above embodiment of the present invention.

At the same time or after that, similar to the above step, the solder paste 12 is inserted so as to be pressed in each through hole of the memory board 21 of the memory board module so that the solder paste 12 is disposed on the electrodes 41 as shown in FIG. 90. It is noted that the solder paste may be fed by a dispenser instead of by printing.

Figure 91:
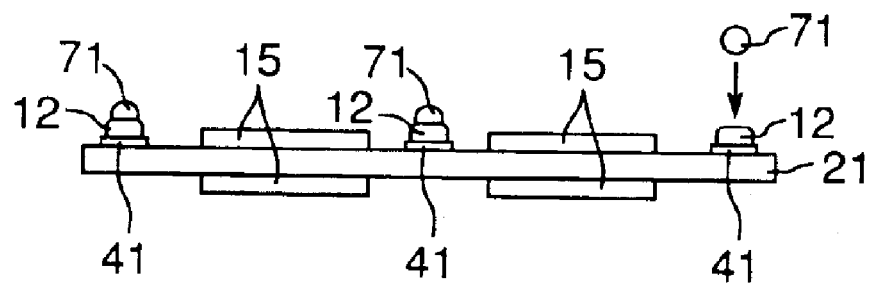
FIG. 91 is an explanatory view showing a process in the method for manufacturing the small-size memory card without using a protruding electrode following the process of FIG. 90 in the above embodiment of the present invention.

Next, as shown in FIG. 91, a conductive ball 71 is fed one by one onto the electrode of each solder paste 12 on the memory board 21 of the memory board module. When each conductive ball 71 is placed on the solder paste 12, the position thereof is kept in the state of being slightly sunk in the solder paste 12 by the adhesive strength of the solder paste 12 itself.

Figure 92:
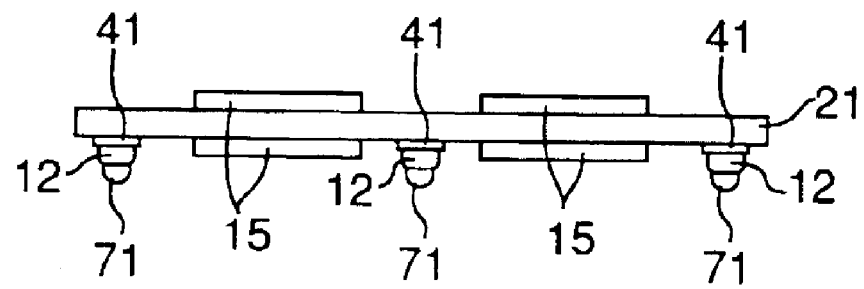
FIG. 92 is an explanatory view showing a process in the method for manufacturing the small-size memory card without using a protruding electrode following the process of FIG. 91 in the above embodiment of the present invention.
Figure 93:
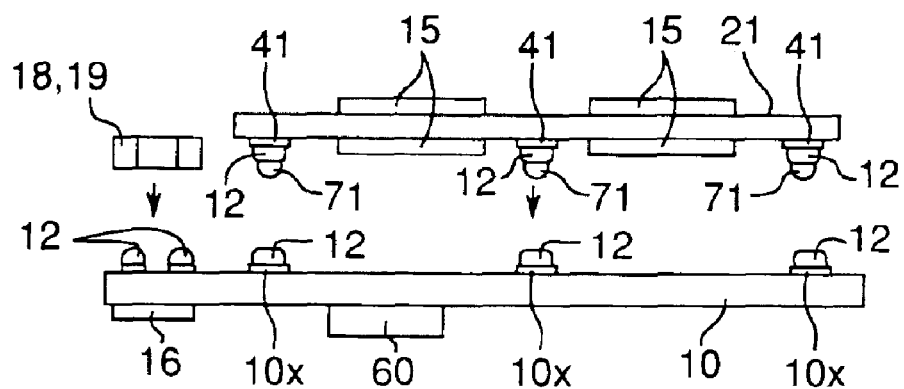
FIG. 93 is an explanatory view showing a process in the method for manufacturing the small-size memory card without using a protruding electrode following the process of FIG. 92 in the above embodiment of the present invention.
Figure 94:
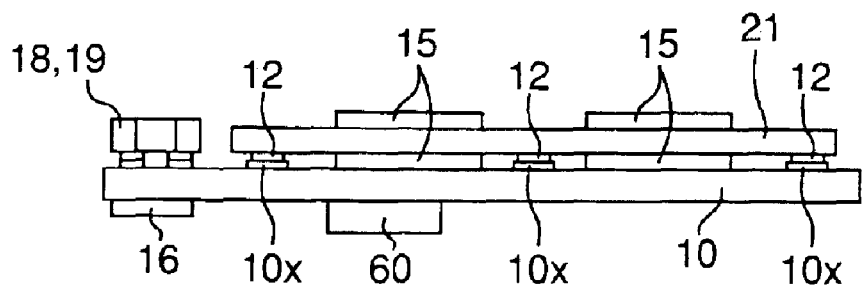
FIG. 94 is an explanatory view showing a process in the method for manufacturing the small-size memory card without using a protruding electrode following the process of FIG. 93 in the above embodiment of the present invention.

Next, after the memory board 21 is turned over as shown in FIG. 92, the positions of the base board 10 and the memory board 21 are determined such that each solder paste 12 of the base board 10 corresponds to each conductive ball 71 of the memory board 21. Next, as shown in FIG. 93, the memory board 21 having conductive balls 71, . . . , 71 is overlapped with the base board 10 and laminated, and with action of certain pressure, a part of each conductive ball 71 of the memory board 21 is inserted into the solder paste 12 of the base board 10. Consequently, the base board 10 and the memory board 21 are positioned and held approximately parallel to each other as shown in FIG. 94. It is noted that in FIG. 94, each conductive ball 71 and the electrode 41 on the side of the memory board 21 are in the state of being embedded in the solder paste 12.

Thus, the small-size memory card without use of the protruding electrodes 11t, . . . , 11t is manufactured. However feeding of the conductive balls 71, . . . , 71 needs labor and time, and when a pitch between the electrodes 41, 41 is smaller, e.g., 0.3 mm or less, a short circuit caused by contact between the solders 12 in the process of joining the boards may occur. For secure prevention of the short circuit, the protruding electrodes 11t, . . . , 11t are preferably used. The following description discusses the method for manufacturing the small-size memory card with use of the protruding electrodes 11t, , . . . , 11t.

First, similar to FIG. 88 and FIG. 89, solder paste 12 is disposed on each electrode 10x on the side of the base board 10.

Figure 96:
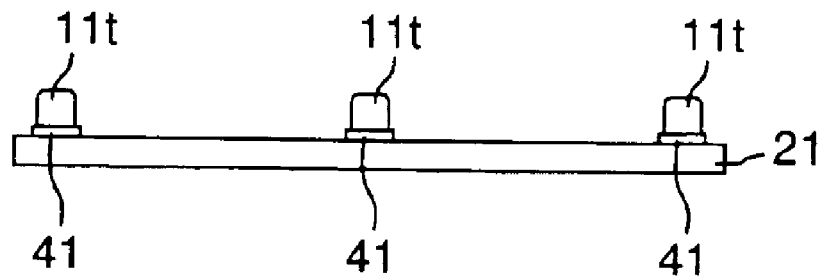
FIG. 96 is an explanatory view showing a process in a method for manufacturing the small-size memory card according to the twenty-fourth embodiment of the present invention.
Figure 97:
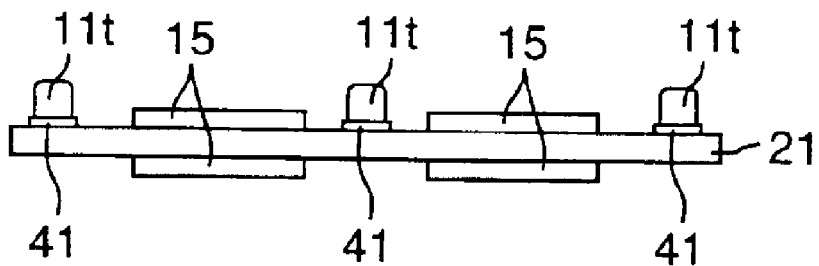
FIG. 97 is an explanatory view showing a process in the method for manufacturing the small-size memory card following the process of FIG. 96 according to the twenty-fourth embodiment of the present invention.
Figure 98:
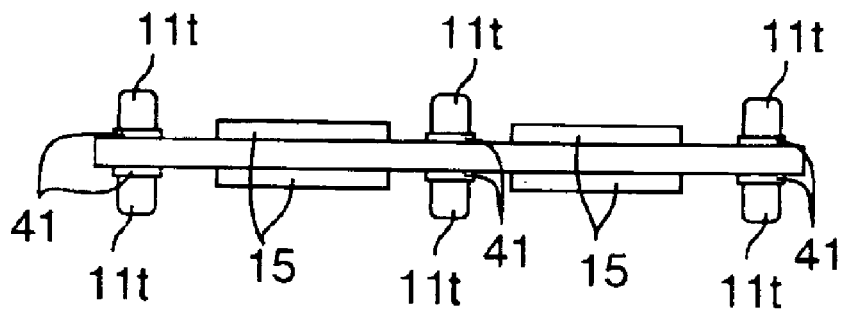
FIG. 98 is an explanatory view showing a process in the method for manufacturing the small-size memory card following the process of FIG. 97 according to the twenty-fourth embodiment of the present invention.

Next, as shown in FIG. 96, a protruding electrode 11t is formed by plating and the like on each electrode 41 of the memory board 21. After that, as shown in FIG. 97, memory chips 15, . . . , 15 are mounted on the memory board 21. It is noted that in the case of mounting two-layer memory boards 21 on the base board 10, a protruding electrode 11t is formed by plating and the like on each electrode 41 on both faces of a lower-side memory board 21 as shown in FIG. 98.

Figure 99:
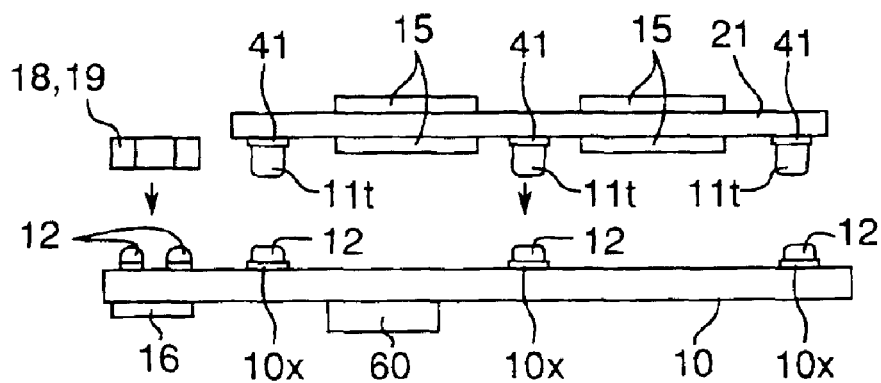
FIG. 99 is an explanatory view showing a process in the method for manufacturing the small-size memory card following the process of FIG. 98 according to the twenty-fourth embodiment of the present invention.

Next, as shown in FIG. 99, the positions of the base board 10 and the memory board 21 are determined such that the protruding electrode 11t on each electrode 41 of the memory board 21 corresponds to each electrode 10x of the base board 10. Next, the memory board 21 is overlapped with the base board 10 and laminated, and with the application of certain pressure, a part of each protruding electrode 11t of the memory board 21 is inserted into the solder paste 12 on each electrode 10x of the base board 10. Consequently, the base board 10 and the memory board 21 are positioned and held approximately parallel to each other as shown in FIG. 100.

In such a constitution, the conductive balls 71, . . . , 71 are no longer required, and labor and time for feeding the conductive balls 71, . . . , 71 are eliminated. Further, even if a pitch between the electrodes 41, 41 is smaller, e.g., 0.3 mm or less, the protruding electrode 11t of the memory board 21 is just slightly inserted into the solder 12 of the base board 10, and so the solder 12 will not largely flow out to the outside, as a consequence of which short circuit due to contact between the solders 12 in the process of joining the boards may be prevented.

In each of the above embodiments, each through hole 10a of the base board 10, each through hole 21a of the first memory board 21, and each through hole 22a of the second memory board 22 may be positioned arbitrarily such as along the vicinity of a long side along a lengthwise direction of each board, along the vicinity of a short side along a width direction orthogonal to the lengthwise direction of each board, or in a rectangular shape along the vicinity of the long and short sides.

Also in each of the above embodiments, solders may be provided to each through hole 10a of the base board 10, each through hole 21a of the first memory board 21, and each through hole 22a of the second memory board 22 either by means of a dispenser, or by printing, or by other methods (not illustrated).

Also in each of the above embodiments, a conductive adhesive may be used instead of the solder paste 12. The conductive adhesive may contain fillers. The solder paste 12 normally needs to be heated up to 250° C. to be melted and hardened. However, in the case of using the conductive adhesive, heating to 150° C. is sometimes sufficient, and in such case, heating temperature may be set lower than that of the solder, thereby enabling reduction of warping of each board.

Also in each of the above embodiments, the conductive wire and the conductive ball may be used in combination. Instead of these, or with either or both of them, pillar-shaped conductive members such as solders or copper may be used (not illustrated).

Also in each of the above embodiments, when a plurality of the memory chips 15 are mounted on either the top or bottom face of each board, insulative or conductive wires, insulative or conductive pillars, or insulative or conductive balls may be disposed between a plurality of the memory chips 15 in the area not in contact with electrode(s), for securing an inter-board space or for reinforcement (not illustrated).

In each of the above embodiments, the conductive ball 71, the conductor, or the rectangular parallelepiped chip electronic component 80 may be used in place of the conductive wire 11.

Also in the above embodiment, when the film boards are used, materials of the film boards may include polyimide, whereas boards made of single-layered glass epoxy resin as thick as about 0.1 mm are also applicable.

It is understood that a proper combination of arbitrary embodiments among the above-described various embodiments enables implementation of effects of each embodiment.

According to the present invention, the memory module which is so constructed that the plurality of memory chips are mounted on the memory board is mounted on the one (first) face of the base board, so that the memory board(s) that can accommodate the memory chips on both faces may be disposed on the base board in a small space with a small pitch, and therefore the memory chip mountable area in the case of mounting the memory chips on both the front and back surfaces of the memory board is twice as large as that in the case of mounting the memory chips on either one surface of the base board, thereby enabling increase of memory capacity.

Also, connecting the electrodes of each board via the conductive wires enables improvement of connection strength between the electrodes.

In addition, each memory chip is directly mounted on each board without outer leads, that is, flip chip-mounted thereon. In other words, each electrode of each memory chip and each electrode of each board are directly joined via a bump or the like, so that space and labor for drawing outer leads out of each memory chip and joining the same to each board may be saved, thereby enabling a decrease of necessary space and process.

In addition, on both the front and back faces of the memory board, the plurality of memory chips having the same size and thickness may be mounted at the same position, which makes it possible to prevent the memory board from warping toward one side when thermal or mechanical stress is applied against the board due to, for example, hardening and contraction of sealing resin. Further, on the memory board, the plurality of the memory chips may be disposed symmetrically with respect to the center of the lengthwise direction of the memory board, which makes it possible to prevent biased-stress distribution over the memory board as a whole.

Also, the memory module with the memory chips mounted may be constructed as an individual component different from the base board. Consequently, if one memory chip is determined to be defective during the burn-in process, only the memory module may be abandoned, and therefore it is not necessary to abandon the base board with an IC chip mounted thereon.

According to the method for manufacturing the small-size memory card, in the case of the plurality of memory modules present, the memory modules are assembled in advance before being mounted on the base board module, which enables examination of the function as entire memory modules through burn-in test and the like. Consequently, in the case of occurrence of defects, only a defected memory module may be abandoned and the base board module that is expensive compared to the memory module is not required to be abandoned, resulting in reduction of costs.

The conductive ball(s) is interposed between the base board and the memory board, which facilitates equalization of the space between the respective boards, and enables approximately parallel disposition of the respective boards. Also, constituting the conductive ball with a material having a melting point higher than that of solders such as copper prevents the conductive ball from melting in the post-processing that melts the solders by reflow and air blow, thereby making it possible to secure an inter-board space with use of the conductive ball, and to keep parallelism between the boards with high accuracy. Since the distance between the boards is supported by the conductive ball, the conductive ball is not easily deformed by mechanical stress applied. Consequently, against thermal stress and mechanical stress, the parallelism between the boards may be secured, and contact with adjacent conductive balls may be prevented, which prevents short-circuit. Further, smaller diameter of the conductive ball enables the conductive balls to be disposed with a smaller pitch, which enlarges the degree of freedom of wiring, and enables individual wiring to each memory chip, thereby improving processing speed between the memory chip and the IC chip.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A card-type recording medium comprising:
   a base board;
   a memory module including memory chips flip chip-mounted on both front and back surfaces of a memory board and insulative sealing resin arranged to seal bonding portions of said memory chips, said memory module being mounted on a first surface of said base board; and
   an IC chip for controlling an operation of said plurality of memory chips, said IC chip being mounted on a second surface of said base board, and wherein said base board, said memory module, and said IC chip are housed in a package.

2. The card-type recording medium of claim 1, further comprising a plurality of memory modules each having a respective memory board, said memory chips being flip chip-mounted on said respective memory board of said memory modules, said insulative sealing resin being arranged to seal bonding portions of said memory chips.

3. A method of manufacturing the card-type recording medium of claim 2, comprising:
   flip chip-mounting memory chips on both front and back surfaces of a first memory board;
   sealing bonding portions of the memory chips on the first memory board with the insulative sealing resin;
   flip chip-mounting memory chips on a second memory board;

sealing bonding portions of the memory chips on the second memory board with the insulative sealing resin;

laying the first memory board on the first surface of said base board;

laying the second memory board on the first memory board; and electrically connecting an electrode of the base board and electrodes of the first memory board and the second memory board using one conductor so as to electrically connect the electrodes in a direction orthogonal to a memory board mounting face of said base board.

4. The method of claim 3, wherein the conductor is a conductive wire.

5. The method of claim 3, wherein the conductor is a conductive ball.

6. The card-type recording medium of claim 1, wherein at least one of said memory chips is flip chip-mounted on said first surface of said base board.

7. The card-type recording medium of claim 1, wherein said memory module comprises a first memory module and a second memory module, said first memory module being mounted on said base board and said second memory module being mounted on said first memory module, said memory chips being flip chip-mounted on front and back surfaces of a respective memory board of at least one of said first memory module and said second memory module, insulative sealing resin being arranged to seal bonding portions of said memory chips; and wherein one conductor electrically connects an electrode of said base board, an electrode of a memory board of said first memory module, and an electrode of a memory board of said second memory module in a direction orthogonal to a memory board mounting face of said base board.

8. The card-type recording medium of claim 7, wherein said one conductor is a conductive wire.

9. The card-type recording medium of claim 7, wherein said one conductor is a conductive ball.

10. The card-type recording medium of claim 7, wherein said one conductor is a conductive pin inside an insulative resin sheet.

11. The card-type recording medium of claim 7, wherein said one conductor is a rectangular parallelepiped electronic component including electrically-interconnected electrodes on top and bottom faces at each end thereof.

12. The card-type recording medium of claim 7, wherein said memory module comprises a first memory module and a second memory module;

said one conductor is a conductive electrode ball passing through through-holes of the first memory module, an upper portion of said conductive electrode ball being electrically connected to an electrode of a respective memory board of said second memory module, and a lower portion of said conductive electrode ball being electrically connected to an electrode of said base board.

13. The card-type recording medium of claim 1, wherein said memory module includes three adjacent memory boards, and one conductor electrically connects electrodes of said three memory boards to each other in a direction orthogonal to a memory chip mounting face of said memory boards.

14. The card-type recording medium of claim 1, wherein said memory chips are arranged symmetrically with respect to a longitudinal centerline of said memory board.

15. The card-type recording medium of claim 1, wherein each of said front and back surface of said memory board has at least one of said memory chips mounted thereon so that said at least one of said memory chips mounted on each of said front and back surface of said memory board oppose each other via said memory board.

16. The card-type recording medium of claim 15, wherein said at least one of said memory chips mounted on each of said front and back surface of said memory board so as to oppose each other via said memory board shaped are generally identical to each other.

17. The card-type recording medium of claim 1, wherein said memory board is a film board.

18. The card-type recording medium of claim 1, wherein said memory board and said base board constitute one film board.

19. A method of manufacturing the card-type recording medium of claim 1, comprising:

flip chip-mounting memory chips on both front and back surfaces of said memory board;

sealing bonding portions of the memory chips on the memory board with the insulative sealing resin;

laying the memory board on the base board; and electrically connecting an electrode of the base board and an electrode of the memory board with one conductor so as to electrically connect the electrodes in direction orthogonal to a memory board mounting face of the base board.

20. The method of claim 19, wherein the conductor is a conductive wire.

21. The method of claim 19, wherein the conductor is a conductive ball.

22. The card-type recording medium of claim 1, wherein said memory board is rectangular and each of said memory chips is rectangular, said rectangular memory chips being arranged such that a long side of each of said rectangular memory chips is approximately parallel to at least one short side of said rectangular memory board, and an electrode to be connected to an electrode of said base board is located along said at least one short side of said memory board.

23. The card-type recording medium of claim 22, wherein said electrode to be connected to said electrode of said base board is located among said memory chips on a first surface of said memory board so as to be approximately parallel to said short side of said memory board.

24. The card-type recording medium of claim 1, further comprising a reinforcing portion made of insulative reinforcing resin arranged between said memory board and said base board.

25. The card-type recording medium of claim 24, wherein a thickness of said insulative reinforcing resin is equal to or larger than a thickness of each of said memory chips.

26. The card-type recording medium of claim 1, further comprising:

a plurality of memory modules each having a respective memory board, said memory chips being flip chip-mounted on a respective memory board of said memory modules; and a reinforcing portion made of insulative reinforcing resin arranged between said memory modules.

27. The card-type recording medium of claim 1, further comprising a reinforcing portion made of insulative reinforcing resin between an inner surface of said package and said memory board.

28. The card-type recording medium of claim 1, further comprising a reinforcing portion made of insulative reinforcing resin between an inner surface of said package and said base board.

29. The card-type recording medium of claim 1, further comprising a junction portion shaped and arranged to maintain a constant space between said memory board and said base board.

30. The card-type recording medium of claim 1, further comprising a protruding electrode connecting an electrode of said base board and an electrode of said memory board, said protruding electrode protruding from either of said electrode of said base board and said electrode of said memory board.

31. A card-type recording medium comprising:

a base board;

laminated memory modules including memory chips flip chip-mounted on memory boards, said memory modules being mounted on a first surface of said base board, said memory chips being mounted on said memory boards such that a longitudinal axis of a first one of said memory chips mounted on a first one of said memory boards is orthogonal to a longitudinal axis of a second one of said memory chips mounted on a second one of said memory boards;

an IC chip for controlling an operation of said memory chips, said IC chip being mounted on a second surface of said base board, and wherein said base board, said memory modules, and said IC chip are housed in a package.

32. A card-type recording medium comprising:

a base board;

laminated memory modules including memory chips flip chip-mounted on memory boards, said memory modules being mounted on a first surface of said base board, a thickness of a first one of said memory chips mounted on an upper-side one of said memory boards being larger than a thickness of a second one of said memory chips mounted on a lower-side one of said memory boards;

an IC chip for controlling an operation of said memory chips, said IC chip being mounted on a second surface of said base board, and wherein said base board, said memory modules, and said IC chip are housed in a package.

* * * * *